US012588358B2

(12) United States Patent
Yamazaki et al.

(10) Patent No.: US 12,588,358 B2
(45) Date of Patent: Mar. 24, 2026

(54) DISPLAY DEVICE AND METHOD FOR MANUFACTURING DISPLAY DEVICE

(71) Applicant: Semiconductor Energy Laboratory Co., Ltd., Atsugi (JP)

(72) Inventors: Shunpei Yamazaki, Setagaya (JP); Kenichi Okazaki, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 461 days.

(21) Appl. No.: 18/270,751

(22) PCT Filed: Jan. 6, 2022

(86) PCT No.: PCT/IB2022/050074
§ 371 (c)(1),
(2) Date: Jul. 3, 2023

(87) PCT Pub. No.: WO2022/153145
PCT Pub. Date: Jul. 21, 2022

(65) Prior Publication Data
US 2024/0065026 A1 Feb. 22, 2024

(30) Foreign Application Priority Data

Jan. 14, 2021 (JP) ................................. 2021-004540

(51) Int. Cl.
*H10K 59/12* (2023.01)
*H10K 59/35* (2023.01)
*H10K 59/80* (2023.01)
(52) U.S. Cl.
CPC ....... *H10K 59/1201* (2023.02); *H10K 59/353* (2023.02); *H10K 59/873* (2023.02)

(58) Field of Classification Search
CPC ......... H10K 59/8052; H10K 59/80521; H10K 59/35–353; H10K 59/1201; H10K 59/17; H10K 59/1795; H10K 59/179
See application file for complete search history.

(56) References Cited

U.S. PATENT DOCUMENTS

| | | | |
|---|---|---|---|
| 5,953,985 | A | 9/1999 | Kobayashi |
| 6,120,338 | A | 9/2000 | Hirano et al. |

(Continued)

FOREIGN PATENT DOCUMENTS

| | | |
|---|---|---|
| CN | 108292714 A | 7/2018 |
| JP | 2000-036385 A | 2/2000 |

(Continued)

OTHER PUBLICATIONS

International Search Report (Application No. PCT/IB2022/050074) Dated May 17, 2022.

(Continued)

*Primary Examiner* — Mariceli Santiago
(74) *Attorney, Agent, or Firm* — Eric J. Robinson; Robinson Intellectual Property Law Office, P.C.

(57) ABSTRACT

A method for manufacturing a display device that can easily achieve higher resolution is provided. A display device having both high display quality and high resolution is provided. A first EL film is deposited over a first pixel electrode, a first sacrificial film is formed to cover the first EL film and a first electrode, and the first sacrificial film and the first EL film are etched, so that a first EL layer is formed over the first pixel electrode. Then, the first sacrificial film is removed to expose the first electrode. Furthermore, a common electrode is formed over the first EL layer and the first electrode. The first EL film is etched by dry etching, and the first sacrificial film is removed by wet etching.

12 Claims, 25 Drawing Sheets

(56) References Cited

U.S. PATENT DOCUMENTS

| | | | | |
|---|---|---|---|---|
| 7,399,991 B2 | 7/2008 | Seo et al. | | |
| 7,663,149 B2 | 2/2010 | Seo et al. | | |
| 7,742,023 B2 | 6/2010 | Matsumoto | | |
| 10,505,141 B2 * | 12/2019 | Du | | G02F 1/133305 |
| 10,727,287 B2 | 7/2020 | Takagi | | |
| 10,862,036 B2 | 12/2020 | Ke et al. | | |
| 11,532,680 B2 | 12/2022 | Takagi | | |
| 2002/0072139 A1 | 6/2002 | Kashiwabara | | |
| 2007/0013629 A1 | 1/2007 | Matsumoto | | |
| 2011/0148290 A1 | 6/2011 | Oota | | |
| 2012/0256204 A1 | 10/2012 | Yoshizumi et al. | | |
| 2012/0273804 A1 | 11/2012 | Hatano | | |
| 2012/0276484 A1 | 11/2012 | Izumi et al. | | |
| 2013/0084531 A1 | 4/2013 | Hamaguchi et al. | | |
| 2013/0084664 A1 | 4/2013 | Yoshitoku et al. | | |
| 2013/0084666 A1 | 4/2013 | Oshige | | |
| 2013/0210176 A1 * | 8/2013 | Fushimi | | H10K 71/221 |
| | | | | 438/26 |
| 2013/0280839 A1 | 10/2013 | Sonoda et al. | | |
| 2013/0295705 A1 | 11/2013 | Sonoda et al. | | |
| 2014/0004640 A1 | 1/2014 | Hamaguchi et al. | | |
| 2014/0004642 A1 | 1/2014 | Otsuka et al. | | |
| 2015/0060826 A1 | 3/2015 | Matsumoto. et al. | | |
| 2015/0069360 A1 | 3/2015 | Sato | | |
| 2015/0076476 A1 | 3/2015 | Odaka et al. | | |
| 2016/0172595 A1 | 6/2016 | Malinowski et al. | | |
| 2016/0315133 A1 | 10/2016 | Sato | | |
| 2017/0141167 A1 | 5/2017 | Naganuma | | |
| 2017/0256754 A1 | 9/2017 | Defranco et al. | | |
| 2018/0190908 A1 | 7/2018 | Ke et al. | | |
| 2020/0203662 A1 | 6/2020 | Mollard et al. | | |
| 2021/0143330 A1 * | 5/2021 | Takata | | C09D 11/36 |
| 2021/0273030 A1 * | 9/2021 | Zhao | | H10K 59/179 |
| 2022/0320191 A1 * | 10/2022 | Yoshikawa | | H01L 25/167 |
| 2024/0040846 A1 * | 2/2024 | Sato | | H10K 59/1201 |

FOREIGN PATENT DOCUMENTS

| | | | |
|---|---|---|---|
| JP | 2002-324673 A | 11/2002 | |
| JP | 2003-059663 A | 2/2003 | |
| JP | 2007-026704 A | 2/2007 | |
| JP | 2008-098106 A | 4/2008 | |
| JP | 2008-147072 A | 6/2008 | |
| JP | 2008-251270 A | 10/2008 | |
| JP | 2010-275598 A | 12/2010 | |
| JP | 2012-160473 A | 8/2012 | |
| JP | 2014-120218 A | 6/2014 | |
| JP | 2014-135251 A | 7/2014 | |
| JP | 2014-232568 A | 12/2014 | |
| JP | 2015-115178 A | 6/2015 | |
| JP | 2016-197494 A | 11/2016 | |
| JP | 2018-063910 A | 4/2018 | |
| JP | 2018-521459 | 8/2018 | |
| JP | 2019-179696 A | 10/2019 | |
| JP | 2020-035713 A | 3/2020 | |
| JP | 2020-160305 A | 10/2020 | |
| KR | 2007-0008423 A | 1/2007 | |
| KR | 2018-0021002 A | 2/2018 | |
| TW | 200703216 | 1/2007 | |
| TW | 201705585 | 2/2017 | |
| WO | WO-2017/001353 | 1/2017 | |
| WO | WO-2017/212797 | 12/2017 | |

OTHER PUBLICATIONS

Written Opinion (Application No. PCT/IB2022/050074) Dated May 17, 2022.

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

FIG. 22A
FIG. 22B
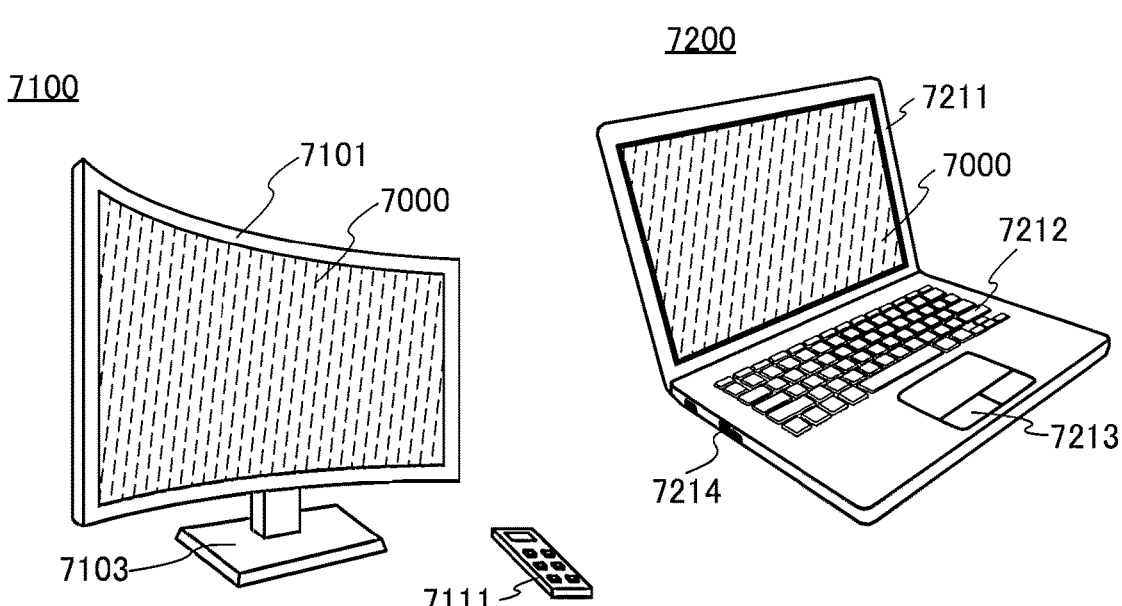
FIG. 22C
FIG. 22D
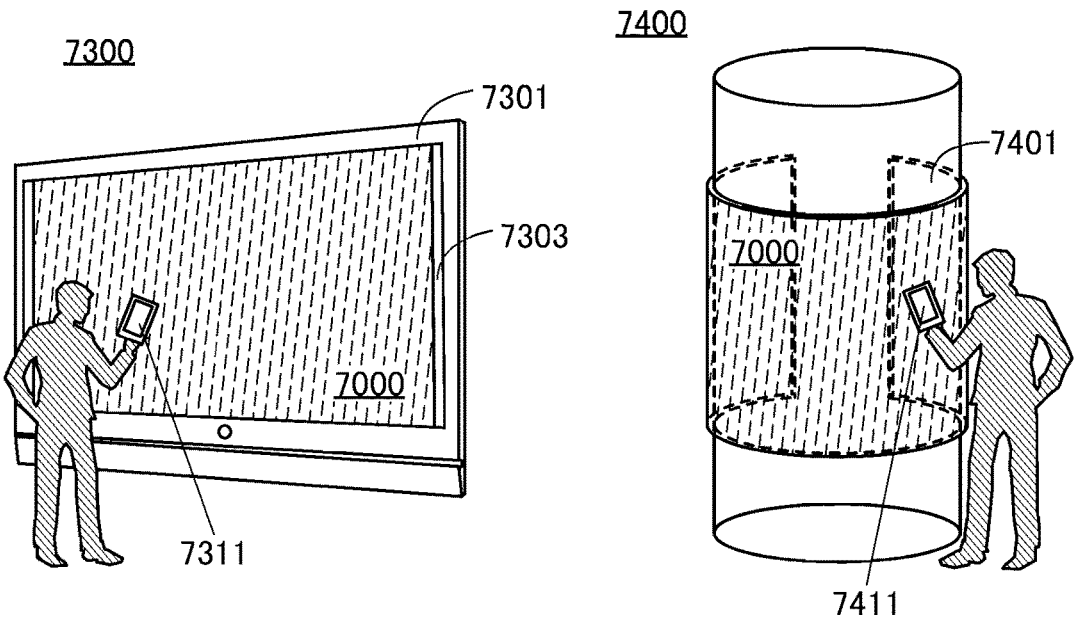

FIG. 23A
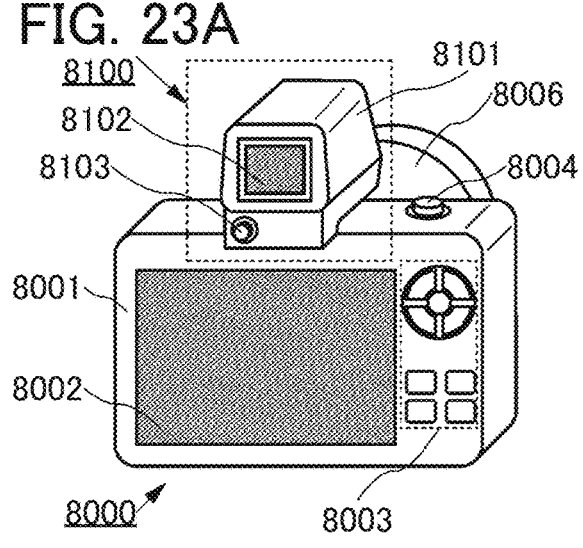
8100
8101
8006
8102
8103
8004
8001
8002
8000
8003
FIG. 23B
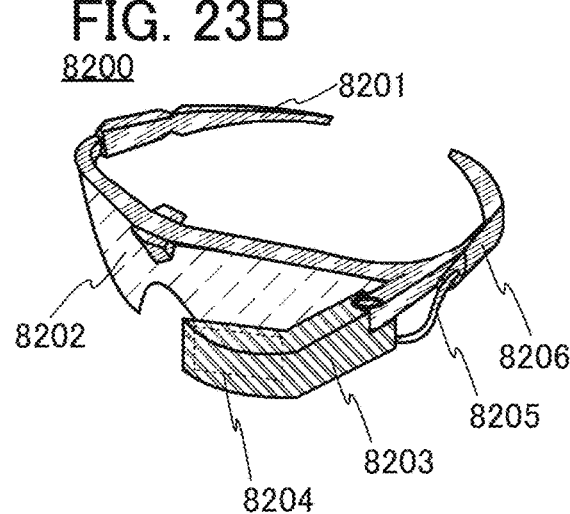
8200
8201
8202
8206
8205
8203
8204
FIG. 23C
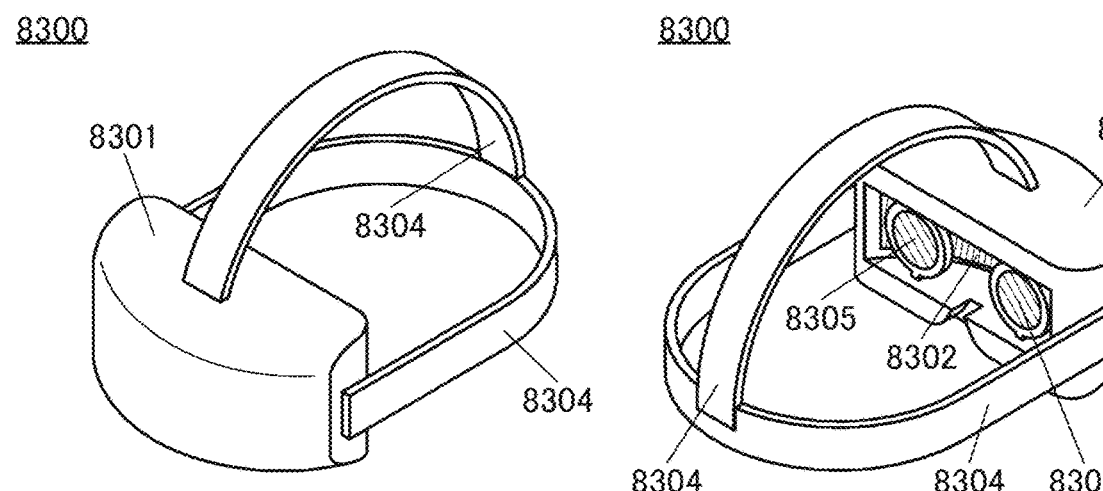
8300
8301
8304
8304
FIG. 23D
8300
8301
8305
8302
8304
8304
8305
FIG. 23E
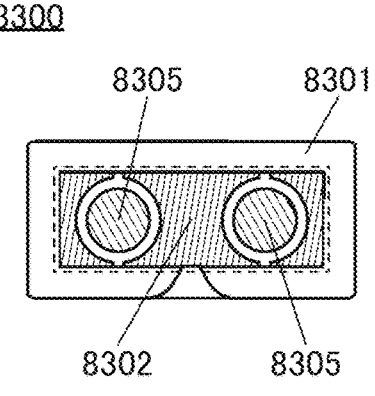
8300
8305
8301
8302
8305
FIG. 23F
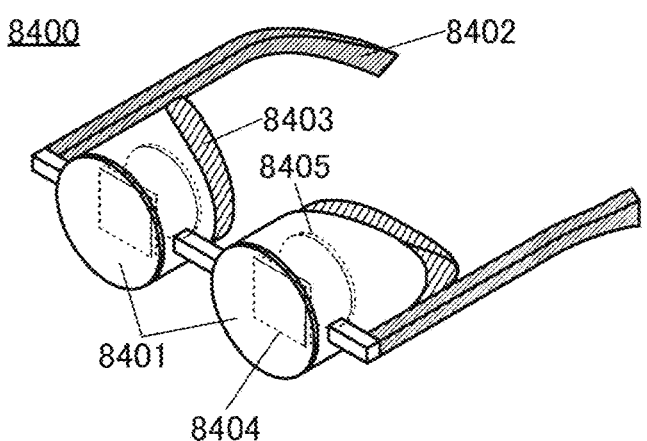
8400
8402
8403
8405
8401
8404

9101

9200

9102

9201

9201

9201

DISPLAY DEVICE AND METHOD FOR MANUFACTURING DISPLAY DEVICE

TECHNICAL FIELD

One embodiment of the present invention relates to a display device. One embodiment of the present invention relates to a method for manufacturing a display device.

Note that one embodiment of the present invention is not limited to the above technical field. Examples of the technical field of one embodiment of the present invention disclosed in this specification and the like include a semiconductor device, a display device, a light-emitting apparatus, a power storage device, a memory device, an electronic device, a lighting device, an input device, an input/output device, a driving method thereof, and a manufacturing method thereof. A semiconductor device refers to any device that can function by utilizing semiconductor characteristics.

BACKGROUND ART

In recent years, higher-resolution display panels have been required. Examples of devices that require high-resolution display panels include a smartphone, a tablet terminal, and a laptop computer. Moreover, higher resolution has been required for a stationary display device such as a television device or a monitor device along with an increase in definition. Furthermore, an example of a device required to have the highest resolution is a device for virtual reality (VR) or augmented reality (AR).

Examples of a display device that can be used for a display panel include, typically, a liquid crystal display device, a light-emitting apparatus including a light-emitting element such as an organic EL (Electro Luminescence) element or a light-emitting diode (LED), and electronic paper performing display by an electrophoretic method or the like.

For example, the basic structure of an organic EL element is a structure in which a layer containing a light-emitting organic compound is provided between a pair of electrodes. By applying voltage to this element, light emission can be obtained from the light-emitting organic compound. A display device using such an organic EL element does not need a backlight that is necessary for a liquid crystal display device and the like; thus, a thin, lightweight, high-contrast, and low-power display device can be achieved. Patent Document 1, for example, discloses an example of a display device using an organic EL element.

REFERENCE

Patent Document

[Patent Document 1] Japanese Published Patent Application No. 2002-324673

SUMMARY OF THE INVENTION

Problems to be Solved by the Invention

An object of one embodiment of the present invention is to provide a display device that can easily achieve higher resolution and a manufacturing method thereof. Another object of one embodiment of the present invention is to provide a display device having both high display quality and high resolution. Another object of one embodiment of the present invention is to provide a display device with high contrast. Another object of one embodiment of the present invention is to provide a highly reliable display device.

An object of one embodiment of the present invention is to provide a display device having a novel structure or a method for manufacturing a display device. Another object of one embodiment of the present invention is to provide a method for manufacturing the above-described display device with a high yield. Another object of one embodiment of the present invention is to at least reduce at least one of problems of the conventional technology.

Note that the description of these objects does not preclude the existence of other objects. Note that one embodiment of the present invention does not have to achieve all the objects. Objects other than these can be derived from the description of the specification, the drawings, the claims, and the like.

Means for Solving the Problems

One embodiment of the present invention is a method for manufacturing a display device, including a first step of forming a first pixel electrode, a second pixel electrode, and a first electrode; a second step of depositing a first EL film over the first pixel electrode and the second pixel electrode; a third step of forming a first sacrificial film covering the first EL film and the first electrode; a fourth step of exposing the second pixel electrode by etching the first sacrificial film and the first EL film and forming a first EL layer over the first pixel electrode and a first sacrificial layer over the first EL layer and the first electrode; a fifth step of depositing a second EL film over the first pixel electrode and the second pixel electrode; a sixth step of forming a second sacrificial film covering the second EL film and the first electrode; a seventh step of forming a second EL layer over the second pixel electrode and a second sacrificial layer over the second EL layer by etching the second sacrificial film and the second EL film; an eighth step of exposing the first EL layer, the second EL layer, and the first electrode by removing the first sacrificial layer and the second sacrificial layer; a ninth step of forming a common layer over the first EL layer and the second EL layer; and a tenth step of forming a common electrode over and in contact with the common layer and the first electrode.

In the above, the first EL film, the second EL film, and the common layer are preferably formed by an evaporation method using a shielding mask.

In the above, the numbers of the first pixel electrodes and the second pixel electrodes are preferably plural. At this time, it is preferable that the first pixel electrode and the second pixel electrode be arranged in a first direction, and the plurality of first pixel electrodes be arranged in a second direction intersecting the first direction. Moreover, the method preferably includes an eleventh step of removing portions of the common electrode, the common layer, and the first EL layer between the two adjacent first pixel electrodes by etching after the tenth step.

The above method preferably includes a twelfth step of forming an insulating layer between the two adjacent first pixel electrodes between the first step and the second step. Furthermore, it is preferable that in the eleventh step, the common electrode, the common layer, and the first EL layer positioned over the insulating layer be etched and a portion of the insulating layer be etched to form a recessed portion in the insulating layer.

In any of the above, the first sacrificial film and the second sacrificial film preferably contain the same metal film, alloy film, metal oxide film, semiconductor film, or inorganic insulating film. In the fourth step, the first EL film is preferably etched by dry etching using an etching gas not containing oxygen as its main component. Furthermore, in the eighth step, the first sacrificial layer and the second sacrificial layer are preferably removed by wet etching using a tetramethyl ammonium hydroxide aqueous solution, diluted hydrofluoric acid, oxalic acid, phosphoric acid, acetic acid, nitric acid, or a mixed solution thereof. In particular, the first sacrificial film and the second sacrificial film preferably contain aluminum oxide.

Any of the above methods preferably include a thirteenth step of forming a hard mask between the third step and the fourth step be included. Furthermore, it is preferable that in the fourth step, after the first sacrificial film is etched using the hard mask, the hard mask and the first EL film be etched by the same treatment.

In any of the above, each of the first EL layer and the second EL layer is preferably processed into a band-shaped top surface shape.

Any of the above methods preferably include a fourteenth step of forming a protective layer over the common electrode after the tenth step be included.

Another embodiment of the present invention is a display device including a plurality of first light-emitting elements and a plurality of second light-emitting elements. The first light-emitting element includes a first pixel electrode, a first EL layer, a common layer, and a common electrode. The second light-emitting element includes a second pixel electrode, a second EL layer, the common layer, and the common electrode. An insulating layer is included between the two first pixel electrodes, between the two second pixel electrodes, and between the first pixel electrode and the second pixel electrode. The first light-emitting element and the second light-emitting element are arranged in a first direction. The plurality of first light-emitting elements and the plurality of second light-emitting elements are each arranged in a second direction intersecting the first direction. The common layer and the common electrode have a band shape extending in the first direction. The first EL layer, the common layer, and the common electrode include an end portion overlapping with the insulating layer between the two adjacent first pixel electrodes.

Effect of the Invention

According to one embodiment of the present invention, a display device that can easily achieve higher resolution and a manufacturing method thereof can be provided. A display device having both high display quality and high resolution can be provided. A display device with high contrast can be provided. A highly reliable display device can be provided.

According to one embodiment of the present invention, a display device having a novel structure or a method for manufacturing a display device can be provided. A method for manufacturing the above-described display device with a high yield can be provided. According to one embodiment of the present invention, at least one of problems of the conventional technology can be at least reduced.

Note that the description of these effects does not preclude the existence of other effects. Note that one embodiment of the present invention does not need to have all the effects. Effects other than these can be derived from the description of the specification, the drawings, the claims, and the like.

BRIEF DESCRIPTION OF THE DRAWINGS

FIG. 1A to FIG. 1D are diagrams illustrating a structure example of a display device.

FIG. 2A to FIG. 2F are diagrams illustrating a manufacturing method example of a display device.

FIG. 3A to FIG. 3F are diagrams illustrating a manufacturing method example of a display device.

Figures 4A, 4B, 4C:
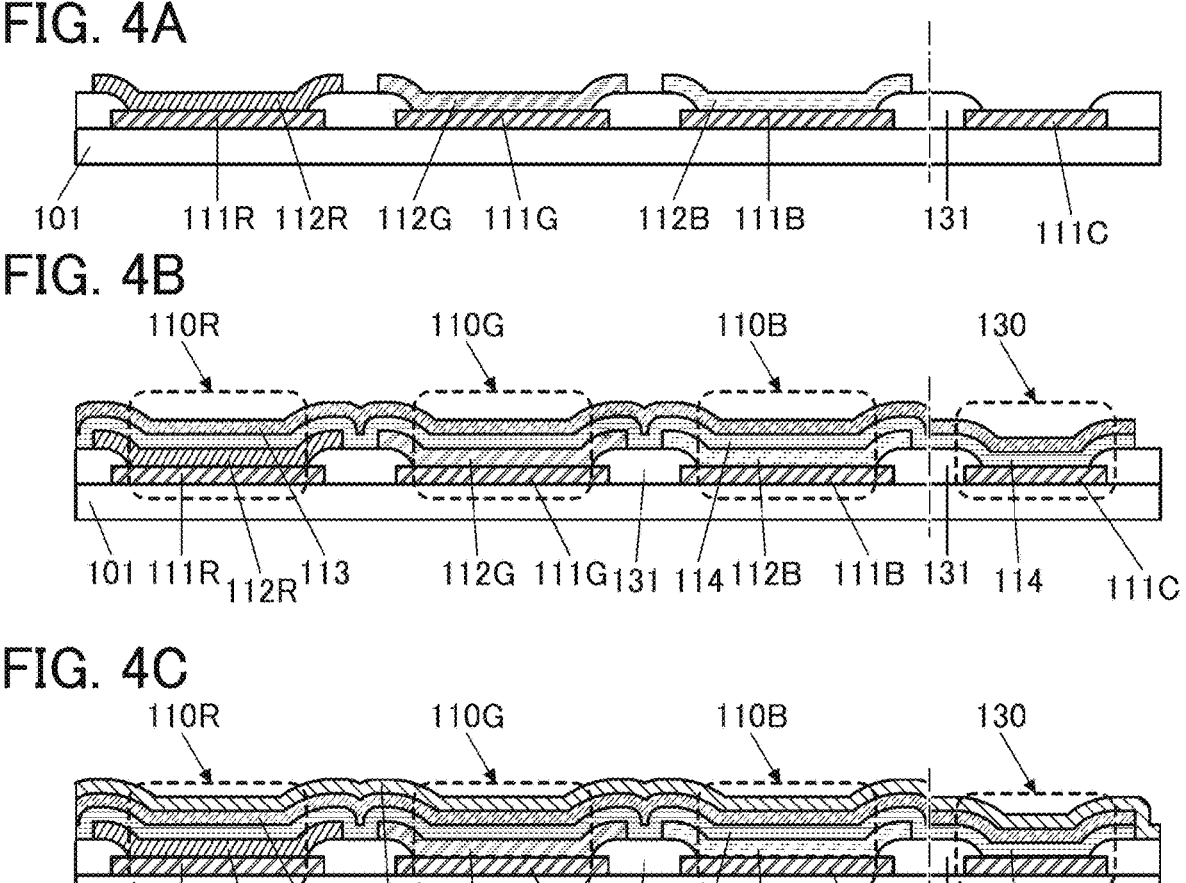

FIG. 4A to FIG. 4C are diagrams illustrating a manufacturing method example of a display device.

FIG. 5A to FIG. 5D are diagrams illustrating a structure example of a display device.

FIG. 6A to FIG. 6E are diagrams illustrating a manufacturing method example of a display device.

Figure 7A:
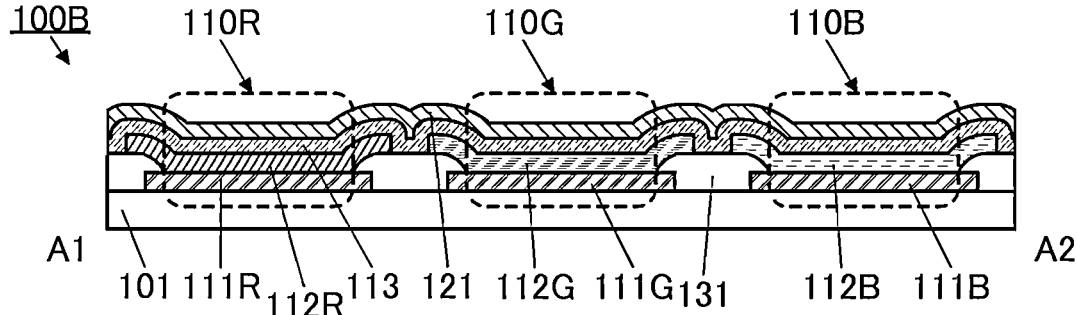
Figure 7B:
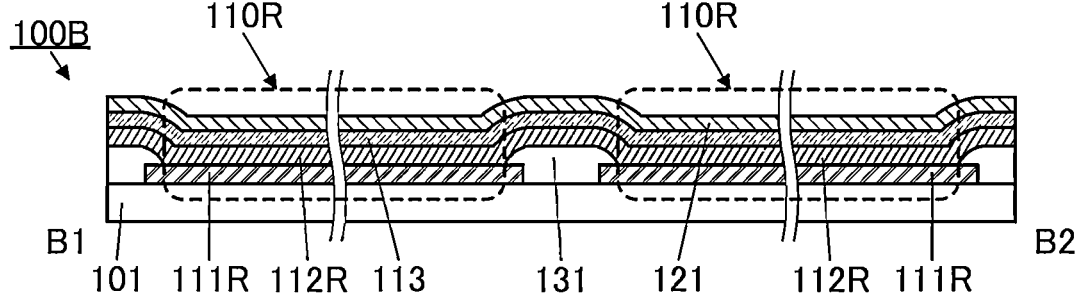
Figure 7C:
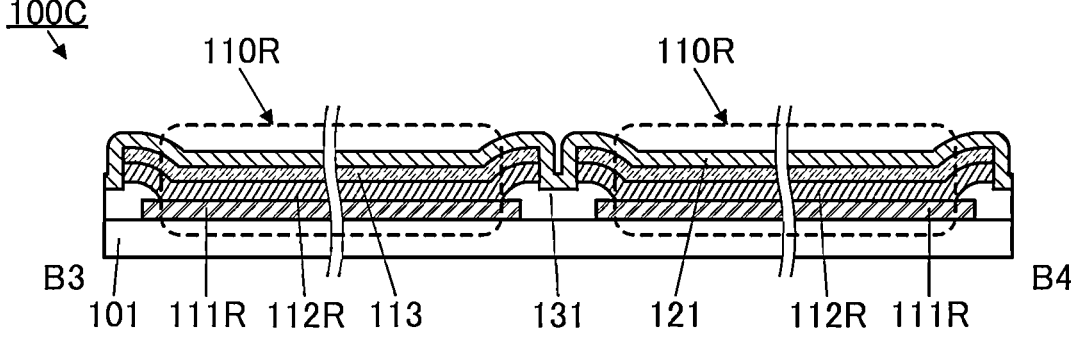

FIG. 7A to FIG. 7C are diagrams illustrating structure examples of display devices.

Figure 8A:
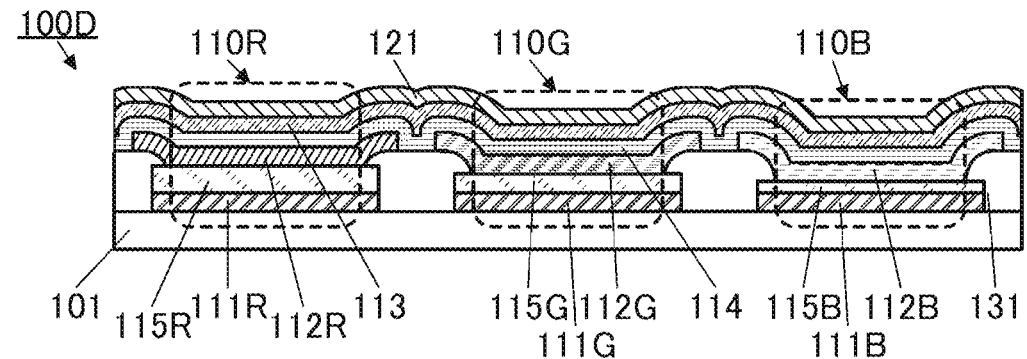
Figure 8B:
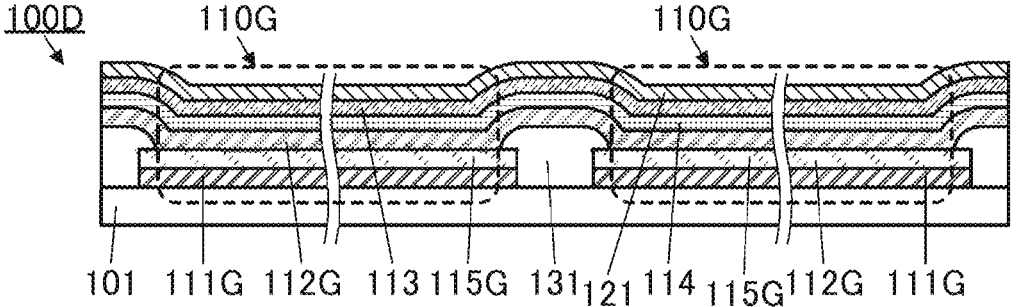
Figure 8C:
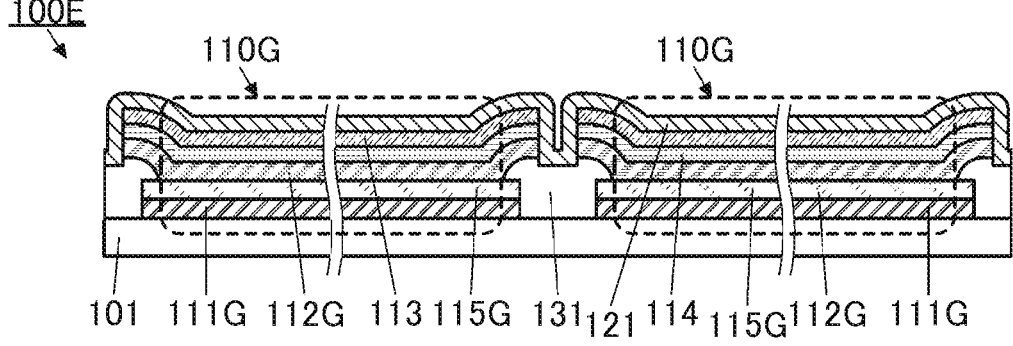

FIG. 8A to FIG. 8C are diagrams illustrating structure examples of display devices.

Figure 9A:
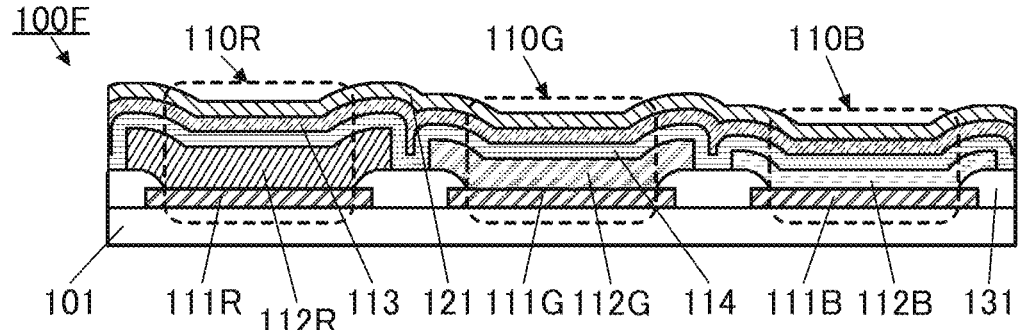
Figure 9B:
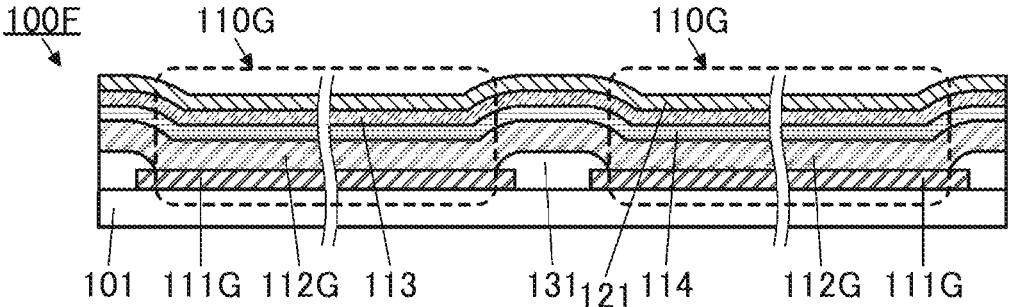
Figure 9C:
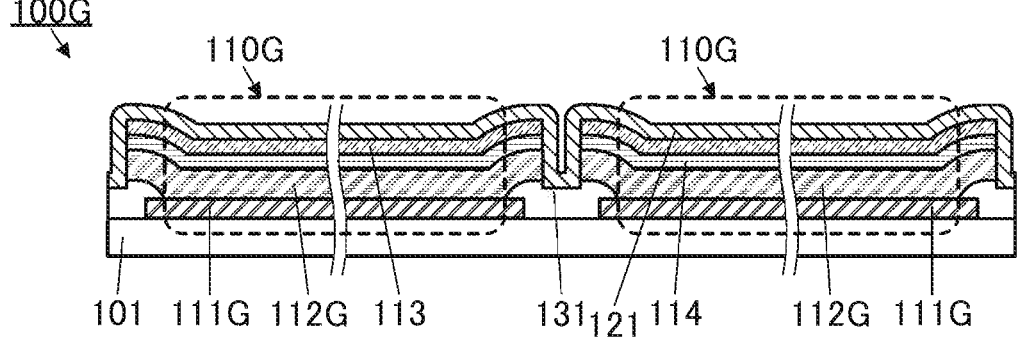

FIG. 9A to FIG. 9C are diagrams illustrating structure examples of display devices.

Figure 10:
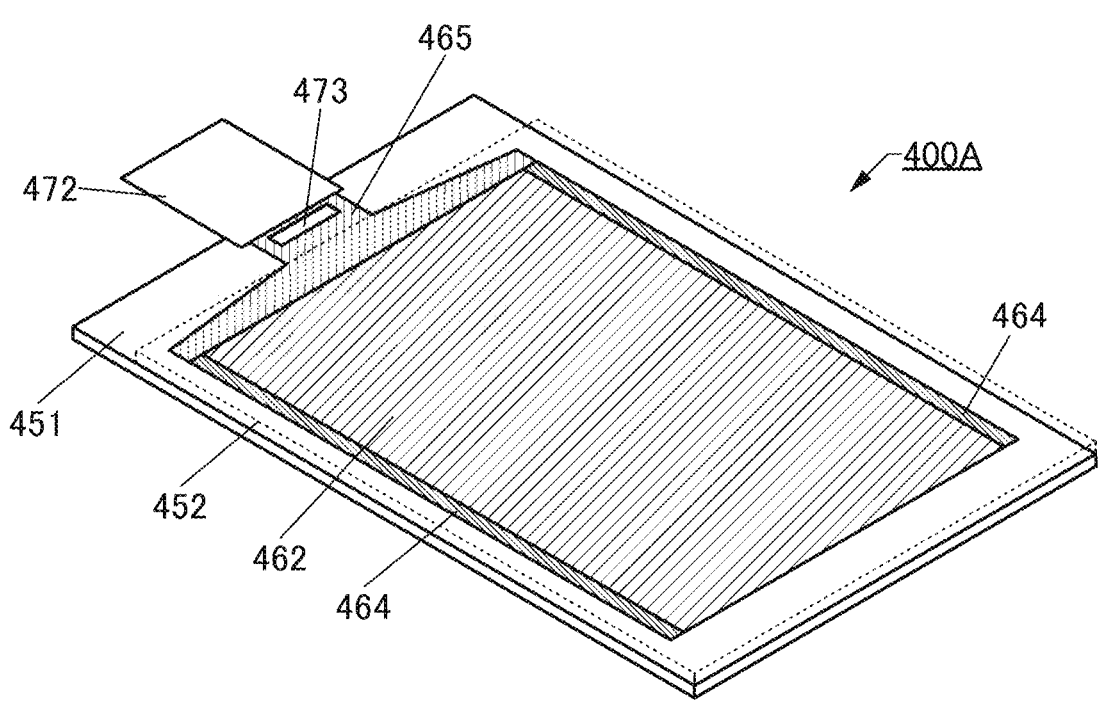

FIG. 10 is a perspective view illustrating an example of a display device.

Figures 11A, 11B:
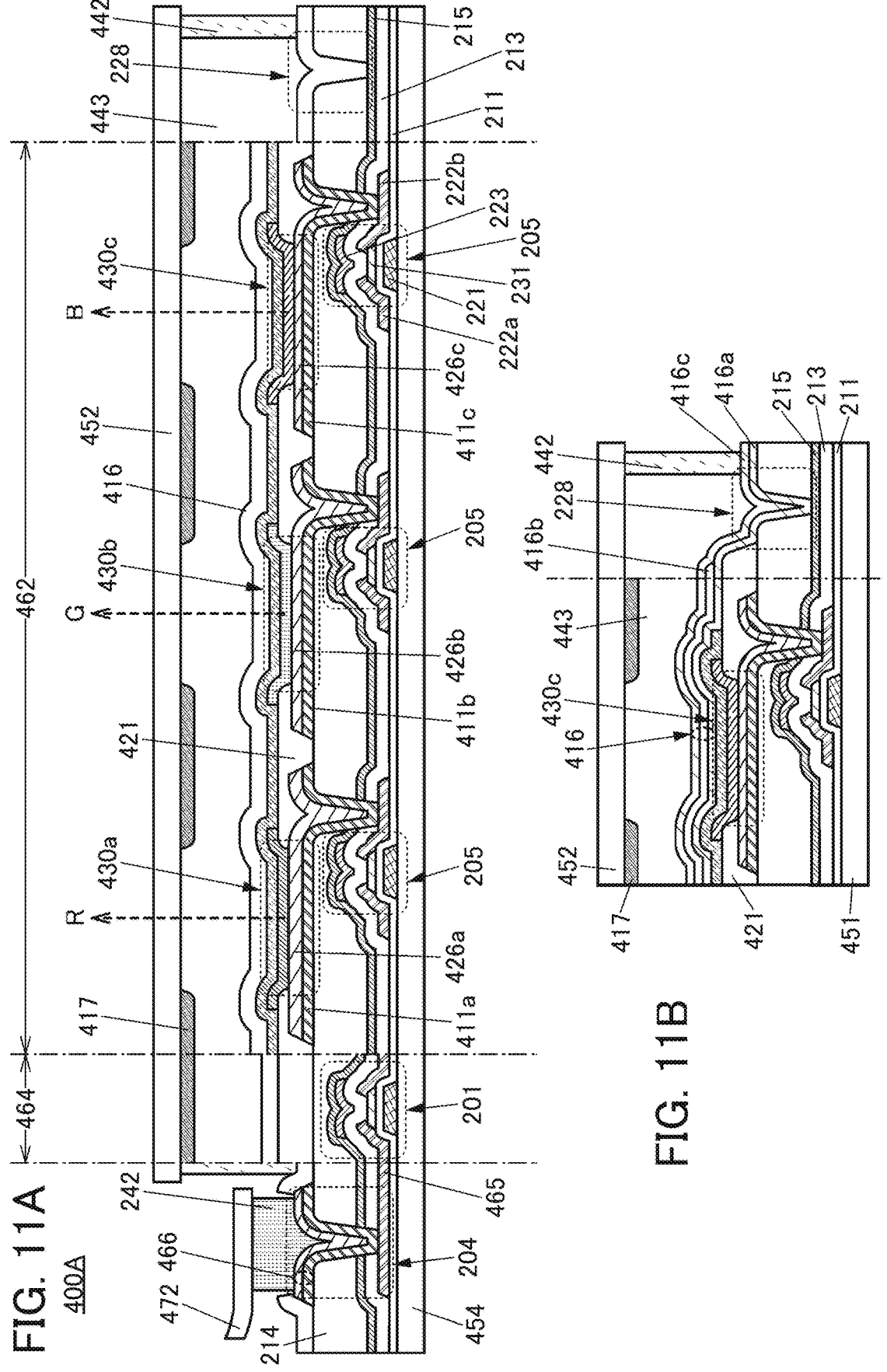

FIG. 11A and FIG. 11B are cross-sectional views illustrating examples of a display device.

Figures 12A, 12B:
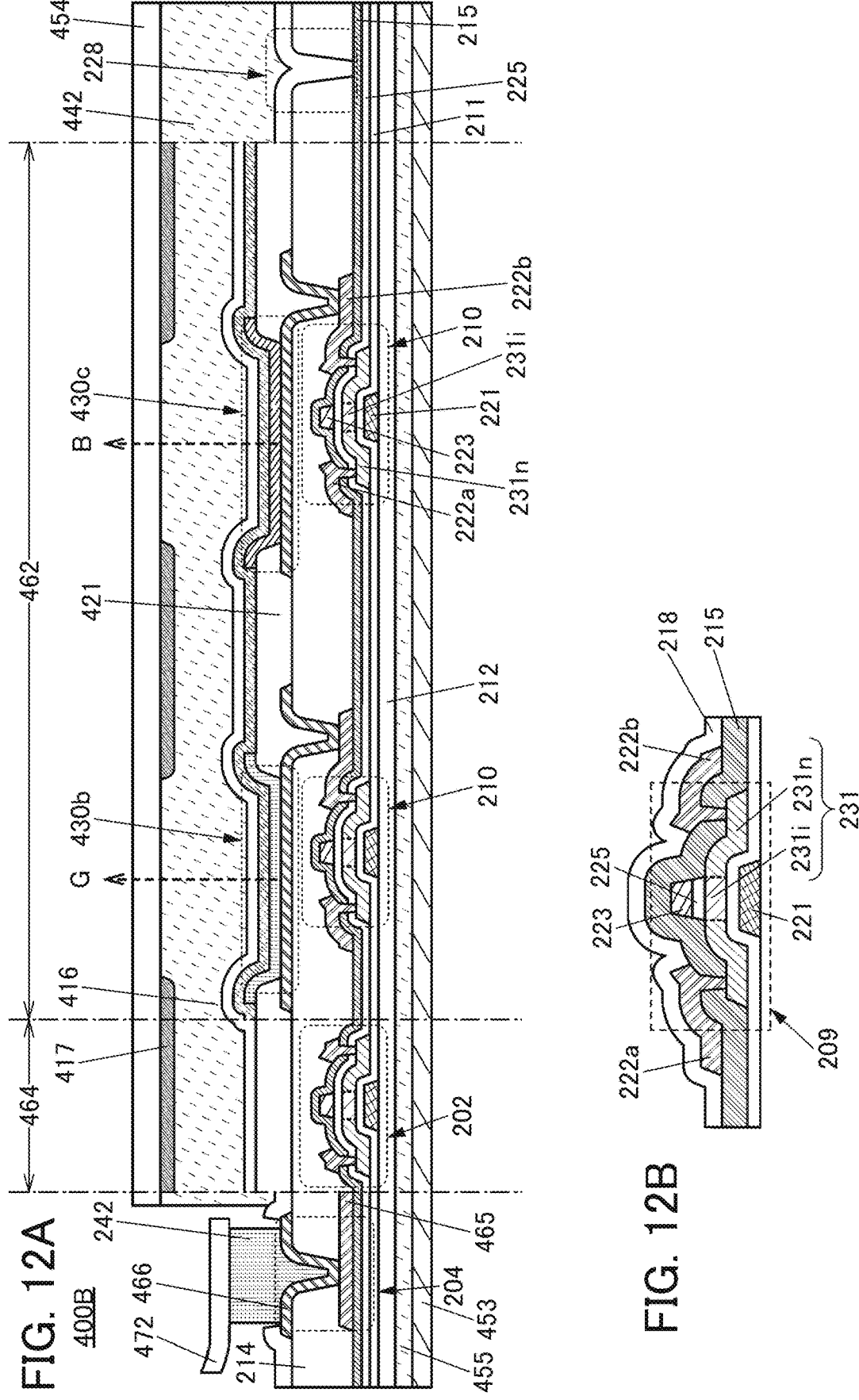

FIG. 12A is a cross-sectional view illustrating an example of a display device. FIG. 12B is a cross-sectional view illustrating an example of a transistor.

Figure 13A:
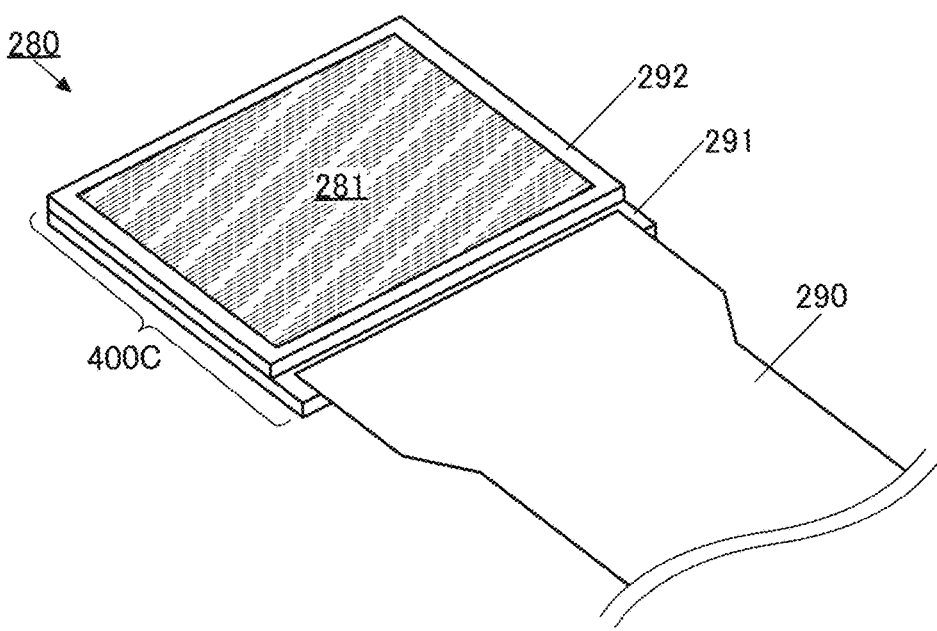
Figure 13B:
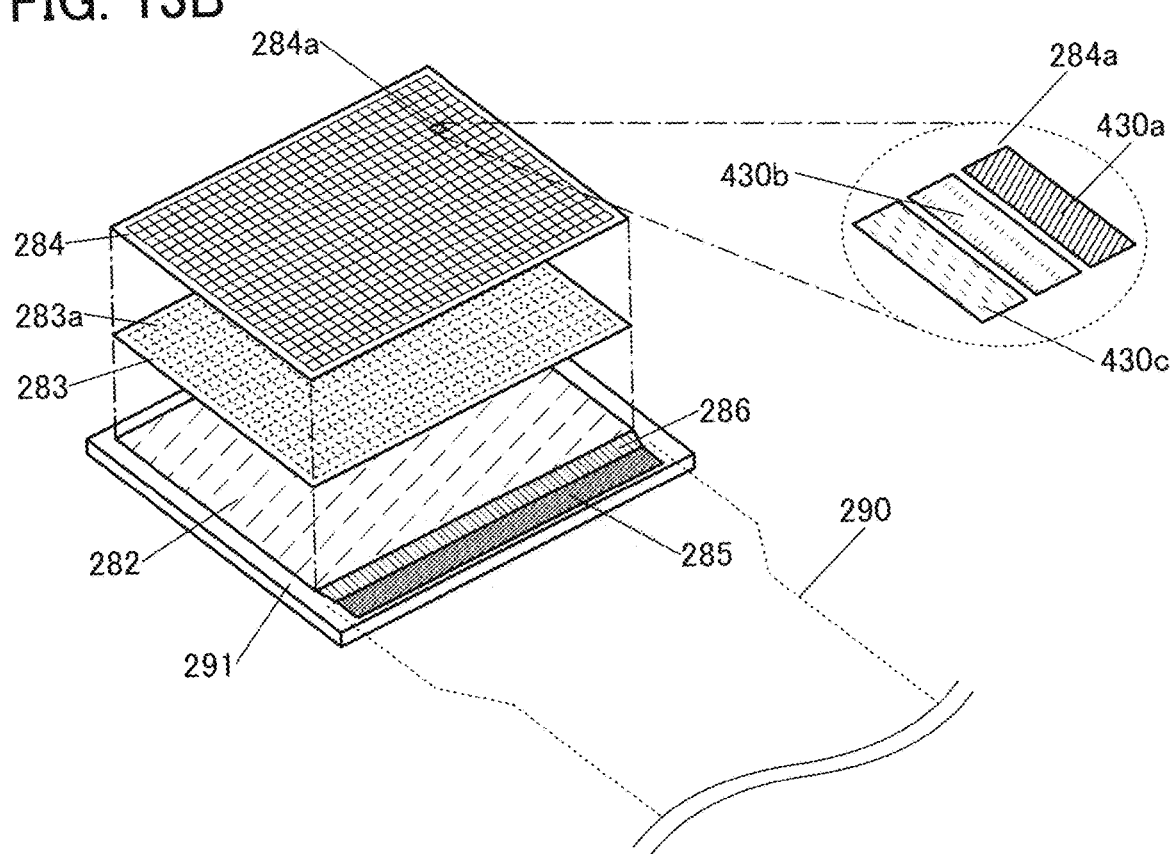

FIG. 13A and FIG. 13B are perspective views illustrating an example of a display module.

Figure 14:
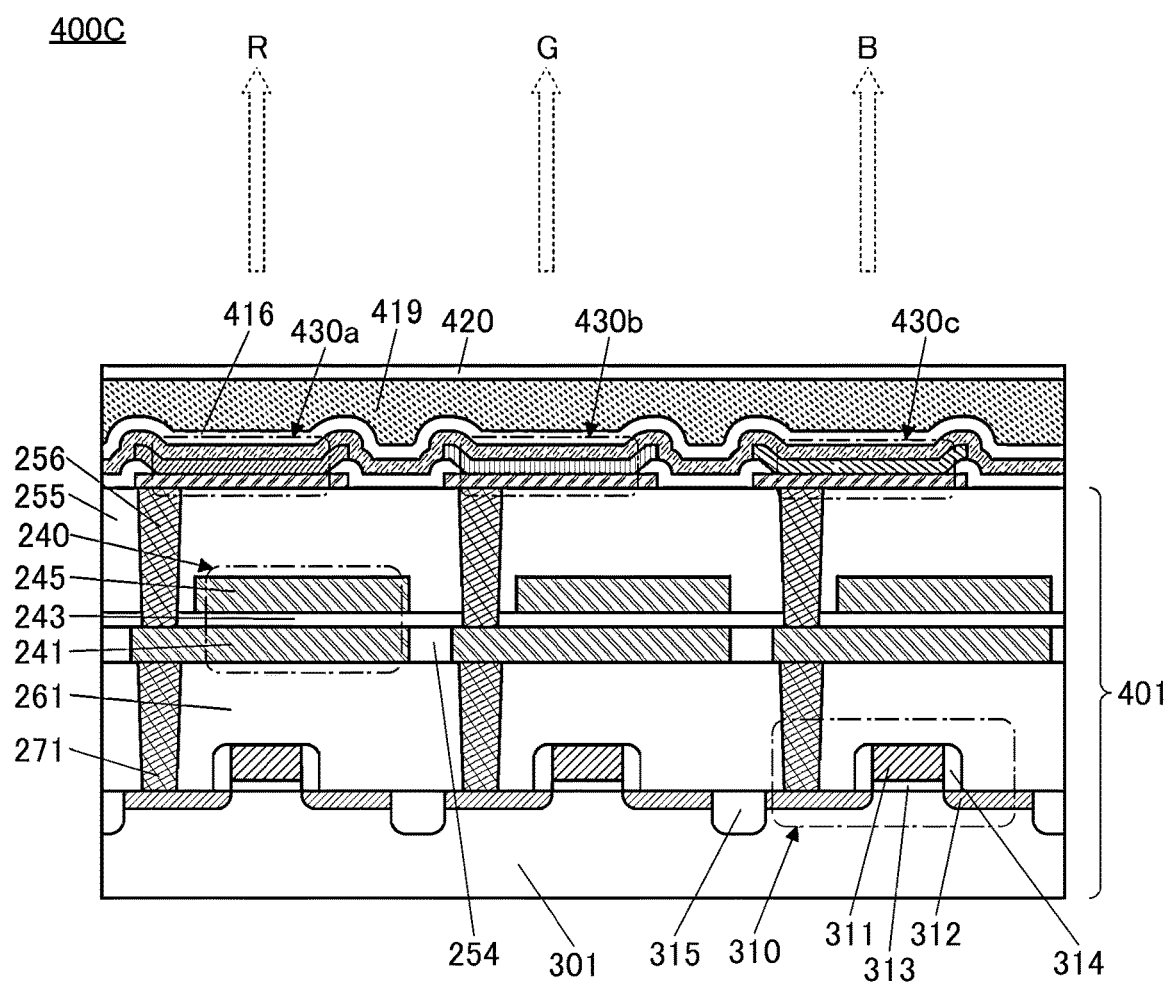

FIG. 14 is a cross-sectional view illustrating an example of a display device.

Figure 15:
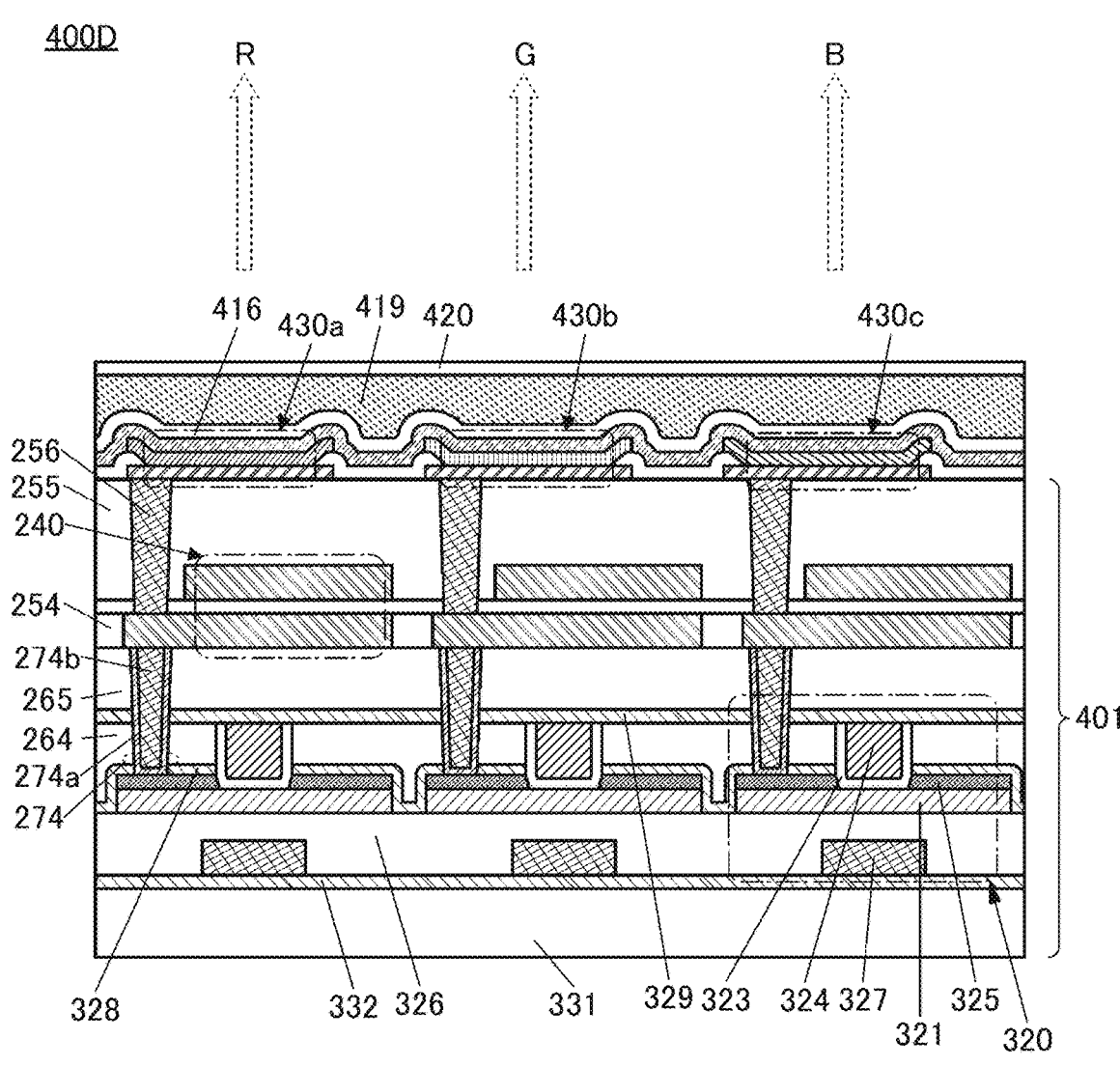

FIG. 15 is a cross-sectional view illustrating an example of a display device.

Figure 16:
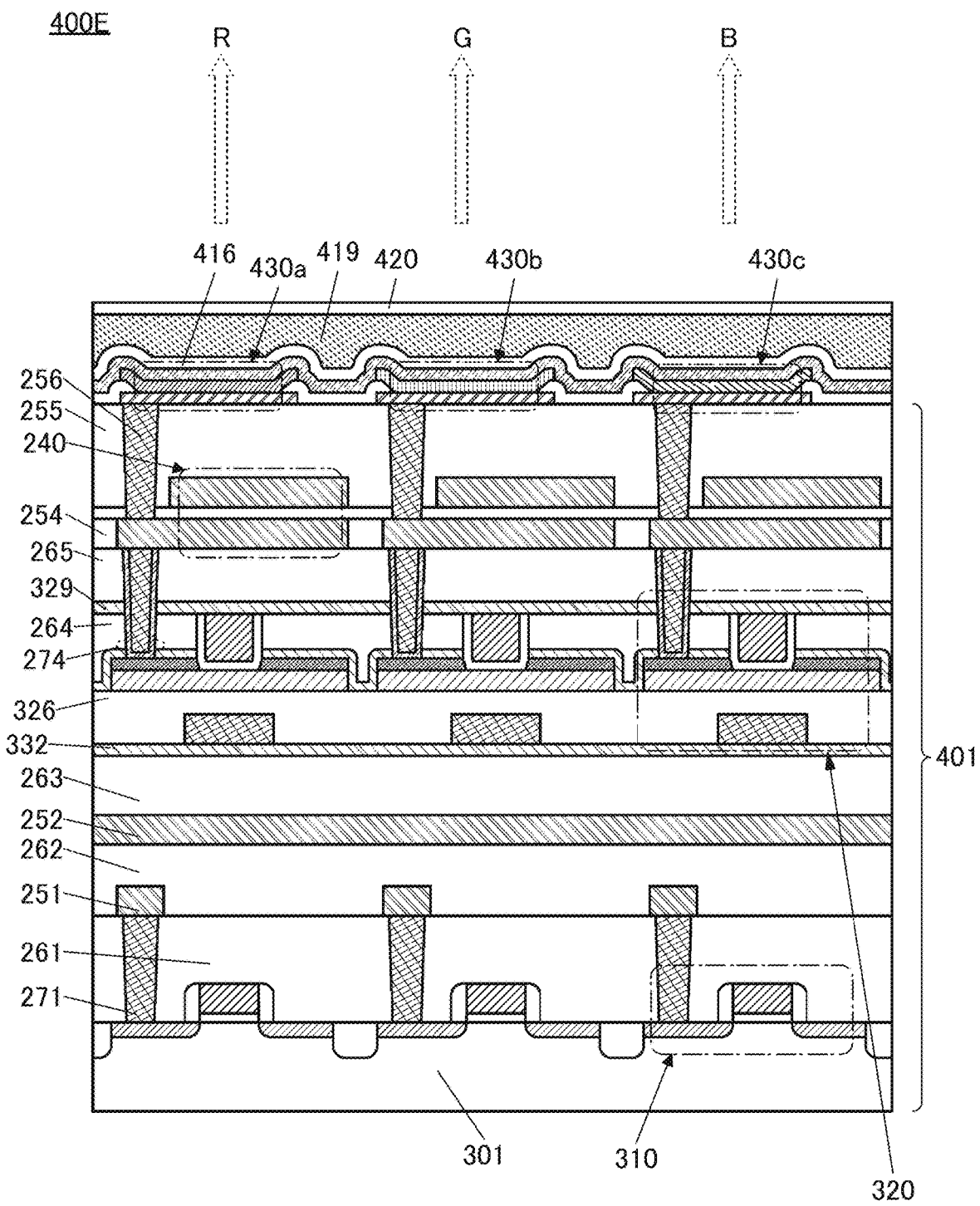

FIG. 16 is a cross-sectional view illustrating an example of a display device.

FIG. 17A to FIG. 17D are diagrams illustrating structure examples of a light-emitting element.

Figure 18A:
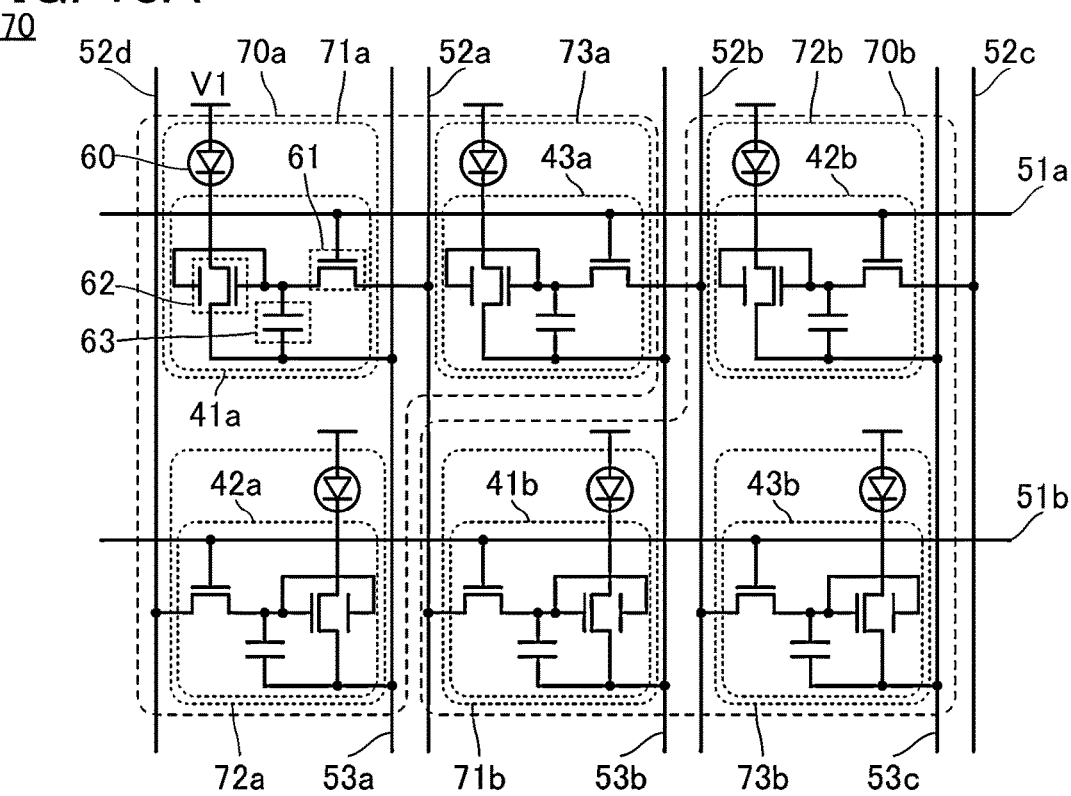
Figure 18B:
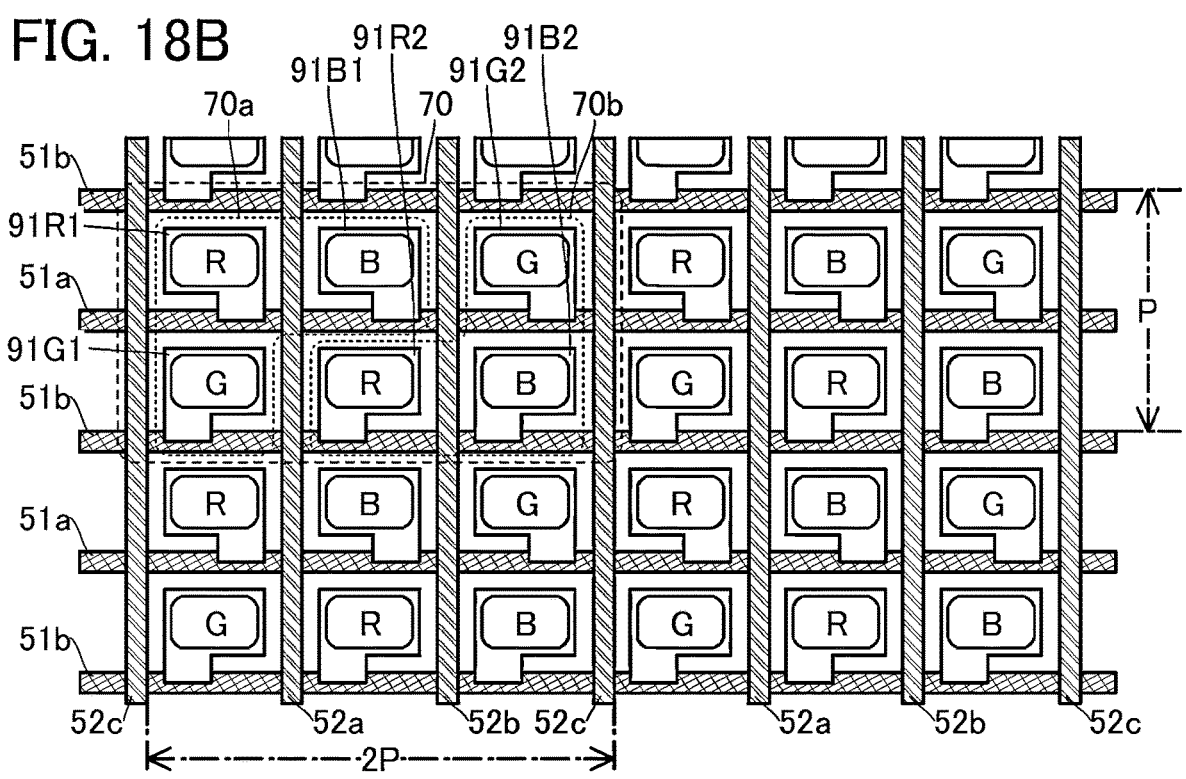

FIG. 18A and FIG. 18B are diagrams illustrating structure examples of a display device.

Figures 19A, 19B:
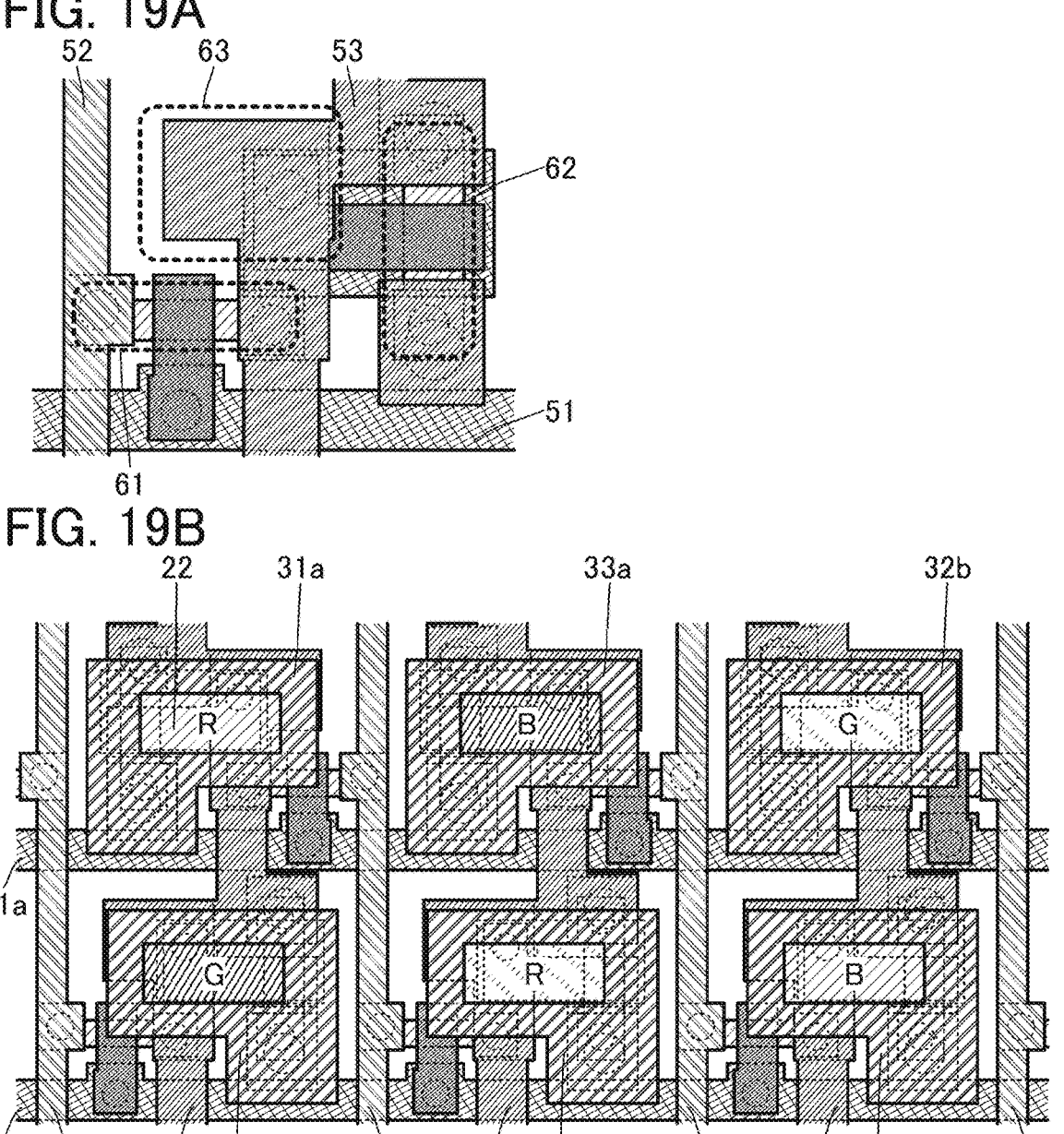

FIG. 19A and FIG. 19B are diagrams illustrating structure examples of display devices.

FIG. 20A to FIG. 20J are diagrams illustrating structure examples of a display device.

Figure 21A:
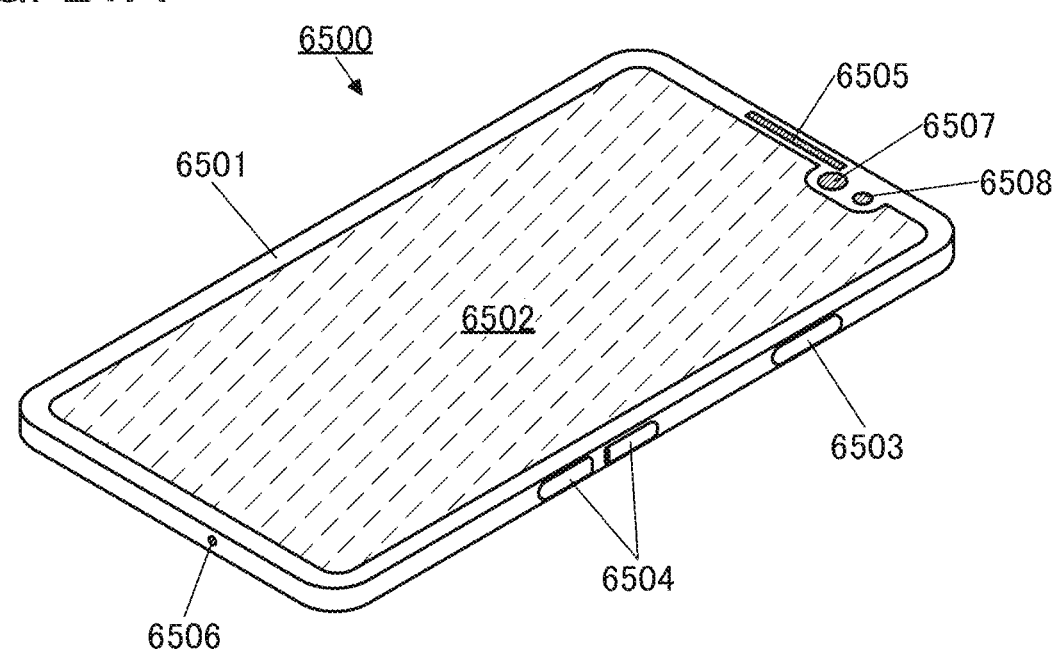
Figure 21B:
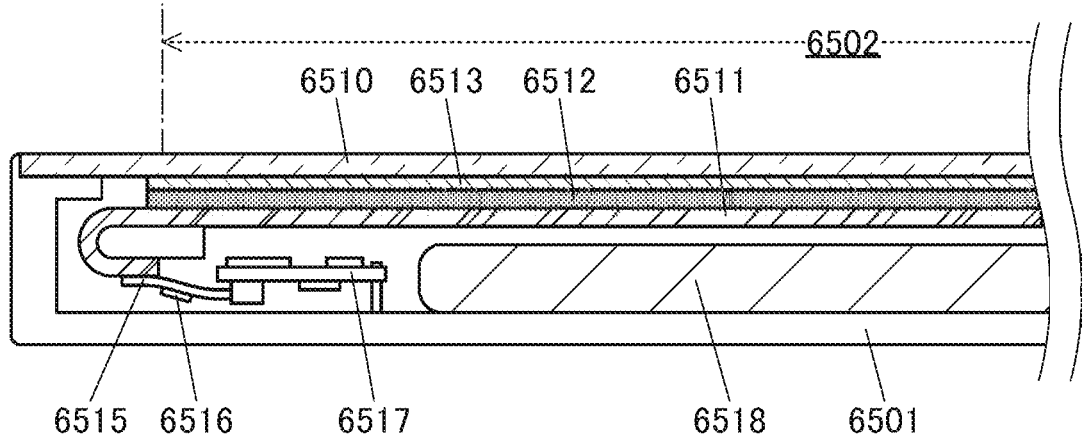

FIG. 21A and FIG. 21B are diagrams illustrating an example of an electronic device.

FIG. 22A to FIG. 22D are diagrams illustrating examples of electronic devices.

FIG. 23A to FIG. 23F are diagrams illustrating examples of electronic devices.

FIG. 24A to FIG. 24F are diagrams illustrating examples of electronic devices.

Figure 25A:
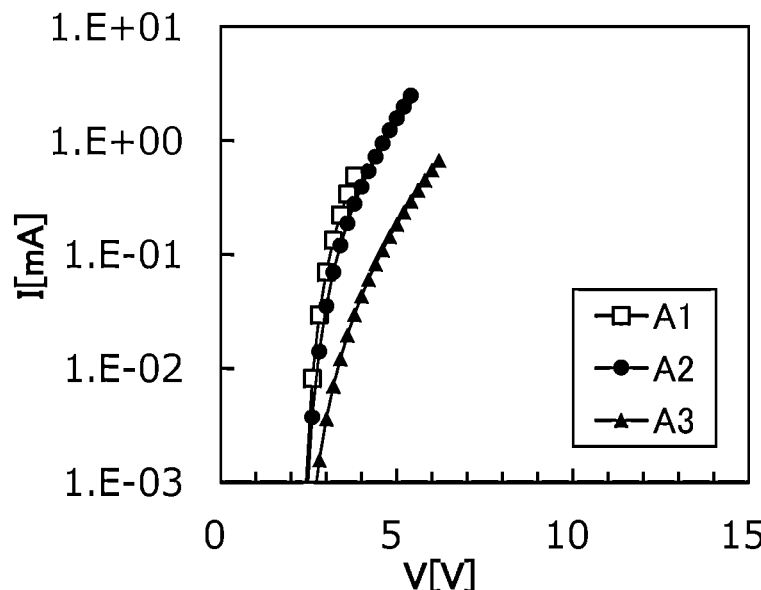
Figure 25B:
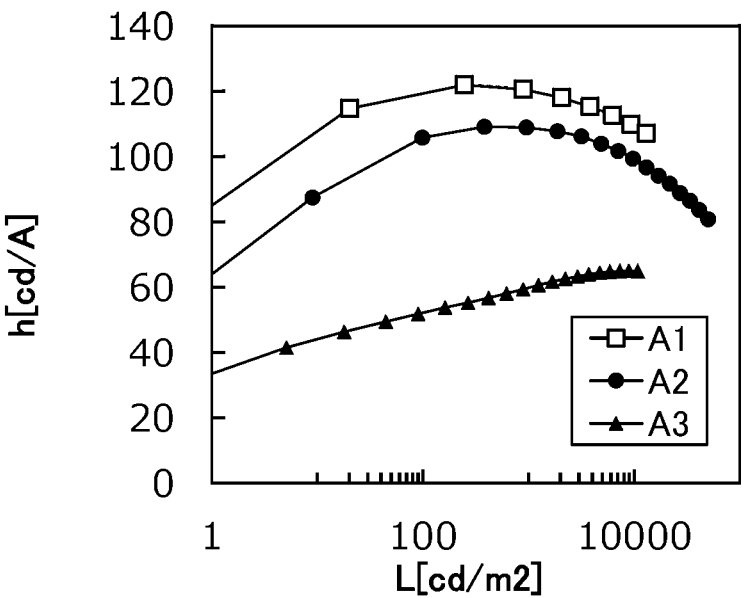

FIG. 25A and FIG. 25B are measurement results in Example.

MODE FOR CARRYING OUT THE INVENTION

Hereinafter, embodiments will be described with reference to the drawings. Note that the embodiments can be implemented in many different modes, and it will be readily understood by those skilled in the art that modes and details thereof can be changed in various ways without departing from the spirit and scope thereof. Thus, the present invention should not be construed as being limited to the description of the following embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

In each drawing described in this specification, the size, the layer thickness, or the region of each component is exaggerated for clarity in some cases. Therefore, they are not limited to the illustrated scale.

In this specification and the like, the ordinal numbers such as "first" and "second" are used in order to avoid confusion among components and do not limit the number.

In this specification and the like, the term "film" and the term "layer" can be interchanged with each other. For example, in some cases, the term "conductive layer" and the term "insulating layer" can be interchanged with the term "conductive film" and the term "insulating film", respectively.

Note that in this specification, an EL layer means a layer containing at least a light-emitting substance (also referred to as a light-emitting layer) or a stacked-layer body including the light-emitting layer provided between a pair of electrodes of a light-emitting element.

In this specification and the like, a display panel that is one embodiment of a display device has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

Described in this embodiment are a structure example of a display device of one embodiment of the present invention and an example of a manufacturing method of the display device.

One embodiment of the present invention is the display device including a light-emitting element (also referred to as a light-emitting device). The display device includes at least two light-emitting elements which emit light of different colors. The light-emitting elements each include a pair of electrodes and an EL layer therebetween. The light-emitting elements are preferably organic EL elements (organic electroluminescent elements). The two or more light-emitting elements emitting different colors include respective EL layers containing different materials. For example, three kinds of light-emitting elements emitting red (R) light, green (G) light, and blue (B) light are included, whereby a full-color display device can be achieved. Here, as a way of forming EL layers separately between light-emitting elements of different colors, an evaporation method using a shadow mask such as a metal mask is known. However, this method causes a deviation from the designed shape and position of an island-shaped organic film due to various influences such as the low accuracy of the metal mask, the positional deviation between the metal mask and a substrate, a warp of the metal mask, and the vapor-scattering-induced expansion of outline of the deposited film; accordingly, it is difficult to achieve high resolution and a high aperture ratio of the display device. Thus, a measure has been taken for pseudo improvement in resolution (also referred to as pixel density) by employing a unique pixel arrangement method such as a PenTile arrangement, for example.

In one embodiment of the present invention, fine patterning of an EL layer is performed without a shadow mask such as a metal mask. Thus, a display device that has high resolution and a high aperture ratio, which has been difficult to achieve, can be achieved. Moreover, EL layers can be formed separately, enabling the display device to perform extremely clear display with high contrast and high display quality.

In this specification and the like, a device formed using a metal mask or an FMM (a fine metal mask, a high-resolution metal mask) may be referred to as a device having an MM (a metal mask) structure. In this specification and the like, a device formed without using a metal mask or an FMM may be referred to as a device having an MML (metal maskless) structure.

Here, description is made on a case where EL layers in light-emitting elements of two colors are separately formed, for simplicity. First, a stack of a first EL film and a first sacrificial film is formed to cover two pixel electrodes. Next, a resist mask is formed over the first sacrificial film in a position overlapping with one pixel electrode (a first pixel electrode). Then, the resist mask, part of the first sacrificial film, and part of the first EL film are etched. At this time, the etching is stopped when the other pixel electrode (a second pixel electrode) is exposed. Thus, part of the first EL film processed into a band shape or an island shape (also referred to as a first EL layer) can be formed over the first pixel electrode, and part of the sacrificial film (also referred to as a first sacrificial layer) can be formed thereover.

Next, a stack of a second EL film and a second sacrificial film is formed. Then, a resist mask is formed in a position overlapping with the second pixel electrode. Then, the resist mask, part of the second sacrificial film, and part of the second EL film are etched in a manner similar to the above. As a result, the first EL layer and the first sacrificial layer are provided over the first pixel electrode, and a second EL layer and a second sacrificial layer are provided over the second pixel electrode. In this manner, the first EL layer and the second EL layer can be formed separately. Finally, the first sacrificial layer and the second sacrificial layer are removed to expose the first EL layer and the second EL layer, and then a common electrode is formed, so that the light-emitting elements of two colors can be formed separately.

Furthermore, by repeating the above-described steps, EL layers in light-emitting elements of three or more colors can be formed separately. Accordingly, a display device including light-emitting elements of three colors or four or more colors can be achieved.

Here, an electrode (also referred to as a first electrode, a connection electrode, or the like), which is to supply a potential to the common electrode, can be formed on the same plane as the pixel electrode to be electrically connected to the common electrode. The connection electrode is positioned outside the display region where the pixels are provided. In order to prevent a top surface of the connection electrode from being exposed to etching of the first EL film, it is preferable that the first sacrificial layer be also provided over the connection electrode. Also in etching of the second EL film, the second sacrificial layer is preferably provided over the connection electrode. The first sacrificial layer and the second sacrificial layer provided over the connection electrode can be removed by etching concurrently with etching of the first sacrificial layer over the first EL layer and the second sacrificial layer over the second EL layer.

It is difficult to set the distance between the EL layers of different colors to be less than 10 μm with a formation method using a metal mask, for example; however, with use of the above method, the distance can be narrowed to be less than or equal to 3 μm, less than or equal to 2 μm, or less than or equal to 1 μm. For example, with use of a light exposure apparatus for LSI, the distance can be narrowed to be less than or equal to 500 nm, less than or equal to 200 nm, less than or equal to 100 nm, or less than or equal to 50 nm. Accordingly, the area of a non-light-emitting region that may exist between two light-emitting elements can be significantly reduced, and the aperture ratio can be close to 100%. For example, the aperture ratio lower than 100% but higher than or equal to 50%, higher than or equal to 60%, higher than or equal to 70%, higher than or equal to 80%, or higher than or equal to 90% can be achieved.

Furthermore, a pattern of the EL layer itself can be made much smaller than that in the case of using a metal mask. For example, in the case of using a metal mask for forming EL layers separately, a variation in the thickness of the pattern occurs between the center and the edge of the pattern. This causes a reduction in an effective area that can be used as a light-emitting region with respect to the entire pattern area. By contrast, in the above manufacturing method, a pattern is formed by processing a film deposited to have a uniform thickness, which enables a uniform thickness in the pattern. Thus, even with a fine pattern, almost the entire area can be used as a light-emitting region. Therefore, the above manufacturing method can achieve both high resolution and a high aperture ratio.

In this manner, the above manufacturing method can provide a display device in which minute light-emitting elements are integrated, and it is not necessary to conduct a pseudo improvement in resolution by employing a unique pixel arrangement method such as a PenTile arrangement. Thus, the display device can achieve resolution higher than or equal to 500 ppi, higher than or equal to 1000 ppi, higher than or equal to 2000 ppi, higher than or equal to 3000 ppi, or higher than or equal to 5000 ppi while having what is called a stripe arrangement where R, G, and B are arranged in one direction.

More specific structure examples and manufacturing method examples of the display device of one embodiment of the present invention are described below with reference to drawings.

Structure Example 1

Figures 1A, 1B, 1C:
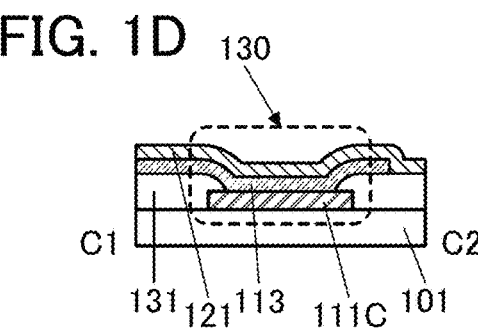

FIG. 1A illustrates a schematic top view of a display device 100 of one embodiment of the present invention. The display device 100 includes a plurality of light-emitting elements 110R exhibiting red, a plurality of light-emitting elements 110G exhibiting green, and a plurality of light-emitting elements 110B exhibiting blue. In FIG. 1A, light-emitting regions of the light-emitting elements are denoted by R, G, and B to easily differentiate the light-emitting elements.

The light-emitting elements 110R, the light-emitting elements 110G, and the light-emitting elements 110B are arranged in a matrix. FIG. 1A illustrates what is called a stripe arrangement, in which the light-emitting elements of the same color are arranged in one direction. Note that the arrangement method of the light-emitting elements is not limited thereto; another arrangement method such as a delta arrangement, a zigzag arrangement, or a PenTile arrangement may also be used.

The light-emitting elements 110R, the light-emitting elements 110G, and the light-emitting elements 110B are arranged in the X direction. The light-emitting elements of the same color are arranged in the Y direction intersecting with the X direction.

As the light-emitting elements 110R, the light-emitting elements 110G, and the light-emitting elements 110B, an organic EL element such as an OLED (Organic Light Emitting Diode) or a QLED (Quantum-dot Light Emitting Diode) is preferably used. As a light-emitting substance contained in the EL element, a substance that emits fluorescence (a fluorescent material), a substance that emits phosphorescence (a phosphorescent material), an inorganic compound (e.g., a quantum dot material), a substance that exhibits thermally activated delayed fluorescence (a thermally activated delayed fluorescent (TADF) material), and the like can be given.

FIG. 1B is a schematic cross-sectional view taken along dashed-dotted line A1-A2 in FIG. 1A. FIG. 1C is a schematic cross-sectional view taken along dashed-dotted line B1-B2.

FIG. 1B illustrates a cross section of the light-emitting element 110R, the light-emitting element 110G, and the light-emitting element 110B. The light-emitting element 110R includes a pixel electrode 111R, an EL layer 112R, an EL layer 114, and a common electrode 113. The light-emitting element 110G includes a pixel electrode 111G, an EL layer 112G, the EL layer 114, and the common electrode 113. The light-emitting element 110B includes a pixel electrode 111B, an EL layer 112B, the EL layer 114, and the common electrode 113. The EL layer 114 and the common electrode 113 are shared by the light-emitting element 110R, the light-emitting element 110G, and the light-emitting element 110B. The EL layer 114 can also be referred to as a common layer.

The EL layer 112R included in the light-emitting element 110R contains at least a light-emitting organic compound that emits light with intensity in a red wavelength range. The EL layer 112G included in the light-emitting element 110G contains at least a light-emitting organic compound that emits light with intensity in a green wavelength range. The EL layer 112B included in the light-emitting element 110B contains at least a light-emitting organic compound that emits light with intensity in a blue wavelength range.

The EL layer 112R, the EL layer 112G, and the EL layer 112B may each include one or more of an electron-injection layer, an electron-transport layer, a hole-injection layer, and a hole-transport layer in addition to the layer containing a light-emitting organic compound (the light-emitting layer). The EL layer 114 can have a structure that does not include the light-emitting layer. For example, the EL layer 114 includes one or more of an electron-injection layer, an electron-transport layer, a hole-injection layer, and a hole-transport layer.

The pixel electrode 111R, the pixel electrode 111G, and the pixel electrode 111B are provided for the respective light-emitting elements. Each of the common electrode 113 and the EL layer 114 is provided as a continuous layer shared by the light-emitting elements. A conductive film that transmits visible light is used for the pixel electrodes or the common electrode 113, and a reflective conductive film is used for the other. The use of the light-transmitting pixel electrodes and the reflective common electrode 113 offers a bottom-emission display device whereas the use of the reflective pixel electrodes and the light-transmitting common electrode 113 offers a top-emission display device. Note that when both the pixel electrodes and the common electrode 113 transmit light, a dual-emission display device can be obtained.

An insulating layer 131 covering end portions of the pixel electrode 111R, the pixel electrode 111G, and the pixel electrode 111B is provided. End portions of the insulating layer 131 are preferably tapered. Note that the insulating layer 131 is not necessarily provided when not needed.

The EL layer 112R, the EL layer 112G, and the EL layer 112B each include a region in contact with a top surface of the pixel electrodes and a region in contact with a surface of the insulating layer 131. End portions of the EL layer 112R, the EL layer 112G, and the EL layer 112B are positioned over the insulating layer 131.

As illustrated in FIG. 1B, there is a gap between the EL layers of two light-emitting elements of different colors. In this manner, the EL layer 112R, the EL layer 112G, and the EL layer 112G are preferably provided so as not to be in contact with each other. This suitably prevents unintentional light emission from being caused by a current flowing through two adjacent EL layers. As a result, the contrast can be increased to achieve a display device with high display quality.

As illustrated in FIG. 1C, the EL layer 112R is formed in a band shape so that the EL layer 112R can be continuous in the Y direction. When the EL layer 112R and the like are formed in a band shape, no space for dividing the layer is needed and thus a non-light-emitting area between the light-emitting elements is reduced, resulting in a higher aperture ratio. FIG. 1C illustrates the cross section of the light-emitting element 110R as an example; the light-emitting element 110G and the light-emitting element 110B can have a similar shape.

A protective layer 121 is provided over the common electrode 113 so as to cover the light-emitting elements 110R, the light-emitting element 110G, and the light-emitting element 110B. The protective layer 121 has a function of preventing diffusion of impurities such as water into the light-emitting elements from above.

The protective layer 121 can have, for example, a single-layer structure or a stacked-layer structure at least including an inorganic insulating film. As the inorganic insulating film, for example, an oxide film or a nitride film such as a silicon oxide film, a silicon oxynitride film, a silicon nitride oxide film, a silicon nitride film, an aluminum oxide film, an aluminum oxynitride film, or a hafnium oxide film can be given. Alternatively, a semiconductor material such as indium gallium oxide or indium gallium zinc oxide may be used for the protective layer 121.

As the protective layer 121, a stacked film of an inorganic insulating film and an organic insulating film can be used. For example, a structure in which an organic insulating film is sandwiched between a pair of inorganic insulating films is preferable. In particular, the organic insulating film preferably functions as a planarization film. With this structure, a top surface of the organic insulating film can be flat, and accordingly, coverage with the inorganic insulating film over the organic insulating film is improved, leading to an improvement in barrier properties. It is preferable that a top surface of the protective layer 121 be flat because in the case where a component (e.g., a color filter, an electrode of a touch sensor, a lens array, or the like) is provided above the protective layer 121, the influence of an uneven shape caused by the lower structure can be reduced.

FIG. 1A also illustrates a connection electrode 111C that is electrically connected to the common electrode 113. The connection electrode 111C is supplied with a potential (e.g., an anode potential or a cathode potential) that is to be supplied to the common electrode 113. The connection electrode 111C is provided outside a display region where the light-emitting elements 110R and the like are arranged. In FIG. 1A, the common electrode 113 is denoted by a dashed line.

The connection electrode 111C can be provided along the outer periphery of the display region. For example, the connection electrode 111C may be provided along one side of the outer periphery of the display region or two or more sides of the outer periphery of the display region. That is, in the case where the display region has a rectangular top surface shape, a top surface shape of the connection electrode 111C can be a band shape, an L shape, a U shape (a square bracket shape), a quadrangular shape, or the like.

FIG. 1D is a schematic cross-sectional view taken along dashed-dotted line C1-C2 in FIG. 1A. FIG. 1D illustrates a connection portion 130 in which the connection electrode 111C is electrically connected to the common electrode 113. In the connection portion 130, the common electrode 113 is provided over and in contact with the connection electrode 111C and the protective layer 121 is provided to cover the common electrode 113. In addition, the insulating layer 131 is provided to cover an end portion of the connection electrode 111C.

Manufacturing Method Example 1

Figures 2A, 2B, 2C, 2D, 2E, 2F:
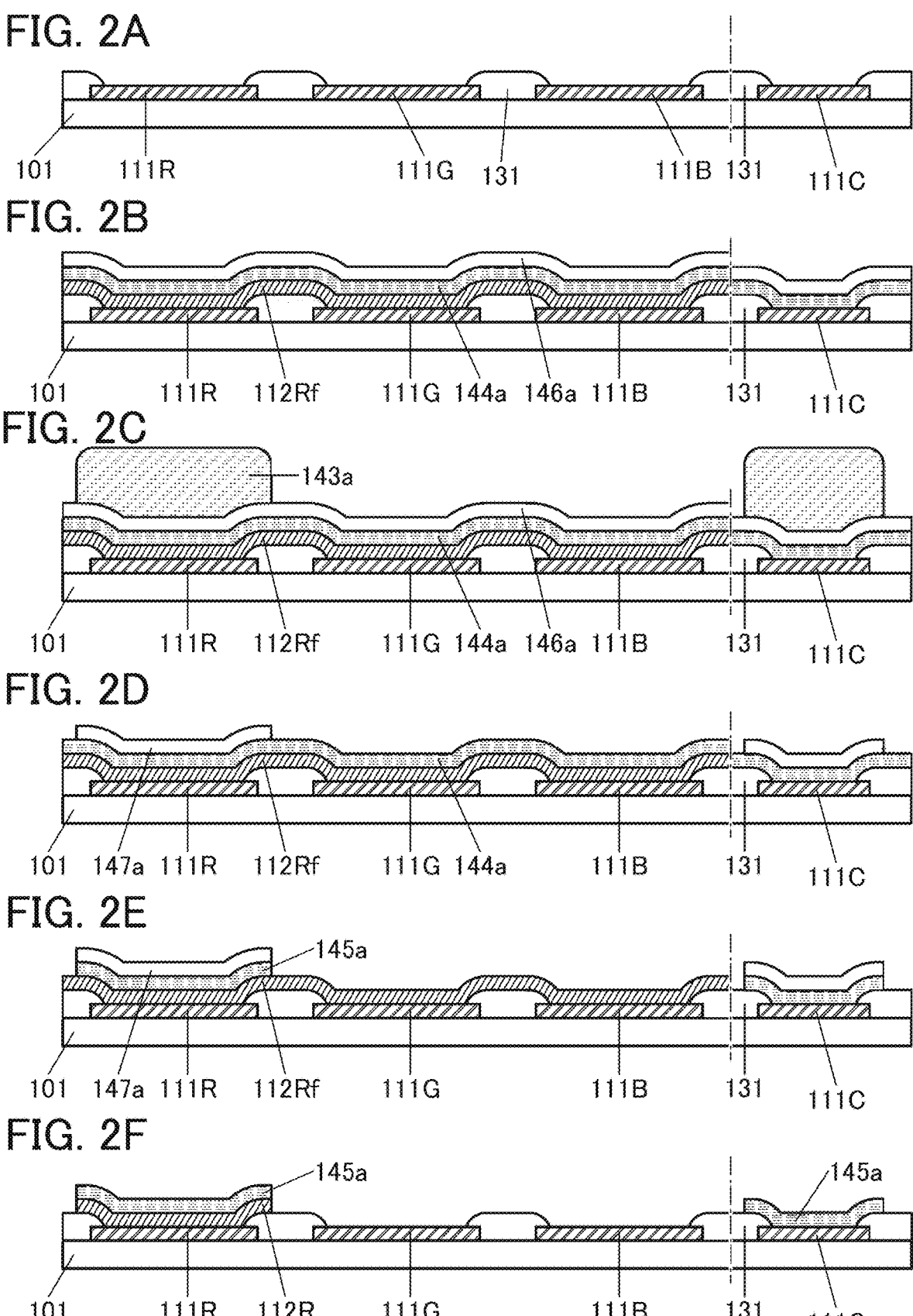

An example of a manufacturing method of the display device of one embodiment of the present invention will be described below with reference to drawings. Here, the method is described using, as an example, the display device 100 exemplified in the above structure example. FIG. 2A to FIG. 3F are schematic cross-sectional views of steps in the manufacturing method of the display device described as an example below. In FIG. 2A and the like, the schematic cross-sectional views of the connection portion 130 and the periphery thereof are also illustrated on the right side.

Note that thin films that form the display device (insulating films, semiconductor films, conductive films, or the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD: Plasma Enhanced CVD) method and a thermal CVD method. As an example of the thermal CVD method, a metal organic chemical vapor deposition (MOCVD: Metal Organic CVD) method can be given.

Alternatively, thin films that form the display device (insulating films, semiconductor films, conductive films, or the like) can be formed by a method such as spin coating, dipping, spray coating, ink-jetting, dispensing, screen printing, offset printing, a doctor knife method, a slit coater, a roll coater, a curtain coater, or a knife coater.

When the thin films that form the display device are processed, a photolithography method or the like can be used. Besides, a nanoimprinting method, a sandblasting method, a lift-off method, or the like may be used for the processing of the thin films. Island-shaped thin films may be directly formed by a deposition method using a shielding mask such as a metal mask.

There are two typical examples of a photolithography method. In one of the methods, a resist mask is formed over a thin film that is to be processed, the thin film is processed by etching or the like, and the resist mask is removed. In the other method, after a photosensitive thin film is deposited, exposure and development are performed, so that the thin film is processed into a desired shape.

As the light used for exposure in the photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Exposure may be performed by liquid immersion exposure technique. As the light used for the exposure, extreme ultraviolet (EUV) light, X-rays, or the like may be used. Furthermore, instead of the light used for the exposure, an electron beam can also be used. It is preferable to use extreme ultraviolet light, X-rays, or an electron beam because extremely minute processing can be performed. Note that in the case of performing exposure by scanning of a beam such as an electron beam, a photomask is not needed.

For etching of the thin film, a dry etching method, a wet etching method, a sandblasting method, or the like can be used.

[Preparation for Substrate 101]

As a substrate 101, a substrate having at least heat resistance high enough to withstand the following heat treatment can be used. In the case where an insulating substrate is used as the substrate 101, a glass substrate, a quartz substrate, a sapphire substrate, a ceramic substrate, an organic resin substrate, or the like can be used. Alternatively, a single crystal semiconductor substrate using silicon or silicon carbide, a polycrystalline semiconductor substrate, a compound semiconductor substrate of silicon germanium or the like, a semiconductor substrate such as an SOI substrate, or the like can be used.

As the substrate 101, it is particularly preferable to use the semiconductor substrate or the insulating substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

[Formation of Pixel Electrodes 111R, 111G, and 111B and Connection Electrode 111C]

Next, the pixel electrode 111R, the pixel electrode 111G, the pixel electrode 111B, and the connection electrode 111C are formed over the substrate 101. First, a conductive film to be a pixel electrode is deposited, a resist mask is formed by a photolithography method, and an unnecessary portion of the conductive film is removed by etching. After that, the resist mask is removed to form the pixel electrode 111R, the pixel electrode 111G, and the pixel electrode 111B.

In the case where a conductive film that has a property of reflecting visible light is used as each pixel electrode, it is preferable to use a material (e.g., silver or aluminum) having reflectance as high as possible in the whole wavelength range of visible light. This can increase not only light extraction efficiency, but also color reproducibility of the light-emitting elements.

[Formation of Insulating Layer 131]

Next, the insulating layer 131 is formed so as to cover the end portions of the pixel electrode 111R, the pixel electrode 111G, and the pixel electrode 111B (FIG. 2A). An organic insulating film or an inorganic insulating film can be used for the insulating layer 131. The end portions of the insulating layer 131 are preferably tapered to improve step coverage with an EL film in a later step. In particular, when an organic insulating film is used, a photosensitive material is preferably used, in which case the shape of the end portions can be easily controlled by the conditions of light exposure and development.

[Formation of EL Film 112Rf]

Next, an EL film 112Rf to be the EL layer 112R is deposited over the pixel electrode 111R, the pixel electrode 111G, the pixel electrode 111B, and the insulating layer 131.

The EL film 112Rf includes at least a film containing a light-emitting compound. A structure may be employed in which one or more films functioning as an electron-injection layer, an electron-transport layer, a charge-generation layer, a hole-transport layer, or a hole-injection layer are stacked in addition to the above. The EL film 112Rf can be formed by, for example, an evaporation method, a sputtering method, or an inkjet method. Without limitation to this, the above-described deposition method can be used as appropriate.

For example, the EL film 112Rf is preferably a stacked film in which a hole-injection layer, a hole-transport layer, a light-emitting layer, and an electron-transport layer are stacked in this order. In that case, a film including the electron-injection layer can be used as the EL layer 114 formed later. In particular, the electron-transport layer is provided to cover the light-emitting layer, which can inhibit the light-emitting layer from being damaged by a subsequent photolithography step or the like, so that a highly reliable light-emitting element can be manufactured. Furthermore, when layers containing the same organic compound are used as the electron-transport layer used for the EL film 112Rf or the like and the electron-injection layer to be used for the EL layer 114 later, favorable junction of these layers can be obtained and a light-emitting element with high emission efficiency and high reliability can be achieved. For example, an organic compound having an electron-transport property may be used for the electron-transport layer and a material including the organic compound and a metal may be used for the electron-injection layer.

The EL film 112Rf is preferably formed so as not to be provided over the connection electrode 111C. For example, in the case where the EL film 112Rf is formed by an evaporation method (or a sputtering method), it is preferable that the EL film 112Rf be formed using a shielding mask so as not to be deposited over the connection electrode 111C.

[Formation of Sacrificial Film 144a]

Next, a sacrificial film 144a is formed to cover the EL film 112Rf. The sacrificial film 144a is provided in contact with a top surface of the connection electrode 111C.

As the sacrificial film 144a, it is possible to use a film highly resistant to etching treatment performed on various EL films such as the EL film 112Rf, i.e., a film having high etching selectivity with respect to the EL films. Furthermore, as the sacrificial film 144a, it is possible to use a film having high etching selectivity with respect to a protective film such as a protective film 146a described later. Moreover, as the sacrificial film 144a, it is possible to use a film that can be removed by a wet etching method that is less likely to cause damage to the EL films.

The sacrificial film 144a can be formed using an inorganic film such as a metal film, an alloy film, a metal oxide film, a semiconductor film, or an inorganic insulating film, for example. The sacrificial film 144a can be formed by any of a variety of deposition methods such as a sputtering method, an evaporation method, a CVD method, and an ALD method.

For example, a metal material such as gold, silver, platinum, magnesium, nickel, tungsten, chromium, molybdenum, iron, cobalt, copper, palladium, titanium, aluminum, yttrium, zirconium, and tantalum, or an alloy material containing the metal material can be used as the sacrificial film 144a. It is particularly preferable to use a low-melting-point material such as aluminum or silver. Alternatively, the sacrificial film 144a can be formed using a metal oxide such as an indium-gallium-zinc oxide (In—Ga—Zn oxide, also referred to as IGZO). It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Moreover, indium tin oxide containing silicon can also be used, for example.

Note that an element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. In particular, M is preferably one or more kinds selected from gallium, aluminum, and yttrium.

Alternatively, the sacrificial film 144a can be formed using an inorganic insulating material such as aluminum oxide, hafnium oxide, or silicon oxide.

The sacrificial film 144a is preferably formed using a material that can be dissolved in a solvent chemically stable with respect to at least the uppermost film of the EL film 112Rf. In particular, a material that will be dissolved in water or alcohol can be suitably used for the sacrificial film 144a. In deposition of the sacrificial film 144a, it is preferable that application of such a material dissolved in a solvent such as water or alcohol be performed by a wet process and followed by heat treatment for evaporating the solvent. At this time, the heat treatment is preferably performed in a reduced-pressure atmosphere, in which case the solvent can be removed at a low temperature in a short time and thermal damage to the EL film 112Rf can be reduced accordingly.

Examples of a wet process that can be employed for forming the sacrificial film 144a include spin coating, dipping, spray coating, ink-jetting, dispensing, screen printing, offset printing, a doctor knife method, a slit coating, a roll coating, a curtain coating, a knife coating, or the like.

As the sacrificial film 144a, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin can be used.

[Formation of Protective Film 146a]

Next, the protective film 146a is formed over the sacrificial film 144a (FIG. 2B).

The protective film 146a is a film used as a hard mask when the sacrificial film 144a is etched later. In a later step of processing the protective film 146a, the sacrificial film 144a is exposed. Thus, the combination of films having high etching selectivity therebetween is selected for the sacrificial film 144a and the protective film 146a. It is thus possible to select a film that can be used for the protective film 146a depending on an etching condition of the sacrificial film 144a and an etching condition of the protective film 146a.

For example, in the case where dry etching using a gas containing fluorine (also referred to as a fluorine-based gas) is used for the etching of the protective film 146a, silicon, silicon nitride, silicon oxide, tungsten, titanium, molybdenum, tantalum, tantalum nitride, an alloy containing molybdenum and niobium, an alloy containing molybdenum and tungsten, or the like can be used for the protective film 146a. Here, a metal oxide film using IGZO, ITO, or the like is given as a film having high etching selectivity (that is, enabling low etching rate) in dry etching using the fluorine-based gas, and such a film can be used as the sacrificial film 144a.

Without being limited to the above, a material of the protective film 146a can be selected from a variety of materials depending on an etching condition of the sacrificial film 144a and an etching condition of the protective film 146a. For example, a film used as the protective film 146a can be selected from the films that can be used as the sacrificial film 144a.

As the protective film 146a, a nitride film can be used, for example. Specifically, it is possible to use a nitride such as silicon nitride, aluminum nitride, hafnium nitride, titanium nitride, tantalum nitride, tungsten nitride, gallium nitride, or germanium nitride.

As the protective film 146a, an oxide film can also be used. Typically, an oxide film or an oxynitride film such as silicon oxide, silicon oxynitride, aluminum oxide, aluminum oxynitride, hafnium oxide, or hafnium oxynitride can be used.

Alternatively, as the protective film 146a, an organic film that can be used as the EL film 112Rf or the like can be used. For example, the protective film 146a can be formed using the same organic film that are used as the EL film 112Rf, an EL film 112Gf, or an EL film 112Bf (not illustrated). The use of such an organic film is preferable, in which case the same deposition apparatus can be used for forming the EL film 112Rf or the like.

[Formation of Resist Mask 143a]

Then, over the protective film 146a, a resist mask 143a is formed in each of a position overlapping with the pixel electrode 111R and a position overlapping with the connection electrode 111C (FIG. 2C).

For the resist mask 143a, a resist material containing a photosensitive resin such as a positive type resist material or a negative type resist material can be used.

In the case where the resist mask 143a is formed over the sacrificial film 144a without using the protective film 146a, there is a risk of dissolving the EL film 112Rf due to a solvent of the resist material if a defect such as a pinhole exists in the sacrificial film 144a. Such a defect can be prevented by using the protective film 146a.

Note that in the case where a film that is unlikely to cause a defect such as a pinhole is used as the sacrificial film 144a, the resist mask 143a may be formed directly on the sacrificial film 144a without using the protective film 146a.

[Etching of Protective Film 146a]

Next, part of the protective film 146a that is not covered with the resist mask 143a is removed by etching, so that a band-shaped protective layer 147a is formed. At this time, the protective layer 147a is concurrently formed also over the connection electrode 111C.

In the etching of the protective film 146a, an etching condition with high etching selectivity is preferably employed so that the sacrificial film 144a is not removed by the etching. Either wet etching or dry etching can be performed for the etching of the protective film 146a; the use of dry etching is preferable, in which case a shrinkage of the pattern of the protective film 146a can be inhibited.

[Removal of Resist Mask 143a]

Next, the resist mask 143a is removed (FIG. 2D).

The removal of the resist mask 143a can be performed by wet etching or dry etching. It is particularly preferable to perform dry etching (also referred to as plasma ashing) using an oxygen gas as an etching gas to remove the resist mask 143a.

At this time, the removal of the resist mask 143a is performed in a state where the EL film 112Rf is covered with the sacrificial film 144a; thus, the influence on the EL film 112Rf is inhibited. In particular, when the EL film 112Rf is exposed to oxygen, the electrical characteristics are adversely affected in some cases; thus, it is suitable in the case where etching using an oxygen gas, such as plasma ashing, is performed.

[Etching of Sacrificial Film 144a]

Next, part of the sacrificial film 144a that is not covered with the protective layer 147a is removed by etching with use of the protective layer 147a as a mask, so that a band-shaped sacrificial layer 145a is formed (FIG. 2E). At this time, the sacrificial layer 145a is concurrently formed also over the connection electrode 111C.

Either wet etching or dry etching can be performed for the etching of the sacrificial film 144a; the use of dry etching is preferable, in which case a shrinkage of the pattern can be inhibited.

[Etching of EL Film 112Rf and Protective Layer 147a]

Next, part of the EL film 112Rf that is not covered with the sacrificial layer 145a is removed by etching at the same time as etching of the protective layer 147a, whereby the EL layer 112R having a band shape is formed (FIG. 2F). At this time, the protective layer 147a over the connection electrode 111C is also removed at the same time.

The EL film 112Rf and the protective layer 147a are preferably etched by the same treatment, in which case the process can be simplified and the manufacturing cost of the display device can be reduced.

In particular, for the etching of the EL film 112Rf, it is preferable to perform dry etching using an etching gas that does not contain oxygen as its main component. This is because the alteration of the EL film 112Rf is inhibited, and a highly reliable display device can be achieved. Examples of the etching gas that does not contain oxygen as its main component include $CF_4$, $C_4F_8$, $SF_6$, $CHF_3$, $Cl_2$, $H_2O$, $BCl_3$, Hz, or a noble gas such as He. Alternatively, a mixed gas of the above gas and a dilute gas that does not contain oxygen can be used as the etching gas.

Note that the etching of the EL film 112Rf and the etching of the protective layer 147a may be performed separately. In that case, either the etching of the EL film 112Rf or the etching of the protective layer 147a may be performed first.

At this step, the EL layer 112R and the connection electrode 111C are covered with the sacrificial layer 145a.

[Formation of EL Film 112Gf]

Subsequently, the EL film 112Gf to be the EL layer 112G later is deposited over the sacrificial layer 145a, the insulating layer 131, the pixel electrode 111G, and the pixel electrode 111B. In that case, it is preferable that the EL film 112Gf be not provided over the connection electrode 111C like the EL film 112Rf is not provided.

The above description of the EL film 112Rf can be referred to for the formation method of the EL film 112Gf.

[Formation of Sacrificial Film 144b]

Subsequently, a sacrificial film 144b is formed over the EL film 112Gf. The sacrificial film 144b can be formed in a manner similar to that for the sacrificial film 144a. In particular, the sacrificial film 144b and the sacrificial film 144a are preferably formed using the same material.

At this time, the sacrificial film 144a is concurrently formed also over the connection electrode 111C so as to cover the sacrificial layer 145a.

[Formation of Protective Film 146b]

Next, a protective film 146b is formed over the sacrificial film 144b. The protective film 146b can be formed in a manner similar to that for the protective film 146a. In particular, the protective film 146b and the protective film 146a are preferably formed using the same material.

[Formation of Resist Mask 143b]

Figures 3A, 3B, 3C, 3D, 3E, 3F:
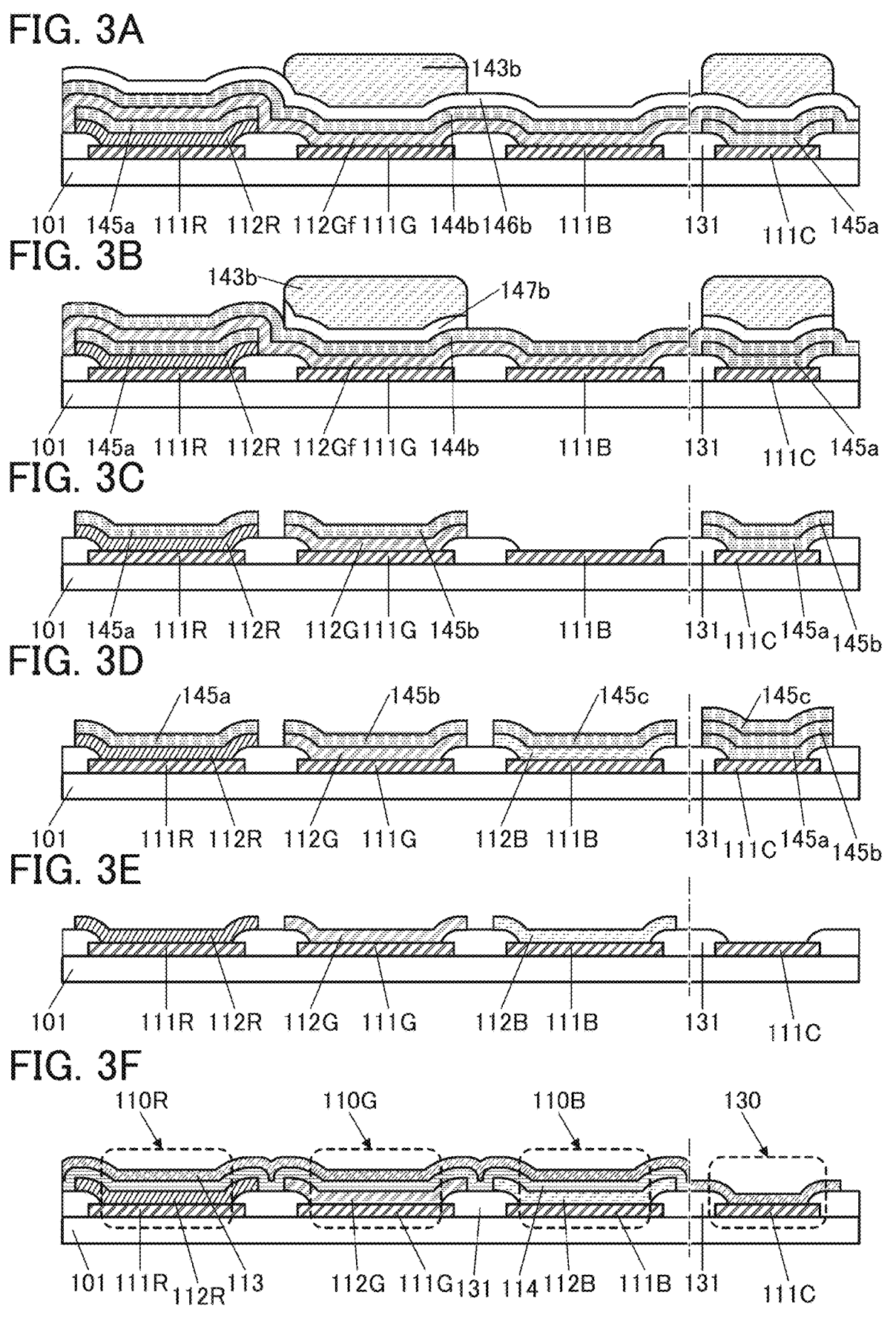

Then, over the protective film 146b, a resist mask 143b is formed in a position overlapping with the pixel electrode 111G and a position overlapping with the connection electrode 111C (FIG. 3A).

The resist mask 143b can be formed in a manner similar to that for the resist mask 143a.

[Etching of Protective Film 146b]

Next, part of the protective film 146b that is not covered with the resist mask 143b is removed by etching, so that a band-shaped protective layer 147b is formed (FIG. 3B). At this time, the protective layer 147b is concurrently formed also over the connection electrode 111C.

The above description of the protective film 146a can be referred to for the etching of the protective film 146b.

[Removal of Resist Mask 143b]

Next, the resist mask 143b is removed. The above description of the resist mask 143a can be referred to for the removal of the resist mask 143b.

[Etching of Sacrificial Film 144b]

Next, part of the sacrificial film 144b that is not covered with the protective layer 147b is removed by etching with use of the protective layer 147b as a mask, so that a band-shaped sacrificial layer 145b is formed. At this time, the sacrificial layer 145b is concurrently formed also over the connection electrode 111C. The sacrificial layer 145a and the sacrificial layer 145b are stacked over the connection electrode 111C.

The above description of the sacrificial film 144a can be referred to for the etching of the sacrificial film 144b.

[Etching of EL Film 112Gf and Protective Layer 147b]

Next, part of the EL film 112Gf that is not covered with the sacrificial layer 145b is removed by etching at the same time as etching of the protective layer 147b, whereby the EL layer 112G having a band shape is formed (FIG. 3C). At this time, the protective layer 147b over the connection electrode 111C is also removed at the same time.

The above description of the EL film 112Rf and the protective layer 147a can be referred to for the etching of the EL film 112Gf and the protective layer 147b.

At this time, the EL layer 112R is protected by the sacrificial layer 145a, and thus can be prevented from being damaged in the etching step of the EL film 112Gf.

In the above manner, the band-shaped EL layer 112R and the band-shaped EL layer 112G can be separately formed with high alignment accuracy.

[Formation of EL Layer 112B]

The above steps are performed on the EL film 112Bf (not illustrated), whereby the island-shaped EL layer 112B and an island-shaped sacrificial layer 145c can be formed (FIG. 3D).

That is, after the EL layer 112G is formed, the EL film 112Bf, a sacrificial film 144c, a protective film 146c, and a resist mask 143c (each of which is not illustrated) are sequentially formed. After that, the protective film 146c is etched to form a protective layer 147c (not illustrated); then, the resist mask 143c is removed. Subsequently, the sacrificial film 144c is etched to form the sacrificial layer 145c. Then, the protective layer 147c and the EL film 112Bf are etched to form the band-shaped EL layer 112B.

After the EL layer 112B is formed, the sacrificial layer 145c is concurrently formed also over the connection electrode 111C. The sacrificial layer 145a, the sacrificial layer 145b, and the sacrificial layer 145c are stacked over the connection electrode 111C.

[Removal of Sacrificial Layer]

Next, the sacrificial layer 145a, the sacrificial layer 145b, and the sacrificial layer 145c are removed, whereby top surfaces of the EL layer 112R, the EL layer 112G, and the EL layer 112B are exposed (FIG. 3E). At this time, the top surface of the connection electrode 111C is also exposed at the same time.

The sacrificial layer 145a, the sacrificial layer 145b, and the sacrificial layer 145c can be removed by wet etching or dry etching. At this time, a method that causes damage to the EL layer 112R, the EL layer 112G, and the EL layer 112B as little as possible is preferably employed. In particular, a wet etching method is preferably used. For example, wet etching using a tetramethyl ammonium hydroxide (TMAH) aqueous solution, diluted hydrofluoric acid, oxalic acid, phosphoric acid, acetic acid, nitric acid, or a mixed solution thereof is preferably performed.

Alternatively, the sacrificial layer 145a, the sacrificial layer 145b, and the sacrificial layer 145c are preferably removed by being dissolved in a solvent such as water or alcohol. Here, examples of the alcohol in which the sacrificial layer 145a, the sacrificial layer 145b, and the sacrificial layer 145c can be dissolved include a variety of alcohol such as ethyl alcohol, methyl alcohol, isopropyl alcohol (IPA), and glycerin.

After the sacrificial layer 145a, the sacrificial layer 145b, and the sacrificial layer 145c are removed, drying treatment is preferably performed in order to remove water contained in the EL layer 112R, the EL layer 112G, and the EL layer 112B and water adsorbed on the surfaces of the EL layer 112R, the EL layer 112G, and the EL layer 112B. For example, heat treatment is preferably performed in an inert gas atmosphere or a reduced-pressure atmosphere. The heat treatment can be performed at a substrate temperature of higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere, in which case drying at a lower temperature is possible.

In this manner, the EL layer 112R, the EL layer 112G, and the EL layer 112B can be formed separately.

[Formation of EL Layer 114]

Then, the EL layer 114 is deposited to cover the EL layer 112R, the EL layer 112G, and the EL layer 112B.

The EL layer 114 can be deposited in a manner similar to that of the EL film 112Rf or the like. In the case where the EL layer 114 is deposited by an evaporation method, the EL layer 114 is preferably deposited using a shielding mask so as not to be deposited over the connection electrode 111C.

[Formation of Common Electrode 113]

Then, the common electrode 113 is formed to cover the EL layer 114 and the connection electrode 111C (FIG. 3F).

The common electrode 113 can be formed by a deposition method such as an evaporation method or a sputtering method. Alternatively, a film formed by an evaporation method and a film formed by a sputtering method may be stacked. In that case, the common electrode 113 is preferably formed so as to cover a region where the EL layer 114 is deposited. That is, a structure in which end portions of the EL layer 114 overlap with the common electrode 113 can be obtained. The common electrode 113 is preferably formed using a shielding mask.

The common electrode 113 is electrically connected to the connection electrode 111C outside a display region.

[Formation of Protective Layer]

Next, the protective layer 121 is formed over the common electrode 113. An inorganic insulating film used for the protective layer 121 is preferably deposited by a sputtering method, a PECVD method, or an ALD method. In particular, an ALD method is preferable because a film formed by an ALD method has good step coverage and is less likely to cause a defect such as a pinhole. An organic insulating film is preferably deposited by an inkjet method because a uniform film can be formed in a desired area.

Through the above steps, the display device 100 illustrated in FIG. 1B and FIG. 1C can be manufactured.

Although the case where the common electrode 113 and the EL layer 114 are formed so as to have different top surface shapes is described above, they may be formed in the same region to have the same top surface shape.

FIG. 4A is a schematic cross-sectional view after removal of the sacrificial layer in the above description. Next, as illustrated in FIG. 4B, the EL layer 114 and the common electrode 113 are formed using the same shielding mask or without using a shielding mask. Thus, manufacturing cost can be reduced as compared to the case where different shielding masks are used.

As illustrated in FIG. 4B, in the connection portion 130, the EL layer 114 is provided between the connection electrode 111C and the common electrode 113. At this time, for the EL layer 114, a material with as low electric resistance as possible is preferably used. Alternatively, it is preferable to form the EL layer 114 as thin as possible, in which case the electric resistance of the EL layer 114 in the thickness direction can be reduced. For example, the EL layer 114 can be formed using a material having an electron-injection property or a hole-injection property having a thickness greater than or equal to 1 nm and less than or equal to 5 nm, preferably greater than or equal to 1 nm and less than or equal to 3 nm, whereby the electric resistance between the connection electrode 111C and the common electrode 113 can be made negligible in some cases.

Subsequently, the protective layer 121 is formed as illustrated in FIG. 4C. At this time, as illustrated in FIG. 4C, the protective layer 121 is preferably provided to cover end portions of the common electrode 113 and the end portions of the EL layer 114. Accordingly, diffusion of impurities such as water or oxygen into the EL layer 114 and an interface between the EL layer 114 and the common electrode 113 from the outside can be effectively prevented.

The above is the description of a manufacturing method example of a display device.

Structure Example 2

In the description below, a structure example of a display device whose structure is partly different from that of the above-described structure example 1 will be described. Hereinafter, description of the portions overlapping with the above is omitted in some cases.

A display device 100A illustrated in FIG. 5A to FIG. 5D is different from the display device 100 mainly in the shapes of the EL layer 114 and the common electrode 113.

Figures 5A, 5B, 5C, 5D:
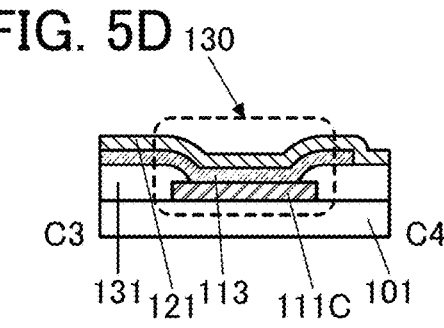

As illustrated in FIG. 5C, in a cross section in the Y direction, the EL layer 112R, the EL layer 114, and the common electrode 113 are separated between the two light-emitting elements 110R. In other words, the EL layer 112R, the EL layer 114, and the common electrode 113 have end portions in a portion overlapping with the insulating layer 131.

In addition, the protective layer 121 is provided to cover side surfaces of the EL layer 112R, the EL layer 114, and the common electrode 113 in a region overlapping with the insulating layer 131.

As illustrated in FIG. 5C, a recessed portion may be formed on part of a top surface of the insulating layer 131. In that case, the protective layer 121 is preferably provided along and in contact with the surface of the recessed portion of the insulating layer 131. This is preferable because the contact area between the insulating layer 131 and the protective layer 121 is increased and the adhesion of the insulating layer 131 and the protective layer 121 is improved.

In FIG. 5A, the outline of the common electrode 113 and the EL layer 114 is denoted by a dashed line. As illustrated in FIG. 5A, the common electrode 113 and the EL layer 114 each have a band-shaped top surface shape, whereby a longitudinal direction is parallel to the X direction. By contrast, as illustrated in FIG. 5B and FIG. 5C, the EL layer 112R has an island shape.

Although not illustrated here, the light-emitting element 110G and the light-emitting element 110B can also have a similar structure.

Manufacturing Method Example 2

An example of a manufacturing method of the display device 100A will be described below. Note that in the description below, the manufacturing method example 1 described above is referred to for portions similar to those described in the manufacturing method example 1, and description of the portions is omitted in some cases. The manufacturing method example described here is different from that of the above manufacturing method example 1 in the process after the formation process of the common electrode 113.

FIG. 6A to FIG. 6D are schematic cross-sectional views of steps described below. Here, a cross section taken along dashed-dotted line B3-B4 and a cross section taken along dashed-dotted line C3-C4 in FIG. 5A are illustrated side by side.

Figures 6A, 6B, 6C, 6D, 6E:
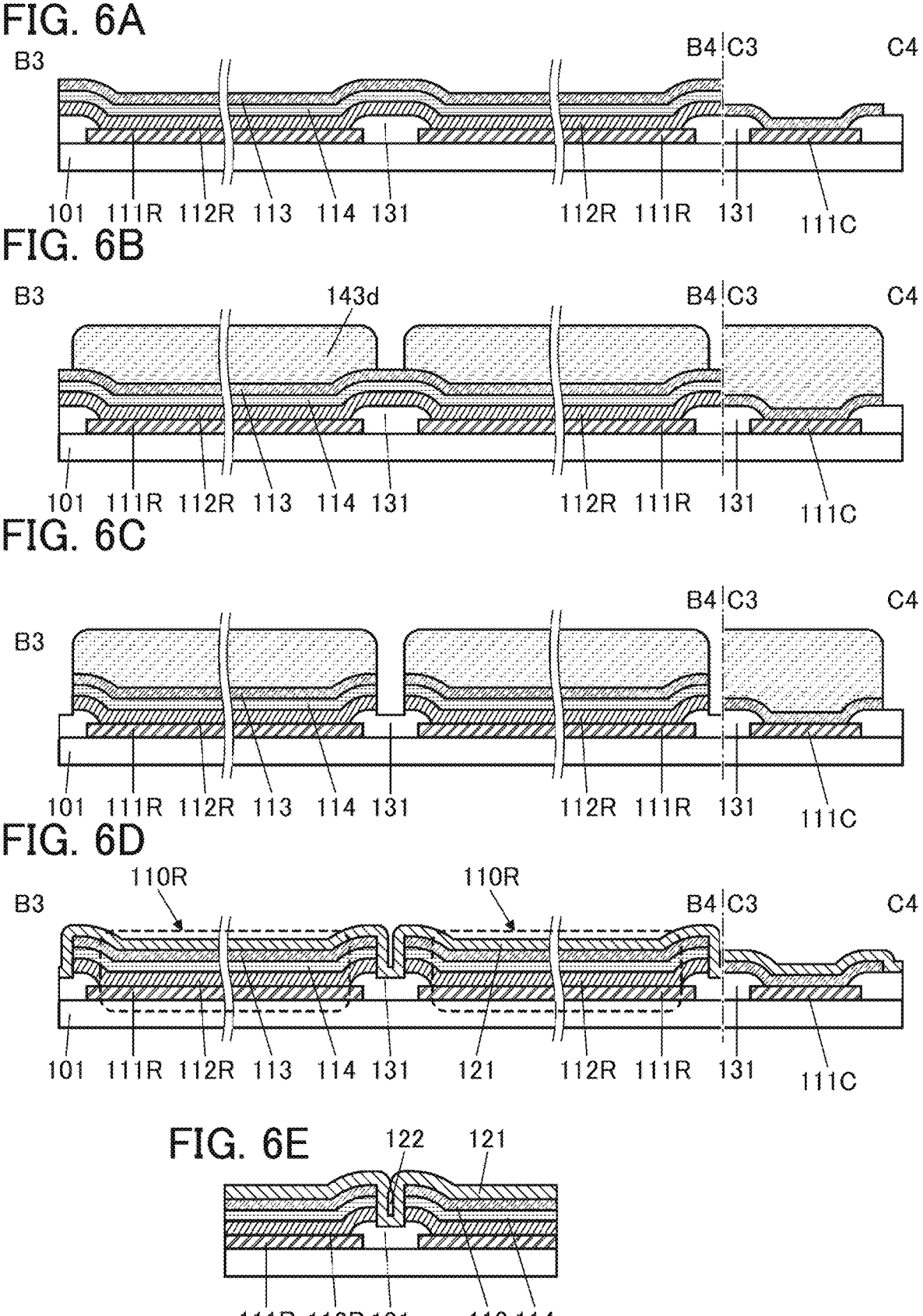

In a manner similar to that of the manufacturing method example 1, steps up to the formation of the common electrode 113 are performed in order (FIG. 6A).

Next, a plurality of resist masks 143d are formed over the common electrode 113. The resist mask 143d is formed to have a band-shaped top surface shape extending in the X direction. The resist mask 143d overlaps with the pixel electrode 111R. An end portion of the resist mask 143d is provided over the insulating layer 131.

Next, portions of the common electrode 113, the EL layer 114, the EL layer 112R, the EL layer 112G (not illustrated), and the EL layer 112B (not illustrated) that are not covered with the resist mask 143d are removed by etching (FIG. 6C). Accordingly, the common electrode 113 and the EL layer 114 that have been covering the entire pixel electrodes and provided continuously can be divided with a slit formed by the etching so that the plurality of band-shaped common electrodes 113 and the EL layer 114 are formed.

Therefore, it is preferable to employ dry etching as the etching. For example, by changing the etching gas, the common electrode 113, the EL layer 114, the EL layer 112R, and the like are preferably etched successively without exposure to the air. Furthermore, a gas that does not contain oxygen as its main component is preferably used as the etching gas.

In the etching for the electrode 113, the EL layer 114, the EL layer 112R, and the like, part of the insulating layer 131 may be etched, so that the recessed portion may be formed in the upper portion of the insulating layer 131 as illustrated in FIG. 6C. Alternatively, a portion of the insulating layer 131 that is not covered with the resist mask 143d is etched and is divided into two in some cases.

Next, the resist mask 143d is removed. The removal of the resist masks 143d can be performed by wet etching or dry etching.

Next, the protective layer 121 is formed (FIG. 6D). The protective layer 121 is provided to cover the side surface of the common electrode 113, the side surface of the EL layer 114, and the side surface of the EL layer 112R. The protective layer 121 is preferably provided in contact with the top surface of the insulating layer 131.

As illustrated in FIG. 6E, a space (also referred to as a gap, an interval, or the like) 122 might be formed above the insulating layer 131 when the protective layer 121 is formed. The space 122 may be in a reduced pressure state or in an atmospheric pressure. A gas such as air, nitrogen, or a noble gas or a deposition gas used for depositing the protective layer 121 may be contained.

The above is the description of a manufacturing method example of the display device 100A.

Note that although the resist mask 143d is directly formed over the common electrode 113, a film functioning as a hard mask may be provided over the common electrode 113. At this time, a hard mask can be formed using the resist mask 143d as a mask and after the resist mask is removed, the hard mask can be used a mask, whereby the common electrode 113, the EL layer 114, the EL layer 112R, and the like can be etched. Note that at this time, the hard mask may be removed or left.

Modification Example

A structure example whose structure is partly different from that of the above is described below. Note that in the description below, the above description is referred to for portions similar to those described above and the portions are not described in some cases.

Modification Example 1

FIG. 7A and FIG. 7B are schematic cross-sectional views of a display device 100B. A top view of the display device 100B is similar to that in FIG. 1A. FIG. 7A corresponds to a cross section in the X direction, and FIG. 7B corresponds to a cross section in the Y direction.

The display device 100B is different from the display device 100 mainly in not including the EL layer 114, which is a common layer.

The common electrode 113 is provided in contact with the top surfaces of the EL layer 112R, the EL layer 112G, and the EL layer 112B. When the EL layer 114 is not provided, the light-emitting element 110R, the light-emitting element 110G, and the light-emitting element 110B can have significantly different stacked-layer structures; thus, options for materials increase, which can increase the design flexibility.

As illustrated in FIG. 7C, a display device 100C, as in the display device 100A, is an example of a case where a slit extending in the X direction in a region overlapping with the insulating layer 131 in the common electrode 113 is formed. In the display device 100C, the protective layer 121 is provided in contact with the side surface of the common electrode 113, the side surface of the EL layer 112R, and the top surface of the insulating layer 131.

Modification Example 2

A display device 100D illustrated in FIG. 8A and FIG. 8B is different from the display device 100 mainly in the structure of the light-emitting element.

The light-emitting element 110R includes an optical adjustment layer 115R between the pixel electrode 111R and the EL layer 112R. The light-emitting element 110G includes an optical adjustment layer 115G between the pixel electrode 111G and the EL layer 112G. The light-emitting element 110B includes an optical adjustment layer 115B between the pixel electrode 111B and the EL layer 112B.

In addition, the optical adjustment layer 115R, the optical adjustment layer 115G, and the optical adjustment layer 115B each have a light-transmitting property with respect to visible light. The optical adjustment layer 115R, the optical adjustment layer 115G, and the optical adjustment layer 115B have different thicknesses. Thus, the optical path lengths of the light-emitting elements can differ from one another.

Here, a conductive film that has a property of reflecting visible light is used for the pixel electrode 111R, the pixel electrode 111G, and the pixel electrode 111B, and a conductive film that has properties of reflecting and transmitting visible light is used for the common electrode 113. Thus, the light-emitting elements have what is called a microcavity structure and intensify light with a specific wavelength. This can achieve a display device having a high color purity.

A conductive material that has a property of transmitting visible light can be used for each of the optical adjustment layers. For example, a conductive oxide such as indium oxide, indium tin oxide, indium zinc oxide, zinc oxide, zinc oxide containing gallium, indium-tin oxide containing silicon, or an indium-zinc oxide containing silicon can be used.

The optical adjustment layers can be formed after the formation of the pixel electrode 111R, the pixel electrode 111G, and the pixel electrode 111B and before the formation of the EL film 112Rf and the like. The optical adjustment layers may be formed using conductive films with different thicknesses from each other or may have a single-layer structure, a two-layer structure, or a three-layer structure, in ascending order of thickness.

A display device 100E illustrated in FIG. 8C is an example of a case of the display device 100A in which an optical adjustment layer is used. FIG. 8C illustrates a cross section of the two light-emitting elements 110G that are arranged side by side in the Y direction.

Modification Example 3

A display device 100F illustrated in FIG. 9A and FIG. 9B is different from the display device 100D mainly in not including an optical adjustment layer.

The display device 100F shows an example where a microcavity structure is achieved with the thicknesses of the EL layer 112R, the EL layer 112G, and the EL layer 112B. Such a structure does not require an optical adjustment layer provided additionally, simplifying the process.

For example, in the display device 100C, the EL layer 112R of the light-emitting element 110R emitting light whose wavelength is longest has the largest thickness, and the EL layer 112B of the light-emitting element 110B emitting light whose wavelength is shortest has the smallest thickness. Without limitation to this, the thickness of the EL layer can be adjusted in consideration of the wavelength of light emitted by the light-emitting element, the optical characteristics of the layer included in the light-emitting element, the electrical characteristics of the light-emitting element, and the like.

A display device 100G illustrated in FIG. 9C shows an example in which the thickness of the EL layer of the display device 100A is changed and a microcavity structure is achieved. FIG. 9C illustrates a cross section of the two light-emitting elements 110G that are arranged side by side in the Y direction.

The above is the description of the modification examples.

Note that although in modification example 2 and modification example 3, examples using the EL layer 114 are described, a structure in which the EL layer 114 is not provided may be employed.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 2

In this embodiment, structure examples of a display device of one embodiment of the present invention are described.

The display device of this embodiment can be a high-definition display device or a large-sized display device. Accordingly, the display device of this embodiment can be used for display portions of electronic devices such as a digital camera, a digital video camera, a digital photo frame, a mobile phone, a portable game console, a smart phone, a wristwatch terminal, a tablet terminal, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

[Display Device 400A]

FIG. 10 is a perspective view of a display device 400A, and FIG. 11A is a cross-sectional view of the display device 400A.

The display device 400A has a structure in which a substrate 452 and a substrate 451 are bonded to each other. In FIG. 10, the substrate 452 is denoted by a dashed line.

The display device 400A includes a display portion 462, a circuit 464, a wiring 465, and the like. FIG. 10 illustrates an example in which an IC 473 and an FPC 472 are integrated on the display device 400A. Thus, the structure illustrated in FIG. 10 can be regarded as a display module including the display device 400A, the IC (integrated circuit), and the FPC.

As the circuit 464, for example, a scan line driver circuit can be used.

The wiring 465 has a function of supplying a signal and power to the display portion 462 and the circuit 464. The signal and power are input to the wiring 465 from the outside through the FPC 472 or input to the wiring 465 from the IC 473.

FIG. 10 illustrates an example in which the IC 473 is provided over the substrate 451 by a COG (Chip On Glass) method, a COF (Chip on Film) method, or the like. An IC including a scan line driver circuit, a signal line driver circuit, or the like can be used as the IC 473, for example. Note that the display device 400A and the display module are not necessarily provided with an IC. The IC may be mounted on the FPC by a COF method or the like.

FIG. 11A illustrates an example of cross sections of part of a region including the FPC 472, part of the circuit 464, part of the display portion 462, and part of a region including an end portion in the display device 400A.

The display device 400A illustrated in FIG. 11A includes a transistor 201, a transistor 205, a light-emitting element 430*a* which emits red light, a light-emitting element 430*b* which emits green light, a light-emitting element 430*c* which emits blue light, and the like between the substrate 451 and the substrate 452.

The light-emitting element described in Embodiment 1 can be employed for the light-emitting element 430*a*, the light-emitting element 430*b*, and the light-emitting element 430*c*.

Here, in the case where the pixel of the display device includes three kinds of subpixels each including a light-emitting element that emit different colors, as the three subpixels, subpixels of three colors of R, G, and B, subpixels of three colors of yellow (Y), cyan (C), and magenta (M), and the like can be given. In the case where the pixel includes four subpixels each including a light-emitting element, as the four subpixels, subpixels of four colors of R, G, B, and white (W), subpixels of four colors of R, G, B, and Y, and the like can be given.

A protective layer 416 and the substrate 452 are bonded to each other with an adhesive layer 442. A solid sealing structure, a hollow sealing structure, or the like can be employed to seal the light-emitting elements. In FIG. 11A, a hollow sealing structure is employed in which a space 443 surrounded by the substrate 452, the adhesive layer 442, and the substrate 451 is filled with an inert gas (e.g., nitrogen or argon). The adhesive layer 442 may be provided so as to overlap with the light-emitting elements. The space 443 surrounded by the substrate 452, the adhesive layer 442, and the substrate 451 may be filled with a resin different from that of the adhesive layer 442.

The light-emitting elements 430*a*, 430*b*, and 430*c* each have an optical adjustment layer between the pixel electrode and the EL layer. The light-emitting element 430*a* includes an optical adjustment layer 426*a*, the light-emitting element 430*b* includes an optical adjustment layer 426*b*, and the light-emitting element 430*c* includes an optical adjustment layer 426*c*. For details of the light-emitting element, Embodiment 1 can also be referred to.

Pixel electrodes 411*a*, 411*b*, and 411*c* are each connected to a conductive layer 222*b* included in the transistor 205 through an opening provided in an insulating layer 214.

End portions of the pixel electrode and the optical adjustment layer are covered with an insulating layer 421. The pixel electrode contains a material that reflects visible light, and a counter electrode (common electrode) contains a material that transmits visible light.

Light emitted from the light-emitting element is emitted toward the substrate 452 side. For the substrate 452, a material having a high visible-light-transmitting property is preferably used.

The transistor 201 and the transistor 205 are formed over the substrate 451. These transistors can be formed using the same materials in the same steps.

An insulating layer 211, an insulating layer 213, an insulating layer 215, and the insulating layer 214 are provided in this order over the substrate 451. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may have either a single layer or two or more layers.

A material through which impurities such as water and hydrogen do not easily diffuse is preferably used for at least one of the insulating layers that cover the transistors. This allows the insulating layer to function as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, an aluminum nitride film, or the like can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

Here, an organic insulating film often has a lower barrier property than an inorganic insulating film. Therefore, the organic insulating film preferably has an opening in the vicinity of an end portion of the display device 400A. This can inhibit entry of impurities from the end portion of the display device 400A through the organic insulating film. Alternatively, the organic insulating film may be formed so that an end portion of the organic insulating film is positioned on the inner side compared to the end portion of the display device 400A, to prevent the organic insulating film from being exposed at the end portion of the display device 400A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 11A, an opening is formed in the insulating layer 214. This can inhibit entry of impurities into the display portion 462 from the outside through the insulating layer 214 even when an organic insulating film is used as the insulating layer 214. Thus, the reliability of the display device 400A can be increased.

Each of the transistor 201 and the transistors 205 includes a conductive layer 221 functioning as a gate, the insulating layer 211 functioning as the gate insulating layer, a conductive layer 222*a* and the conductive layer 222*b* functioning as a source and a drain, a semiconductor layer 231, the insulating layer 213 functioning as the gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display device of this embodiment. For example, a planar transistor, a staggered transistor, an inverted staggered transistor, or the like can be used. A top-gate or a bottom-gate transistor structure may be employed. Alternatively, gates may be provided above and below the semiconductor layer in which a channel is formed.

The structure in which the semiconductor layer where a channel is formed is provided between two gates is used for the transistor 201 and the transistors 205. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used, in which case deterioration of the transistor characteristics can be inhibited.

The semiconductor layer of the transistor preferably includes a metal oxide (also referred to as an oxide semiconductor). That is, a transistor including a metal oxide in its channel formation region (hereinafter, also referred to as an OS transistor) is preferably used for the display device of this embodiment. Alternatively, the semiconductor layer of the transistor may include silicon. Examples of silicon include amorphous silicon and crystalline silicon (e.g., low-temperature poly silicon or single crystal silicon).

The semiconductor layer preferably includes indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

When the semiconductor layer is an In-M-Zn oxide, the atomic ratio of In is preferably higher than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of ±30% of an intended atomic ratio.

Note that when the atomic ratio is described as In:Ga:Zn=4:2:3 or a composition in the neighborhood thereof, the case is included where Ga is greater than or equal to 1 and less than or equal to 3 and Zn is greater than or equal to 2 and less than or equal to 4 with In being 4. When the atomic ratio is described as In:Ga:Zn=5:1:6 or a composition in the neighborhood thereof, the case is included where Ga is greater than 0.1 and less than or equal to 2 and Zn is greater than or equal to 5 and less than or equal to 7 with In being 5. When the atomic ratio is described as In:Ga:Zn=1:1:1 or a composition in the neighborhood thereof, the case is included where Ga is greater than 0.1 and less than or equal to 2 and Zn is greater than 0.1 and less than or equal to 2 with In being 1.

The transistor included in the circuit 464 and the transistor included in the display portion 462 may have the same structure or different structures. A plurality of transistors included in the circuit 464 may have the same structure or two or more kinds of structures. Similarly, a plurality of transistors included in the display portion 462 may have the same structure or two or more kinds of structures.

A connection portion 204 is provided in a region of the substrate 451 that does not overlap with the substrate 452. In the connection portion 204, the wiring 465 is electrically connected to the FPC 472 through a conductive layer 466 and a connection layer 242. An example is illustrated in which the conductive layer 466 has a stacked-layer structure of a conductive film obtained by processing the same conductive film as the pixel electrode and a conductive film obtained by processing the same conductive film as the optical adjustment layer. On a top surface of the connection portion 204, the conductive layer 466 is exposed. Thus, the connection portion 204 and the FPC 472 can be electrically connected to each other through the connection layer 242.

A light-blocking layer 417 is preferably provided on a surface of the substrate 452 on the substrate 451 side. A variety of optical members can be arranged on the outer side of the substrate 452. Examples of the optical members include a polarizing plate, a retardation plate, a light diffusion layer (a diffusion film or the like), an anti-reflective layer, and a light-condensing film. Furthermore, an antistatic film inhibiting the attachment of dust, a water repellent film inhibiting the attachment of stain, a hard coat film inhibiting generation of a scratch caused by the use, a shock absorbing layer, or the like may be provided on the outer side of the substrate 452.

With provision of the protective layer 416 that covers the light-emitting element, entry of impurities such as water into the light-emitting element can be inhibited, leading to an increase in the reliability of the light-emitting element.

In the region 228 in the vicinity of the end portion of the display device 400A, the insulating layer 215 and the protective layer 416 are preferably in contact with each other through the opening in the insulating layer 214. In particular, the inorganic insulating film included in the insulating layer 215 and the inorganic insulating film included in the protective layer 416 are preferably in contact with each other. Thus, entry of impurities into the display portion 462 from the outside through an organic insulating film can be inhibited. Thus, the reliability of the display device 400A can be increased.

FIG. 11B illustrates an example in which the protective layer 416 has a three-layer structure. In FIG. 11B, the protective layer 416 includes an inorganic insulating layer 416a over the light-emitting element 430c, an organic insulating layer 416b over the inorganic insulating layer 416a, and an inorganic insulating layer 416c over the organic insulating layer 416b.

An end portion of the inorganic insulating layer 416a and an end portion of the inorganic insulating layer 416c extend beyond an end portion of the organic insulating layer 416b and are in contact with each other. The inorganic insulating layer 416a is in contact with the insulating layer 215 (inorganic insulating layer) through the opening in the insulating layer 214 (organic insulating layer). Thus, the light-emitting element can be surrounded by the insulating layer 215 and the protective layer 416, so that the reliability of the light-emitting element can be increased.

As described above, the protective layer 416 may have a stacked-layer structure of an organic insulating film and an inorganic insulating film. In that case, an end portion of the inorganic insulating film preferably extends beyond an end portion of the organic insulating film.

For each of the substrate 451 and the substrate 452, glass, quartz, ceramic, sapphire, a resin, a metal, an alloy, a semiconductor, or the like can be used. The substrate on the side where light from the light-emitting element is extracted is formed using a material that transmits the light. When a flexible material is used for the substrate 451 and the substrate 452, the flexibility of the display device can be increased. Furthermore, a polarizing plate may be used as the substrate 451 or the substrate 452.

For each of the substrate 451 and the substrate 452, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 451 and the substrate 452.

In the case where a circularly polarizing plate overlaps with the display device, a highly optically isotropic substrate is preferably used as the substrate included in the display device. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of a display panel might be changed, e.g., creases are generated. Thus, for the substrate, a film with a low water absorption rate is preferably used. For example, the water absorption rate of the film is preferably lower than or equal to 1%, further preferably lower than or equal to 0.1%, still further preferably lower than or equal to 0.01%.

As the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer 242, an anisotropic conductive film (ACF), an anisotropic conductive paste (ACP), or the like can be used.

Examples of materials that can be used for a gate, a source, and a drain of a transistor and conductive layers such as a variety of wirings and electrodes included in a display device include metals such as aluminum, titanium, chromium, nickel, copper, yttrium, zirconium, molybdenum, silver, tantalum, or tungsten, and an alloy containing any of these metals as its main component. A film containing any of these materials can be used in a single layer or as a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked-layer film of any of the above materials can be used as a conductive layer. For example, a stacked-layer film of indium tin oxide and an alloy of silver and magnesium, or the like is preferably used for increased conductivity. These materials can also be used, for example, for the conductive layers such as a variety of wirings and electrodes included in a display device, and conductive layers (conductive layers functioning as a pixel electrode and a common electrode) included in the light-emitting element.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

[Display Device 400B]

FIG. 12A is a cross-sectional view of a display device 400B. A perspective view of the display device 400B is similar to that of the display device 400A (FIG. 10). FIG. 12A illustrates an example of a cross section including part of a region including the FPC 472, part of the circuit 464, and part of the display portion 462 in the display device 400B. FIG. 12A specifically illustrates an example of a cross section of a region including the light-emitting element 430b that emits green light and the light-emitting element 430c that emits blue light in the display portion 462. Note that portions similar to those of the display device 400A are not described in some cases.

The display device 400B illustrated in FIG. 12A includes a transistor 202, a transistor 210, the light-emitting element 430b, the light-emitting element 430c, and the like between a substrate 453 and a substrate 454.

The substrate 454 and the protective layer 416 are bonded to each other with the adhesive layer 442. The adhesive layer 442 is provided so as to overlap with the light-emitting element 430b and the light-emitting element 430c; that is, the display device 400B employs a solid sealing structure.

The substrate 453 and an insulating layer 212 are bonded to each other with an adhesive layer 455.

In a manufacturing method of the display device 400B, first, a formation substrate provided with the insulating layer 212, the transistors, the light-emitting elements, and the like is bonded to the substrate 454 provided with the light-blocking layer 417 with the adhesive layer 442. Then, the substrate 453 is attached to a surface exposed by separation of the formation substrate, whereby the components formed over the formation substrate are transferred onto the substrate 453. The substrate 453 and the substrate 454 preferably have flexibility. This can increase the flexibility of the display device 400B.

The inorganic insulating film that can be used as the insulating layer 211, the insulating layer 213, and the insulating layer 215 can be used as the insulating layer 212.

The pixel electrode is connected to the conductive layer 222b included in the transistor 210 through an opening provided in the insulating layer 214. The conductive layer 222b is connected to a low-resistance region 231n through an opening provided in the insulating layer 215 and an insulating layer 225. The transistor 210 has a function of controlling driving of the light-emitting element.

An end portion of the pixel electrode is covered with the insulating layer 421.

Light emitted by the light-emitting elements 430b and 430c is emitted toward the substrate 454 side. For the substrate 454, a material having a high visible-light-transmitting property is preferably used.

The connection portion 204 is provided in a region of the substrate 453 that does not overlap with the substrate 454. In the connection portion 204, the wiring 465 is electrically connected to the FPC 472 through the conductive layer 466 and the connection layer 242. The conductive layer 466 can be obtained by processing the same conductive film as the pixel electrode. Thus, the connection portion 204 and the FPC 472 can be electrically connected to each other through the connection layer 242.

Each of the transistor 202 and the transistors 210 includes the conductive layer 221 functioning as a gate, the insulating layer 211 functioning as a gate insulating layer, a semiconductor layer including a channel formation region 231i and a pair of low-resistance regions 231n, the conductive layer 222a connected to one of the pair of low-resistance regions 231n, the conductive layer 222b connected to the other of the pair of low-resistance regions 231n, the insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between the conductive layer 223 and the channel formation region 231i.

The conductive layer 222a and the conductive layer 222b are connected to the corresponding low-resistance regions 231n through openings provided in the insulating layer 215. One of the conductive layer 222a and the conductive layer 222b functions as a source, and the other functions as a drain.

FIG. 12A illustrates an example in which the insulating layer 225 covers a top surface and a side surface of the semiconductor layer. The conductive layer 222a and the conductive layer 222b are connected to the corresponding low-resistance regions 231n through openings provided in the insulating layer 225 and the insulating layer 215.

Meanwhile, in a transistor 209 illustrated in FIG. 12B, the insulating layer 225 overlaps with the channel formation region 231i of the semiconductor layer 231 and does not overlap with the low-resistance regions 231n. The structure illustrated in FIG. 12B can be manufactured by processing the insulating layer 225 using the conductive layer 223 as a mask, for example. In FIG. 12B, the insulating layer 215 is provided to cover the insulating layer 225 and the conductive layer 223, and the conductive layer 222a and the conductive layer 222b are connected to the low-resistance regions 231n through the openings in the insulating layer 215. Furthermore, an insulating layer 218 covering the transistor may be provided.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 3

In this embodiment, a structure example of a display device that is different from the above will be described.

The display device in this embodiment can be a high-resolution display device. Accordingly, the display device in this embodiment can be used for display portions of information terminals (wearable devices) such as watch-type and bracelet-type information terminals and display portions of wearable devices capable of being worn on the head, such as a VR device like a head-mounted display and a glasses-type AR device.

[Display Module]

FIG. 13A is a perspective view of a display module 280. The display module 280 includes a display device 400C and an FPC 290. Note that the display device included in the display module 280 is not limited to the display device 400C and may be a display device 400D or a display device 400E described later.

The display module 280 includes a substrate 291 and a substrate 292. The display module 280 includes a display portion 281. The display portion 281 is a region of the display module 280 where an image is displayed and is a region where light emitted from pixels provided in a pixel portion 284 described later can be perceived.

FIG. 13B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. In addition, a terminal portion 285 for connection to the FPC 290 is provided in a portion over the substrate 291 that does not overlap with the pixel portion 284. The terminal portion 285 and the circuit portion 282 are electrically connected to each other through a wiring portion 286 formed of a plurality of wirings.

The pixel portion 284 includes a plurality of pixels 284a arranged periodically. An enlarged view of one pixel 284a is illustrated on the right side of FIG. 13B. The pixel 284a includes the light-emitting elements 430a, 430b, and 430c whose emission colors are different from each other. The plurality of light-emitting elements can be arranged in a stripe arrangement as illustrated in FIG. 13B. With the stripe arrangement that enables high-density arrangement of pixel circuits, a high-resolution display device can be provided. Alternatively, a variety of arrangement methods such as a delta arrangement and a PenTile arrangement can be employed.

The pixel circuit portion 283 includes a plurality of pixel circuits 283a arranged periodically.

One pixel circuit 283a is a circuit that controls light emission of three light-emitting elements included in one pixel 284a. One pixel circuit 283a may be provided with three circuits for controlling light emission of the respective light-emitting elements. For example, the pixel circuit 283a for one light-emitting element can include at least one selection transistor, one current control transistor (driving transistor), and a capacitor. In this case, a gate signal is input to a gate of the selection transistor and a source signal is input to one of a source and a drain thereof. With such a structure, an active-matrix display device is achieved.

The circuit portion 282 includes a circuit for driving the pixel circuits 283a in the pixel circuit portion 283. For example, one or both of a gate line driver circuit and a source line driver circuit are preferably included. In addition, at least one of an arithmetic circuit, a memory circuit, a power supply circuit, and the like may be included.

The FPC 290 functions as a wiring for supplying a video signal, power supply potential, or the like to the circuit portion 282 from the outside. In addition, an IC may be mounted on the FPC 290.

The display module 280 can have a structure in which one or both of the pixel circuit portion 283 and the circuit portion 282 are stacked below the pixel portion 284; thus, the aperture ratio (the effective display area ratio) of the display portion 281 can be significantly high. For example, the aperture ratio of the display portion 281 can be higher than or equal to 40% and lower than 100%, preferably higher than or equal to 50% and lower than or equal to 95%, and further preferably higher than or equal to 60% and lower than or equal to 95%. Furthermore, the pixels 284a can be arranged extremely densely and thus the display portion 281 can have extremely high resolution. For example, the pixels 284a are preferably arranged in the display portion 281 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 280 has extremely high resolution, and thus can be suitably used for a device for VR such as a head-mounted display or a glasses-type device for AR. For example, even in the case of a structure in which the display portion of the display module 280 is perceived through a lens, pixels of the extremely-high-resolution display portion 281 included in the display module 280 are prevented from being perceived when the display portion is enlarged by the lens, so that display providing a high sense of immersion can be performed. Without limitation to the above, the display module 280 can also be suitably used for an electronic device having a relatively small display portion. For example, the display module 280 can be suitably used for a display portion of a wearable electronic device such as a wrist-watch type electronic device.

[Display Device 400C]

The display device 400C illustrated in FIG. 14 includes a substrate 301, the light-emitting elements 430a, 430b, and 430c, a capacitor 240, and a transistor 310.

The substrate 301 corresponds to the substrate 291 in FIG. 13A and FIG. 13B. A stacked-layer structure 401 including the substrate 301 and components up to an insulating layer 255 corresponds to the substrate 101 in Embodiment 1.

The transistor 310 is a transistor including a channel formation region in the substrate 301. As the substrate 301, a semiconductor substrate such as a single crystal silicon substrate can be used, for example. The transistor 310 includes part of the substrate 301, a conductive layer 311, a low-resistance region 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided to cover a side surface of the conductive layer 311 and functions as an insulating layer.

In addition, an element isolation layer 315 is provided between two adjacent transistors 310 to be embedded in the substrate 301.

Furthermore, an insulating layer 261 is provided to cover the transistor 310, and the capacitor 240 is provided over the insulating layer 261.

The capacitor 240 includes a conductive layer 241, a conductive layer 245, and an insulating layer 243 positioned therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of a source and a drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

The insulating layer 255 is provided to cover the capacitor 240, and the light-emitting elements 430a, 430b, 430c, and the like are provided over the insulating layer 255. The protective layer 416 is provided over the light-emitting elements 430a, 430b, and 430c, and a substrate 420 is bonded to a top surface of the protective layer 416 with a resin layer 419. The substrate 420 corresponds to the substrate 292 in FIG. 13A.

The pixel electrode of the light-emitting element is electrically connected to one of the source and the drain of the transistor 310 through a plug 256 embedded in the insulating layer 255, the conductive layer 241 embedded in the insulating layer 254, and the plug 271 embedded in the insulating layer 261.

[Display Device 400D]

The display device 400D illustrated in FIG. 15 differs from the display device 400C mainly in a structure of a transistor. Note that portions similar to those of the display device 400C are not described in some cases.

A transistor 320 is a transistor in which a metal oxide (also referred to as an oxide semiconductor) is used in a semiconductor layer where a channel is formed.

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 illustrated in FIG. 13A and FIG. 13B. The stacked-layer structure 401 including the substrate 331 and components up to the insulating layer 255 corresponds to the substrate 101. As the substrate 331, an insulating substrate or a semiconductor substrate can be used.

An insulating layer 332 is provided over the substrate 331. The insulating layer 332 functions as a barrier layer that prevents diffusion of impurities such as water and hydrogen from the substrate 331 into the transistor 320 and release of oxygen from the semiconductor layer 321 to the insulating layer 332 side. As the insulating layer 332, it is possible to use, for example, a film in which hydrogen or oxygen is less likely to be diffused than in a silicon oxide film, such as an aluminum oxide film, a hafnium oxide film, or a silicon nitride film.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. For at least part of the insulating layer 326 that is in contact with the semiconductor layer 321, an oxide insulating film such as a silicon oxide film is preferably used. In addition, a top surface of the insulating layer 326 is preferably planarized.

The semiconductor layer 321 is provided over the insulating layer 326. The semiconductor layer 321 preferably includes a film of a metal oxide exhibiting semiconductor characteristics (also referred to as an oxide semiconductor). The material that can be suitably used for the semiconductor layer 321 is described in detail later.

The pair of conductive layers 325 is provided over and in contact with the semiconductor layer 321, and functions as a source electrode and a drain electrode.

An insulating layer 328 is provided to cover top surfaces and side surfaces of the pair of conductive layers 325, a side surface of the semiconductor layer 321, and the like, and an insulating layer 264 is provided over the insulating layer 328. The insulating layer 328 functions as a barrier layer that prevents diffusion of impurities such as water and hydrogen from the insulating layer 264 or the like to the semiconductor layer 321 and release of oxygen from the semiconductor layer 321. As the insulating layer 328, an insulating film similar to the insulating layer 332 can be used.

An opening portion reaching the semiconductor layer 321 is provided in the insulating layer 328 and the insulating layer 264. The insulating layer 323 that is in contact with side surfaces of the insulating layer 264, the insulating layer 328, and the conductive layer 325 and a top surface of the semiconductor layer 321, and the conductive layer 324 are embedded in the opening. The conductive layer 324 functions as a second gate electrode and part of the insulating layer 323 functions as a second gate insulating layer.

A top surface of the conductive layer 324, a top surface of the insulating layer 323, and a top surface of the insulating layer 264 are planarized so that they are substantially level with each other, and an insulating layer 329 and an insulating layer 265 are provided to cover these layers.

The insulating layer 264 and the insulating layer 265 function as interlayer insulating layers. The insulating layer 329 functions as a barrier layer that prevents diffusion of impurities such as water and hydrogen from the insulating layer 265 or the like to the transistor 320. As the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274a that covers a side surface of an opening portion formed in the insulating layer 265, the insulating layer 329, the insulating layer 264, and the insulating layer 328 and part of a top surface of the conductive layer 325, and a conductive layer 274b in contact with a top surface of the conductive layer 274a. In this case, a conductive material in which hydrogen and oxygen are unlikely to be diffused is preferably used for the conductive layer 274a.

A structure including the insulating layer 254 and components up to the substrate 420 in the display device 400D is similar to that of the display device 400C.

[Display Device 400E]

As illustrated in FIG. 16, the display device 400E has a structure in which the transistor 310 whose channel is formed in the substrate 301 and the transistor 320 including a metal oxide in the semiconductor layer where the channel is formed are stacked. Note that portions similar to those of the display devices 400C and 400D are not described in some cases.

The insulating layer 261 is provided to cover the transistor 310 and a conductive layer 251 is provided over the insulating layer 261. In addition, an insulating layer 262 is provided to cover the conductive layer 251 and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in a pixel circuit. The transistor 310 can also be used as a transistor included in a pixel circuit or a transistor included in a driver circuit (a gate line driver circuit or a source line driver circuit) for driving the pixel circuit. The transistor 310 and the transistor 320 can also be used as transistors included in a variety of circuits such as an arithmetic circuit and a memory circuit.

With such a structure, not only the pixel circuit but also the driver circuit or the like can be formed directly under the light-emitting element; thus, the display device can be downsized as compared with the case where the driver circuit is provided around a display region.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 4

In this embodiment, a light-emitting element (also referred to as a light-emitting device) that can be used in a display device according to one embodiment of the present invention will be described.

<Structure Examples of Light-Emitting Element>

Figure 17A:
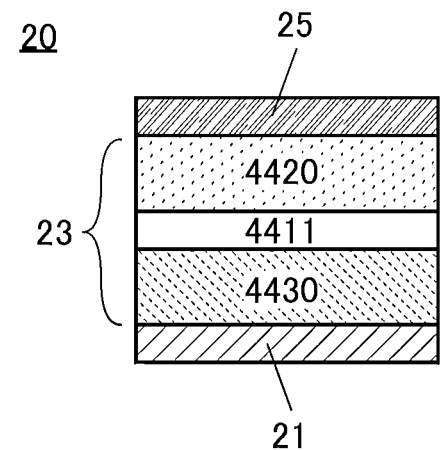

As illustrated in FIG. 17A, the light-emitting element includes an EL layer 23 between a pair of electrodes (an electrode 21 and an electrode 25). The EL layer 23 can be formed of a plurality of layers such as a layer 4420, a light-emitting layer 4411, and a layer 4430. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between the pair of electrodes, can function as a single light-emitting unit, and the structure in FIG. 17A is referred to as a single structure in this specification.

Figure 17B:
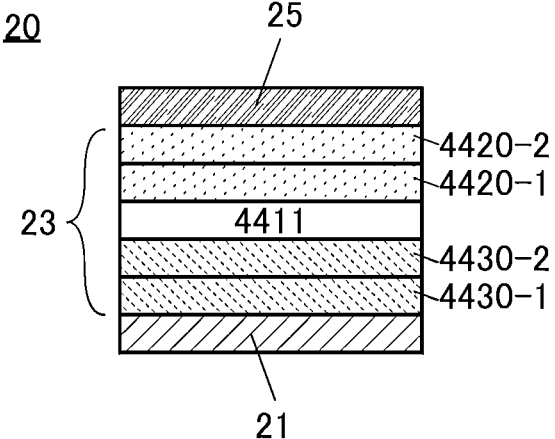

FIG. 17B is a modification example of the EL layer 23 included in a light-emitting element 20 illustrated in FIG.

17A. Specifically, the light-emitting element 20 illustrated in FIG. 17B includes a layer 4430-1 over a lower electrode 21, a layer 4430-2 over a layer 4430-1, the light-emitting layer 4411 over the layer 4430-2, a layer 4420-1 over the light-emitting layer 4411, a layer 4420-2 over the layer 4420-1, and an upper electrode 25 over the layer 4420-2. For example, when the lower electrode 21 functions as an anode and the upper electrode 25 functions as a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the lower electrode 21 functions as a cathode and the upper electrode 25 functions as an anode, the layer 4430-1 functions as an electron-injection layer, the layer 4430-2 functions as an electron-transport layer, the layer 4420-1 functions as a hole-transport layer, and the layer 4420-2 functions as a hole-injection layer. With such a layered structure, carriers can be efficiently injected to the light-emitting layer 4411, and the efficiency of the recombination of carriers in the light-emitting layer 4411 can be enhanced.

Figure 17C:
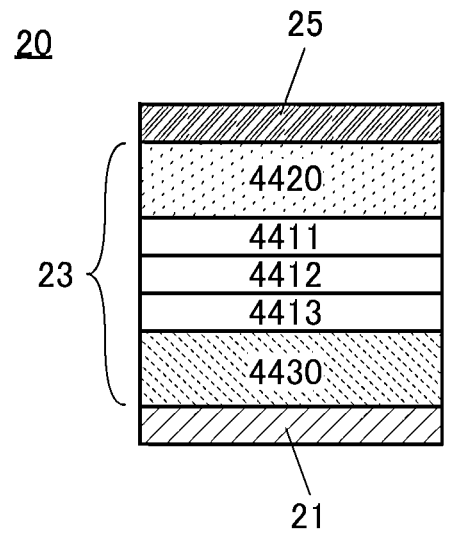

Note that the structure in which a plurality of light-emitting layers (light-emitting layers 4411, 4412, and 4413) are provided between the layer 4420 and the layer 4430 as illustrated in FIG. 17C is a variation of the single structure.

Figure 17D:
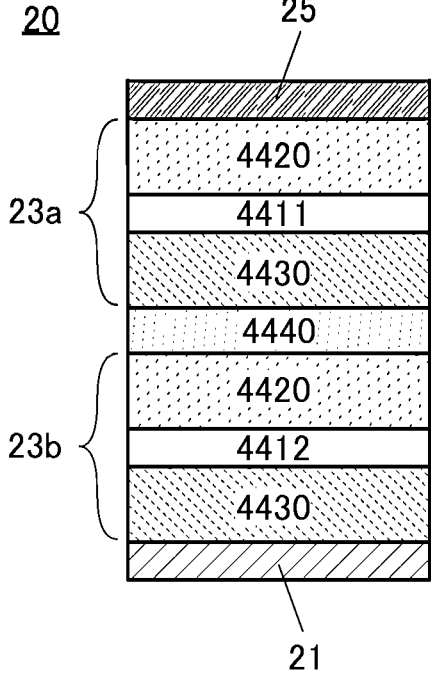

The structure in which a plurality of light-emitting units (EL layers 23*a* and 23*b*) are connected in series with an intermediate layer (charge-generation layer) 4440 therebetween as illustrated in FIG. 17D is referred to as a tandem structure in this specification. In this specification and the like, the structure illustrated in FIG. 17D is referred to as a tandem structure; however, without being limited to this, a tandem structure may be referred to as a stack structure, for example. The tandem structure enables a light-emitting element capable of high luminance light emission.

Also in the structures illustrated in FIG. 17C and FIG. 17D, the layers 4420 and the layers 4430 may each have a stacked-layer structure of two or more layers as illustrated in FIG. 17B.

A structure in which light-emitting elements that emit light of different colors (here, blue (B), green (G), and red (R)) are separately formed is referred to as an SBS (Side By Side) structure in some cases.

In the case where the above-described single structure and tandem structure and the SBS structure are compared with each other, the SBS structure, the tandem structure, and the single structure have lower power consumption in this order. To reduce power consumption, the SBS structure is suitably employed. Meanwhile, the single structure and the tandem structure are suitable in terms of lower manufacturing cost or higher manufacturing yield because the manufacturing processes of the single structure and the tandem structure are simpler than that of the SBS structure.

The emission color of the light-emitting element can be red, green, blue, cyan, magenta, yellow, white, or the like depending on the material that constitutes the EL layer 23. Furthermore, the color purity can be further increased when the light-emitting element has a microcavity structure.

The light-emitting element that emits white light preferably contains two or more kinds of light-emitting substances in the light-emitting layer. To obtain white light emission, two or more kinds of light-emitting substances are selected such that their emission colors are complementary. For example, when the emission color of a first light-emitting layer and the emission color of a second light-emitting layer have a relationship of complementary colors, it is possible to obtain a light-emitting element which emits white light as a whole. The same can be applied to a light-emitting element including three or more light-emitting layers.

The light-emitting layer preferably contains two or more selected from light-emitting substances that emit light of red (R), green (G), blue (B), yellow (Y), orange (0), and the like. Alternatively, the light-emitting layer preferably contains two or more light-emitting substances that emit light containing two or more of spectral components of R, G, and B.

Here, a specific structure example of a light-emitting element is described.

The light-emitting element includes at least the light-emitting layer. The light-emitting element may further include, as a layer other than the light-emitting layer, a layer containing a substance with a high hole-injection property, a substance with a high hole-transport property, a hole-blocking material, a substance with a high electron-transport property, an electron-blocking material, a substance with a high electron-injection property, a substance with a bipolar property (a substance with a high electron-transport property and a high hole-transport property), or the like.

Either a low molecular compound or a high molecular compound can be used for the light-emitting device, and an inorganic compound may also be included. Each layer included in the light-emitting device can be formed by an evaporation method (including a vacuum evaporation method), a transfer method, a printing method, an inkjet method, a coating method, or the like.

For example, the light-emitting device can include one or more of a hole-injection layer, a hole-transport layer, a hole-blocking layer, an electron-blocking layer, an electron-transport layer, and an electron-injection layer.

The hole-injection layer is a layer injecting holes from an anode to the hole-transport layer, and a layer containing a material with a high hole-injection property. As the material with a high hole-injection property, an aromatic amine compound and a composite material containing a hole-transport material and an acceptor material (electron-accepting material), and the like can be given.

The hole-transport layer is a layer transporting holes, which are injected from the anode by the hole-injection layer, to the light-emitting layer. The hole-transport layer is a layer containing a hole-transport material. As the hole-transport material, a substance having a hole mobility greater than or equal to $1 \times 10^{-6}$ cm$^2$/Vs is preferable. Note that other substances can also be used as long as they have a property of transporting more holes than electrons. As the hole-transport material, materials having a high hole-transport property, such as a n-electron rich heteroaromatic compound (e.g., a carbazole derivative, a thiophene derivative, and a furan derivative) and an aromatic amine (a compound having an aromatic amine skeleton), are preferable.

The electron-transport layer is a layer that transports electrons, which are injected from a cathode by the electron-injection layer, to the light-emitting layer. The electron-transport layer is a layer containing an electron-transport material. As the electron-transport material, a substance having an electron mobility greater than or equal to $1 \times 10^{-6}$ cm$^2$/Vs is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a n-electron deficient heteroaromatic compound such as a nitrogen-containing heteroaromatic compound.

The electron-injection layer is a layer injecting electrons from the cathode to the electron-transport layer, and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

For the electron-injection layer, for example, an alkali metal, an alkaline earth metal, or a compound thereof, such as lithium, cesium, lithium fluoride (LiF), cesium fluoride (CsF), calcium fluoride ($CaF_2$), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide ($LiO_x$), or cesium carbonate can be used.

Alternatively, for the electron-injection layer, a material with an electron-transport property may be used. For example, a compound having an unshared electron pair and having an electron deficient heteroaromatic ring can be used as the material with an electron-transport property. Specifically, a compound having at least one of a pyridine ring, a diazine ring (a pyrimidine ring, a pyrazine ring, and a pyridazine ring), and a triazine ring can be used. Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of an organic compound can be estimated by CV (cyclic voltammetry), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1, 10-phenanthroline (abbreviation: NBPhen), diquinoxalino [2,3-a:2′,3′-c]phenazine (abbreviation: HATNA), 2,4,6-tris [3′-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

The light-emitting layer is a layer containing a light-emitting substance. The light-emitting layer can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits near-infrared light can also be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, A1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer preferably includes, for example, a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting device can be achieved at the same time.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 5

In this embodiment, a high-resolution display device will be described.

[Structure Example of Pixel Circuit]

Examples of a pixel suitable for a high-resolution display device and an arrangement method thereof are described below.

FIG. 18A illustrates an example of a circuit diagram of a pixel unit 70. The pixel unit 70 is composed of two pixels (a pixel 70*a* and a pixel 70*b*). In addition, the pixel unit 70 is connected to a wiring 51*a*, a wiring 51*b*, a wiring 52*a*, a wiring 52*b*, a wiring 52*c*, a wiring 52*d*, a wiring 53*a*, a wiring 53*b*, and a wiring 53*c* and the like.

The pixel 70*a* includes a subpixel 71*a*, a subpixel 72*a*, and a subpixel 73*a*. The pixel 70*b* includes a subpixel 71*b*, a subpixel 72*b*, and a subpixel 73*b*. The subpixel 71*a*, the subpixel 72*a*, and the subpixel 73*a* include a pixel circuit 41*a*, a pixel circuit 42*a*, and a pixel circuit 43*a*, respectively. The subpixel 71*b*, the subpixel 72*b*, and the subpixel 73*b* include a pixel circuit 41*b*, a pixel circuit 42*b*, and a pixel circuit 43*b*, respectively.

Each subpixel includes the pixel circuit and a display element 60. For example, the subpixel 71*a* includes the pixel circuit 41a and the display element 60. A light-emitting element such as an organic EL element is used here as the display element 60.

The wiring 51a and the wiring 51b each function as a gate line. The wiring 52a, the wiring 52b, the wiring 52c, and the wiring 52d each function as a signal line (also referred to as a data line). The wiring 53a, the wiring 53b, and the wiring 53c each have a function of supplying a potential to the display element 60.

The pixel circuit 41a is electrically connected to the wiring 51a, the wiring 52a, and the wiring 53a. The pixel circuit 42a is electrically connected to the wiring 51b, the wiring 52d, and the wiring 53a. The pixel circuit 43a is electrically connected to the wiring 51a, the wiring 52b, and the wiring 53b. The pixel circuit 41b is electrically connected to the wiring 51b, the wiring 52a, and the wiring 53b. The pixel circuit 42b is electrically connected to the wiring 51a, the wiring 52c, and the wiring 53c. The pixel circuit 43b is electrically connected to the wiring 51b, the wiring 52b, and the wiring 53c.

With the structure illustrated in FIG. 18A in which two gate lines are connected to one pixel, the number of source lines can be conversely reduced by half as compared with that in a stripe arrangement. As a result, the number of terminals of the ICs used as source driver circuits can be reduced by half and the number of components can be reduced.

One wiring functioning as a signal line is preferably connected to pixel circuits corresponding to the same color. For example, when a signal with an adjusted potential is supplied to the wiring to correct for variation in luminance between pixels, the correction value may greatly vary between colors. Thus, when pixel circuits connected to one signal line are pixel circuits corresponding to the same color, the correction can be performed easily.

In addition, each pixel circuit includes a transistor 61, a transistor 62, and a capacitor 63. In the pixel circuit 41a, for example, a gate of the transistor 61 is electrically connected to the wiring 51a, one of a source and a drain of the transistor 61 is electrically connected to the wiring 52a, and the other of the source and the drain is electrically connected to a gate of the transistor 62 and one electrode of the capacitor 63. One of a source and a drain of the transistor 62 is electrically connected to one electrode of the display element 60, and the other of the source and the drain is electrically connected to the other electrode of the capacitor 63 and the wiring 53a. The other electrode of the display element 60 is electrically connected to a wiring to which a potential V1 is supplied.

Note that, as illustrated in FIG. 18A, the other pixel circuits are similar to the pixel circuit 41a except for at least one of the wiring to which the gate of the transistor 61 is connected, the wiring to which one of the source and the drain of the transistor 61 is connected, and the wiring to which the other electrode of the capacitor 63 is connected.

In FIG. 18A, the transistor 61 functions as a selection transistor. The transistor 62 is in a series connection with the display element 60 and has a function of controlling a current flowing into the display element 60. The capacitor 63 has a function of holding the potential of a node connected to the gate of the transistor 62. Note that the capacitor 63 does not have to be intentionally provided in the case where an off-state leakage current of the transistor 61, a leakage current through the gate of the transistor 62, and the like are extremely small.

The transistor 62 preferably includes a first gate and a second gate electrically connected to each other as illustrated in FIG. 18A. This structure with the two gates can increase the amount of current that the transistor 62 can carry. Such a structure is particularly preferable for a high-resolution display device because the amount of current can be increased without increasing the size, the channel width in particular, of the transistor 62.

Note that the transistor 62 may have one gate. This structure eliminates the need for forming the second gate and thus can simplify the process as compared with the above structure. The transistor 61 may have two gates. This structure enables a reduction in size of each transistor. A first gate and a second gate of each transistor can be electrically connected to each other. Alternatively, one gate may be electrically connected not to the other gate but to another wiring. In this case, threshold voltages of the transistors can be controlled by varying potentials that are supplied to the two gates.

One of a pair of electrodes of the display element 60 that is electrically connected to the transistor 62 corresponds to a pixel electrode. FIG. 18A illustrates a structure where an electrode of the display element 60 that is electrically connected to the transistor 62 is a cathode and the opposite electrode is an anode. This structure is particularly effective when the transistor 62 is an n-channel transistor. That is, when the transistor 62 is on, the potential applied through the wiring 53a is a source potential; accordingly, the amount of current flowing into the transistor 62 can be constant regardless of variation and change in resistance of the display element 60. Alternatively, a p-channel transistor may be used as a transistor of the pixel circuit. In addition, the cathode and the anode of the display element 60 may be reversed.

[Example of Pixel Electrode Layout Method]

FIG. 18B is a schematic top view illustrating an example of a layout method of pixel electrodes and wirings in the display region. The wirings 51a and the wirings 51b are alternately arranged. The wiring 52a, the wiring 52b, and the wiring 52c, which intersect with the wirings 51a and the wirings 51b, are arranged in this order. The pixel electrodes are arranged in matrix in the extending direction of the wirings 51a and wirings 51b.

The pixel unit 70 includes the pixel 70a and the pixel 70b. The pixel 70a includes a pixel electrode 91R1, a pixel electrode 91G1, and a pixel electrode 91B1. The pixel 70b includes a pixel electrode 91R2, a pixel electrode 91G2, and a pixel electrode 91B2. A display region of a subpixel is inside the pixel electrode of the subpixel.

As illustrated in FIG. 18B, when a pitch of the pixel units 70 arranged in the extending direction of the wiring 52a or the like (also referred to as the first direction) is denoted as P, a pitch of the pixel units 70 arranged in the extending direction of the wiring 51a or the like (also referred to as the second direction) is preferably twice the pitch (the pitch 2P). In that case, distortion-free images can be displayed. The pitch P can be longer than or equal to 1 μm and shorter than or equal to 150 μm, preferably longer than or equal to 2 μm and shorter than or equal to 120 μm, further preferably longer than or equal to 3 μm and shorter than or equal to 100 μm, and still further preferably longer than or equal to 4 μm and shorter than or equal to 60 μm. In that case, the display device with extremely high resolution can be obtained.

It is preferable that the pixel electrode 91R1 or the like should not overlap with the wiring 52a or the like serving as a signal line, for example. This can suppress change in luminance of the display element, which is caused by change in potential of the pixel electrode 91R1 and the like due to transmission of electrical noise through capacitance between, for example, the wiring 52a and the pixel electrode 91R1.

The pixel electrode 91R1 or the like may overlap with the wiring 51a or the like serving as a scan line. This can increase the area of the pixel electrode 91R1 and thus increase the aperture ratio. FIG. 18B illustrates an example where part of the pixel electrode 91R1 overlaps with the wiring 51a.

When the pixel electrode 91R1 or the like of a subpixel overlaps with the wiring 51a or the like serving as a scan line, the wiring is preferably connected to a pixel circuit of the subpixel. For example, a period in which a signal for changing the potential of the wiring 51a or the like is input corresponds to a period in which data of the subpixel is rewritten. Thus, if electrical noise is transmitted from the in the structure in which same-color subpixels are arranged in a zigzag pattern in the extending direction of the wiring 52a or the like and are connected to one wiring serving as a signal line, wirings in the subpixels can have uniform length, so that variation in luminance between the subpixels can be suppressed.

With use of such a pixel layout, a display device with extremely high resolution can be manufactured even in a production line in which the minimum feature size is greater than or equal to 0.5 μm and smaller than or equal to 6 μm, typically greater than or equal to 1.5 μm and smaller than or equal to 4 μm, for example.

[Specifications of Display Panel]

The specifications of a display panel can be Specifications A, Specifications B, or Specifications C, as shown in Table 1 below, for example.

TABLE 1

|  | Specifications A | Specifications B | Specifications C |
|---|---|---|---|
| Panel size | Approximately 5.3 inches (One eye: Approximately 3.4 inches) | Approximately 5.4 inches (One eye: Approximately 3.2 inches) | Approximately 5.3 inches (One eye: Approximately 3.4 inches) |
| Number of pixels | 1920 (H) × 3664 (V) | 1440 (H) × 3200 (V) | 1920 (H) × 3664 (V) |
| Pixel size | 10.75 μm (H) × 32.25 μm (V) | 12.75 μm (H) × 38.25 μm (V) | 10.75 μm (H) × 32.25 μm (V) |
| Resolution | 787 ppi | 664 ppi | 787 ppi |
| Pixel circuit | 2Tr + 1C/pixel | 3Tr + 1C/pixel | 2Tr + 1C/pixel |
| Pixel arrangement | RGB stripe | RGB stripe | RGB stripe |
| Aperture ratio | Approximately 24% or Approximately 48% | Approximately 30% or Approximately 54% | Approximately 24% or Approximately 48% |
| Driving frequency | 90 to 120 Hz | 90 to 120 Hz | 90 Hz |
| SD | COG (Both sides) | COG (Both sides) | COG (One side) |
| GD | Incorporated | Incorporated | Incorporated |
| Display element | OLED | OLED | OLED |
| Other |  | External correction |  | wiring 51a or the like to the pixel electrode via capacitance, the luminance of the subpixel does not change.

[Example 1 of Pixel Layout]

A layout example of the pixel unit 70 is described below.

FIG. 19A is a layout example of a subpixel. The example shows, for easy viewing, a state before a pixel electrode is formed. The subpixel illustrated in FIG. 19A includes the transistor 61, the transistor 62, and the capacitor 63. The transistor 62 includes two gates with a semiconductor layer therebetween.

The lowermost conductive film forms a wiring 51, one gate of the transistor 62, and the like. A conductive film which is formed thereafter forms a gate of the transistor 61, the other gate of the transistor 62, and the like. A conductive film which is formed thereafter forms a wiring 52, source and drain electrodes of the transistors, one electrode of the capacitor 63, and the like. A conductive film which is formed thereafter forms a wiring 53 and the like. Part of the wiring 53 functions as the other electrode of the capacitor 63.

FIG. 19B is a layout example of the pixel unit 70 including the subpixel illustrated in FIG. 19A. FIG. 19B illustrates pixel electrodes (a pixel electrode 31a, a pixel electrode 31b, a pixel electrode 32a, a pixel electrode 32b, a pixel electrode 33a, and a pixel electrode 33b) and a display region 22.

In this example, three subpixels electrically connected to the wiring 51a and three subpixels electrically connected to the wiring 51b are each bilaterally symmetrical. Therefore, As the above display panel, the display device having both high resolution and a high aperture ratio described in Embodiment 1 can be used.

[Structure Example of Display Panel]

Wearable electronic devices for VR, AR, and the like can provide 3D images by using parallax. In that case, it is necessary to display an image for the right eye in the right eye's field of view and display an image for the left eye in the left eye's field of view. Although the shape of a display portion in a display device may be a horizontal rectangular shape, pixels provided outside the range of vision of both eyes do not contribute to display, and thus black is always displayed in these pixels.

In view of the above, it is preferred that a display portion of a display panel be divided into two regions for the right eye and for the left eye, and that pixels not be provided in an outer region which does not contribute to display. Hence, power consumption needed for writing to pixels can be reduced. Moreover, loads on source lines, gate lines, and the like are reduced, so that display with a high frame rate is possible. Consequently, smooth moving images can be displayed, which improves realistic sensation.

Figures 20A, 20B, 20C, 20D, 20E, 20F, 20G, 20H, 20I, 20J:
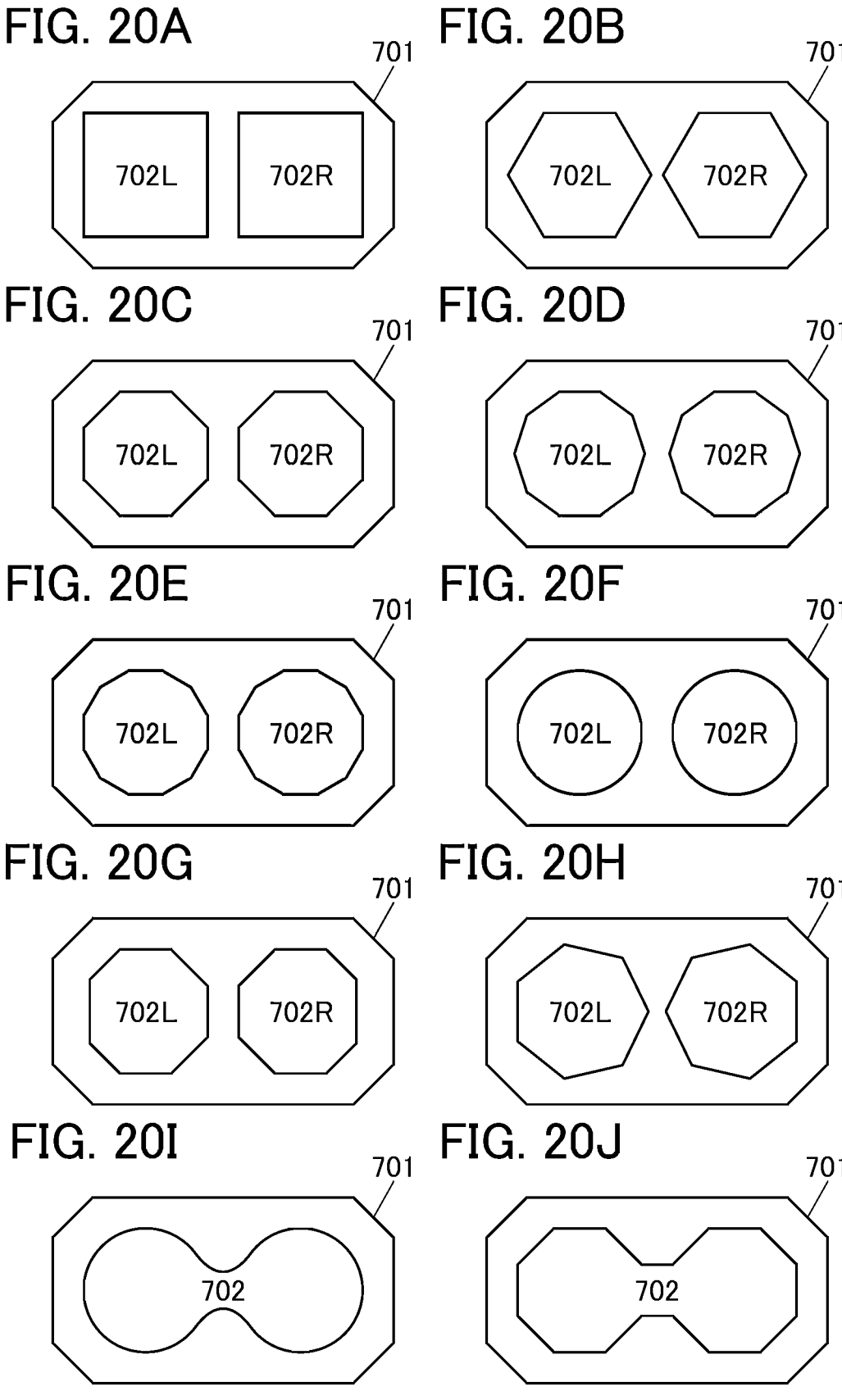

FIG. 20A illustrates a structure example of a display panel. In FIG. 20A, a display portion 702L for the left eye and a display portion 702R for the right eye are provided inside a substrate 701. Note that in addition to the display portion 702L and the display portion 702R, a driver circuit, a wiring, an IC, an FPC, or the like may be provided over the substrate 701.

The display portion 702L and the display portion 702R illustrated in FIG. 20A have a square top surface shape.

The top surface shapes of the display portion 702L and the display portion 702R may be other regular polygons. FIG. 20B illustrates an example in which the top surface shape is a regular hexagon; FIG. 20C illustrates an example in which the top surface shape is a regular octagon; FIG. 20D illustrates an example in which the top surface shape is a regular decagon; and FIG. 20E illustrates an example in which the top surface shape is a regular dodecagon. When a polygon with even-numbered corners is used as above, the shape of the display portion can be bilaterally symmetrical. Note that a polygon that is not a regular polygon may be used. Moreover, a regular polygon or a polygon with rounded corners may be used.

Since the display portion consists of pixels arranged in a matrix, a straight line portion of the outline of the display portion is not strictly a straight line and can be partly a stair-like portion. In particular, a straight line portion that is not parallel to the direction of pixel arrangement has a stair-like top surface shape. Since the user watches images without perceiving the shape of the pixels, a tilted outline, which is stair-like to be exact, of the display portion can be regarded as a straight line. Similarly, a curved portion, which is stair-like to be exact, of the outline of the display portion can be regarded as a curve.

FIG. 20F illustrates an example in which the top surface shapes of the display portion 702L and the display portion 702R are circular.

The top surface shapes of the display portion 702L and the display portion 702R may be bilaterally asymmetrical. Moreover, the top surface shapes may not necessarily be regular polygonal.

FIG. 20G illustrates an example in which the top surface shapes of the display portion 702L and the display portion 702R are bilaterally asymmetric octagonal. FIG. 20H illustrates an example in which the top surface shape is regular heptagonal. Even when the top surface shapes of the display portion 702L and the display portion 702R have a bilaterally asymmetrical shape in this manner, the display portion 702L and the display portion 702R are preferably arranged bilaterally symmetrically. Consequently, an image with no unnaturalness can be provided.

Although the structures where the display portion is divided into two are described above, the display portions may have a continuous shape.

FIG. 20I illustrates an example in which a display portion 702 has a shape in which the two circular display portions in FIG. 20F are connected. FIG. 20(J) illustrates an example in which the display portion 702 has a shape in which the two regular octagonal display portions in FIG. 20C are connected.

The above is the description of the structure examples of the display panel.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 6

In this embodiment, a metal oxide (also referred to as an oxide semiconductor) that can be used in the OS transistor described in the above embodiment is described.

The metal oxide preferably contains at least indium or zinc. In particular, indium and zinc are preferably contained. In addition to them, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structure>

Amorphous (including completely amorphous), CAAC (c-axis-aligned crystalline), nc (nanocrystalline), CAC (cloud-aligned composite), single-crystal, and polycrystalline (polycrystal) structures can be given as examples of a crystal structure of an oxide semiconductor.

A crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

For example, the XRD spectrum of the quartz glass substrate shows a peak with a substantially bilaterally symmetrical shape. On the other hand, the peak of the XRD spectrum of the IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC- OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which layers containing indium (In) and oxygen (hereinafter In layers) and layers containing the element M, zinc (Zn), and oxygen (hereinafter (M,Zn) layers) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using θ/2θ scanning, for example, a peak indicating c-axis alignment is detected at or around 2θ of 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, or the like is included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called a polycrystal structure. It is highly probable that the grain boundary becomes a recombination center and captures carriers and thus decreases the on-state current or field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Moreover, since the crystallinity of an oxide semiconductor might be decreased by entry of impurities, formation of defects, or the like, the CAAC-OS can be regarded as an oxide semiconductor that has a small amount of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. There is no regularity of crystal orientation between different nanocrystals in the nc-OS. Hence, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not observed. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[A-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region is a region including indium oxide, indium zinc oxide, or the like as its main component. The second region is a region including gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where intentional heating is not performed on a substrate, for example. Moreover, in the case of forming the CAC-OS by a sputtering method, any one or more selected from an inert gas (typically, argon), an oxygen gas, and a nitrogen gas are used as a deposition gas. The ratio of the flow rate of an oxygen gas to the total flow rate of the deposition gas at the time of deposition is preferably as low as possible, and for example, the ratio of the flow rate of an oxygen gas to the total flow rate of the deposition gas at the time of deposition is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility ($\mu$) can be achieved.

The second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility ($\mu$) and excellent switching operation can be achieved.

A transistor using the CAC-OS has high reliability. Thus, the CAC-OS is most suitable for a variety of semiconductor devices such as display devices.

An oxide semiconductor can have any of various structures that show different properties. Two or more of the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a case where the oxide semiconductor is used for a transistor will be described.

When the oxide semiconductor is used for a transistor, the transistor can have high field-effect mobility. In addition, the transistor can have high reliability.

An oxide semiconductor having a low carrier concentration is preferably used for the transistor. For example, the carrier concentration of an oxide semiconductor is lower than or equal to $1\times10^{17}$ cm$^3$, preferably lower than or equal to $1\times10^{15}$ cm$^3$, further preferably lower than or equal to $1\times10^{13}$ cm$^3$, still further preferably lower than or equal to $1\times10^{11}$ cm$^3$, yet further preferably lower than $1\times10^{10}$ cm$^3$ and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. A transistor whose channel formation region is formed in an oxide semiconductor having a high density of trap states has unstable electrical characteristics in some cases.

In order to obtain stable electrical characteristics of a transistor, it is effective to reduce the impurity concentration in the oxide semiconductor. In order to reduce the impurity concentration in the oxide semiconductor, the impurity concentration in an adjacent film is also preferably reduced. Examples of impurities include hydrogen, nitrogen, an alkali metal, an alkaline earth metal, iron, nickel, and silicon.

<Impurity>

The influence of impurities in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is obtained by SIMS, is lower than or equal to $1\times10^{18}$ atoms/$cm^3$, preferably lower than or equal to $2\times10^{16}$ atoms/$cm^3$.

When the oxide semiconductor contains nitrogen, the oxide semiconductor easily becomes n-type because of generation of electrons serving as carriers and an increase in carrier concentration. A transistor including, as a semiconductor, an oxide semiconductor containing nitrogen tends to have normally-on characteristics. When nitrogen is contained in the oxide semiconductor, a trap state is sometimes formed. This might make the electrical characteristics of the transistor unstable. Thus, the nitrogen concentration in the oxide semiconductor, which is obtained by SIMS, is lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor including an oxide semiconductor containing hydrogen tends to have normally-on characteristics. For this reason, hydrogen in the oxide semiconductor is preferably reduced as much as possible. Specifically, the hydrogen concentration in the oxide semiconductor, which is obtained by SIMS, is lower than $1\times10$ 20 atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for a channel formation region in a transistor, stable electrical characteristics can be given.

At least part of this embodiment can be implemented in combination with the other embodiments described in this specification as appropriate.

Embodiment 7

In this embodiment, electronic devices of one embodiment of the present invention will be described with reference to FIG. 21 to FIG. 24.

An electronic device in this embodiment includes the display device of one embodiment of the present invention. In the display device of one embodiment of the present invention, increases in resolution, definition, and sizes are easily achieved. Thus, the display device of one embodiment of the present invention can be used for a display portion of a variety of electronic devices.

The display device of one embodiment of the present invention can be manufactured at low cost, which leads to a reduction in the manufacturing cost of an electronic device.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

In particular, the display device of one embodiment of the present invention can have a high resolution, and thus can be suitably used for an electronic device including a relatively small display portion. Examples of such an electronic device include information terminals (wearable devices) such as watch-type and bracelet-type information terminals and wearable devices capable of being worn on the head, such as a VR device like a head-mounted display and a glasses-type AR device. Examples of wearable devices include an SR (Substitutional Reality) device and an MR (Mixed Reality) device.

The definition of the display device of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680×4320). In particular, definition of 4K2K, 8K4K, or higher is preferable. Furthermore, the pixel density (resolution) of the display device of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, yet further preferably higher than or equal to 7000 ppi. With the display device with such high definition or high resolution, the electronic device can have higher realistic sensation, sense of depth, and the like in personal use such as portable use or home use.

The electronic device in this embodiment can be incorporated along a curved surface of an inside wall or an outside wall of a house or a building or the interior or the exterior of a car.

The electronic device in this embodiment may include an antenna. When a signal is received by the antenna, the electronic device can display a video, data, and the like on a display portion. When the electronic device includes the antenna and a secondary battery, the antenna may be used for contactless power transmission.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of kinds of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

An electronic device 6500 illustrated in FIG. 21A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

FIG. 21B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display (a display device that has flexibility) of one embodiment of the present invention can be used as the display panel 6511. Thus, an extremely lightweight electronic device can be provided. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is positioned on the rear side of a pixel portion.

FIG. 22A illustrates an example of a television device. In a television device 7100, a display portion 7000 is incorporated in a housing 7101. Here, a structure in which housing 7101 is supported by a stand 7103 is illustrated.

The display device of one embodiment of the present invention can be used in the display portion 7000.

Operation of the television device 7100 illustrated in FIG. 22A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be controlled and videos displayed on the display portion 7000 can be controlled.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

FIG. 22B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used in the display portion 7000.

FIG. 22C and FIG. 22D illustrate examples of digital signage.

Digital signage 7300 illustrated in FIG. 22C includes a housing 7301, the display portion 7000, a speaker 7303, and the like. Furthermore, the digital signage 7300 can include an LED lamp, an operation key (including a power switch or an operation switch), a connection terminal, a variety of sensors, a microphone, and the like.

FIG. 22D is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIG. 22C and FIG. 22D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 22C and FIG. 22D, it is preferable that the digital signage 7300 or the digital signage 7400 can work with an information terminal 7311 or an information terminal 7411, such as a smartphone a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

FIG. 23A is a diagram illustrating the appearance of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000. Note that the lens 8006 and the housing 8001 may be integrated with each other in the camera 8000.

The camera 8000 can take images by the press of the shutter button 8004 or touch on the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with the mount engaging with a mount of the camera 8000. In the finder 8100, a video or the like received from the camera 8000 can be displayed on the display portion 8102.

The button 8103 has a function of a power button or the like.

The display device of one embodiment of the present invention can be used for the display portion 8002 of the camera 8000 and the display portion 8102 of the finder 8100. Note that a finder may be incorporated in the camera 8000.

FIG. 23B is a diagram illustrating the appearance of a head-mounted display 8200.

The head-mounted display 8200 includes a wearing portion 8201, a lens 8202, a main body 8203, a display portion 8204, a cable 8205, and the like. A battery 8206 is incorporated in the wearing portion 8201.

The cable 8205 supplies electric power from the battery 8206 to the main body 8203. The main body 8203 includes a wireless receiver or the like and can display received video information on the display portion 8204. In addition, the main body 8203 is provided with a camera, and information on the movement of the user's eyeball or eyelid can be used as an input means.

The mounting portion 8201 may be provided with a plurality of electrodes capable of sensing current flowing in response to the movement of the user's eyeball in a position in contact with the user to have a function of recognizing the user's sight line. Furthermore, the mounting portion 8201 may have a function of monitoring the user's pulse with the use of current flowing through the electrodes. Moreover, the mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, or the like.

The display device of one embodiment of the present invention can be used in the display portion 8204.

FIG. 23C to FIG. 23E are diagrams illustrating the appearance of a head-mounted display 8300. The head-mounted display 8300 includes a housing 8301, a display portion 8302, a fixing band 8304, and a pair of lenses 8305.

A user can perceive display on the display portion 8302 through the lenses 8305. Note that the display portion 8302 is preferably curved and placed because the user can feel a high realistic sensation. In addition, when another image displayed on a different region of the display portion 8302 is perceived through the lenses 8305, three-dimensional display using parallax or the like can also be performed. Note that the number of display portions 8302 provided is not limited to one; two display portions 8302 may be provided so that one display portion is provided for one eye of the user.

The display device of one embodiment of the present invention can be used for the display portion 8302. The display device of one embodiment of the present invention can achieve extremely high resolution. For example, a pixel is not easily perceived by the user even when the user perceives display that is magnified by the use of the lenses 8305 as illustrated in FIG. 23E. In other words, a video with a strong sense of reality can be perceived by the user with the use of the display portion 8302.

FIG. 23F is an external view of a goggle-type head-mounted display 8400. The head-mounted display 8400 includes a pair of housings 8401, a mounting portion 8402, and a cushion 8403. A display portion 8404 and a lens 8405 are provided in each of the pair of housings 8401. The pair of display portions 8404 may display different images, whereby three-dimensional display using parallax can be performed.

A user can perceive display on the display portion 8404 through the lenses 8405. The lens 8405 has a focus adjustment mechanism and the focus adjustment mechanism can adjust the position of the lenses 8405 according to the user's eyesight. The display portion 8404 is preferably a square or a horizontal rectangle. Accordingly, realistic sensation can be increased.

The mounting portion 8402 preferably has plasticity and elasticity so as to be adjusted to fit the size of the user's face and not to slide down. In addition, part of the mounting portion 8402 preferably has a vibration mechanism functioning as a bone conduction earphone. Thus, without additionally requiring an audio device such as earphones or a speaker, the user can enjoy video and sound only by wearing. Note that the housing 8401 may have a function of outputting sound data by wireless communication.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable because cleaning or replacement can be easily performed.

Electronic devices illustrated in FIG. 24A to FIG. 24F include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 24A to FIG. 24F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may each include a plurality of display portions. In addition, the electronic devices may each include a camera or the like and have a function of taking a still image or a moving image and storing the taken image in a recording medium (an external recording medium or a recording medium incorporated in the camera), a function of displaying the taken image on the display portion, or the like.

The display device of one embodiment of the present invention can be used in the display portion 9001.

The details of the electronic devices illustrated in FIG. 24A to FIG. 24F are described below.

Figure 24A:
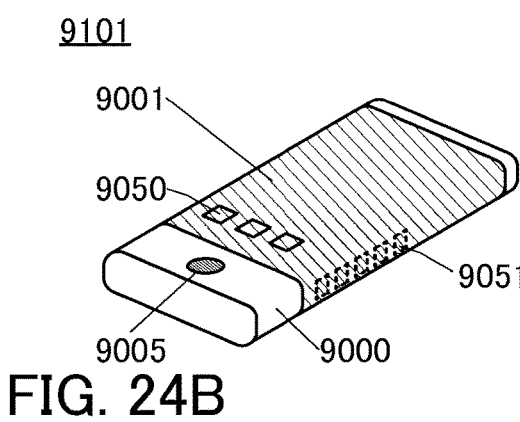

FIG. 24A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display letters and image information on its plurality of surfaces. FIG. 24A illustrates an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 24C:
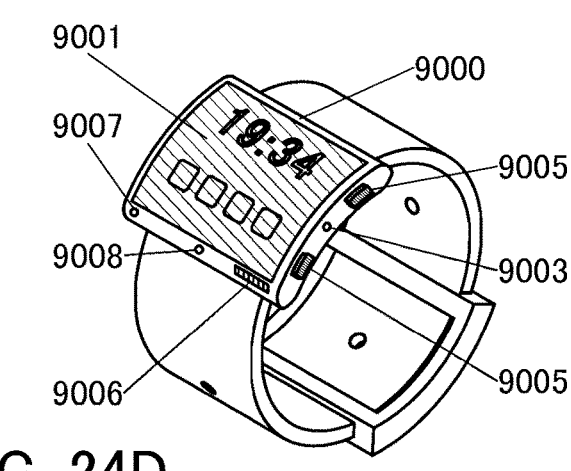
Figure 24B:
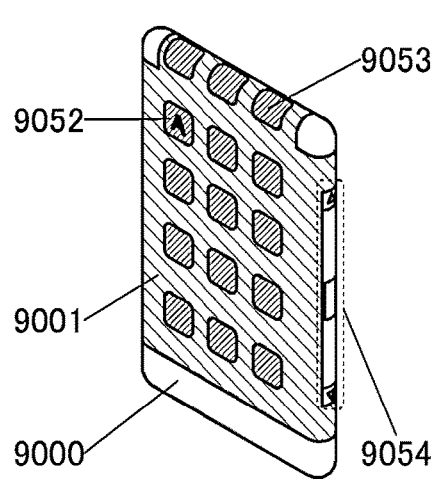

FIG. 24B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is illustrated. For example, the user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer a call, for example.

FIG. 24C is a perspective view illustrating a watch-type portable information terminal 9200. The portable information terminal 9200 can be used as a smartwatch (registered trademark), for example. The display surface of the display portion 9001 is curved, and display can be performed on the curved display surface. Mutual communication between the portable information terminal 9200 and, for example, a headset capable of wireless communication enables hands-free calling. With the connection terminal 9006, the portable information terminal 9200 can perform mutual data transmission with another information terminal and can be charged. Note that the charging operation may be performed by wireless power feeding.

Figure 24D:
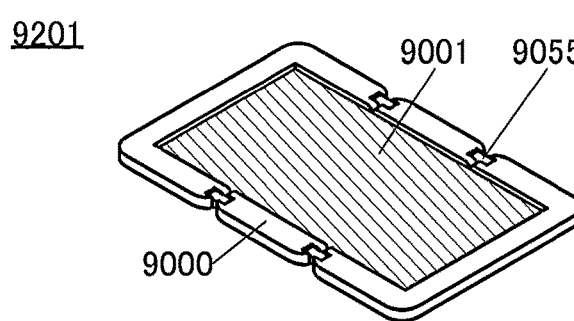
Figure 24E:
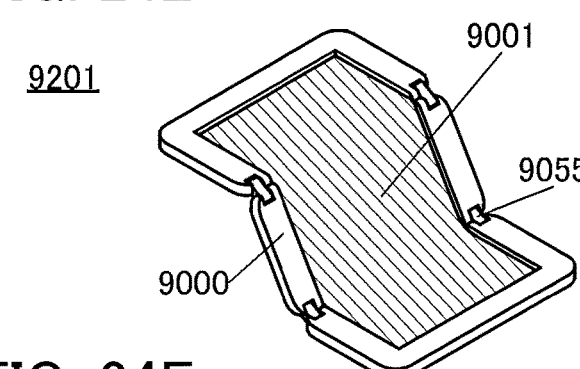
Figure 24F:
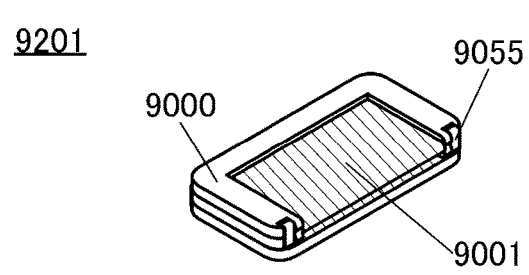

FIG. 24D to FIG. 24F are perspective views illustrating a foldable portable information terminal 9201. FIG. 24D is a perspective view of an opened state of the portable information terminal 9201, FIG. 24F is a perspective view of a folded state thereof, and FIG. 24E is a perspective view of a state in the middle of change from one of FIG. 24D and FIG. 24F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature greater than or equal to 0.1 mm and less than or equal to 150 mm.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Example

This example shows examination results of the influence of a sacrificial layer on a light-emitting element.

In this example, three kinds of samples (Sample A1 to Sample A3) were fabricated.

[Sample A1]

A light-emitting element included in Sample A1 was formed in the following manner. A hole-injection layer, a hole-transport layer, a light-emitting layer, an electron-transport layer, an electron-injection layer, and a common electrode were formed in this order, by a vacuum evaporation method, over a pixel electrode formed over a glass substrate.

[Sample A2]

A light-emitting element included in Sample A2 was formed in the following manner. First, a hole-injection layer, a hole-transport layer, a light-emitting layer, and an electron-transport layer were formed over a pixel electrode formed over a glass substrate. Then, after an aluminum oxide film as a sacrificial layer was formed by an ALD method, the aluminum oxide film was removed by a wet etching method using TMAH, so that the electron-transport layer was exposed. Next, an electron-injection layer and a common electrode were formed in this order over the electron-transport layer.

[Sample A3]

A light-emitting element included in Sample A3 was formed in the following manner. First, a hole-injection layer, a hole-transport layer, a light-emitting layer, and an electron-transport layer were formed over a pixel electrode formed over a glass substrate. Then, after a metal oxide film as a sacrificial layer was formed by a sputtering method using an In—Ga—Zn oxide as a sputtering target, the metal oxide film was removed by a wet etching method using oxalic acid, so that the electron-transport layer was exposed. Next, an electron-injection layer and a common electrode were formed in this order over the electron-transport layer.

Corresponding layers between Sample A1 to Sample A3, other than the sacrificial layers, have the same material, thickness, deposition condition, and the like.

[Measurement Results]

Current-voltage characteristics and current efficiency characteristics of Sample A1 to Sample A3 were evaluated.

FIG. 25A shows current-voltage characteristics. In FIG. 25A, the horizontal axis represents the voltage (V [V]) and the vertical axis represents the current (I [mA]). As shown in FIG. 25A, a difference between Sample A1 and Sample A2 was found to be small. Sample A3 exhibited voltages higher than those of Sample A1.

FIG. 25B shows current efficiency-luminance characteristics. In FIG. 25B, the horizontal axis represents the luminance (L [cd/m$^2$]) and the vertical axis represents the current efficiency (h ([cd/A]). As shown in FIG. 25B, the results show that Sample A1 in which a sacrificial layer was not formed had the highest current efficiency. The results show that Sample A2 in which the sacrificial layer was formed by an ALD method had higher current efficiency than Sample A3 in which the sacrificial layer was formed by a sputtering method.

It was confirmed from the above that in a deposition method of a sacrificial layer directly on an EL layer (an electron-transport layer), a use of an ALD method can inhibit deposition damage to the EL layer compared with a use of a sputtering method.

REFERENCE NUMERALS

100: display device, 101: substrate, 110 111: pixel electrode, 111C: connection electrode, 112: EL layer, 113: common electrode, 114: EL layer, 115: optical adjustment layer, 121: protective layer, 122: space, 130: connection portion, 131: insulating layer, 143: resist mask, 144: sacrificial film, 145: sacrificial layer, 146: protective film, 147: protective layer

The invention claimed is:

1. A method for manufacturing a display device, comprising:
   a first step of forming a first pixel electrode, a second pixel electrode, and a first electrode;
   a second step of depositing a first EL film over the first pixel electrode and the second pixel electrode;
   a third step of forming a first sacrificial film covering the first EL film and the first electrode;
   a fourth step of exposing the second pixel electrode by etching the first sacrificial film and the first EL film and forming a first EL layer over the first pixel electrode and a first sacrificial layer over the first EL layer and the first electrode;
   a fifth step of depositing a second EL film over the first pixel electrode and the second pixel electrode;
   a sixth step of forming a second sacrificial film covering the second EL film and the first electrode;
   a seventh step of forming a second EL layer over the second pixel electrode and a second sacrificial layer over the second EL layer by etching the second sacrificial film and the second EL film;
   an eighth step of exposing the first EL layer, the second EL layer, and the first electrode by removing the first sacrificial layer and the second sacrificial layer;
   a ninth step of forming a common layer over the first EL layer and the second EL layer; and
   a tenth step of forming a common electrode over and in contact with the common layer and the first electrode.

2. The method for manufacturing a display device, according to claim 1,
   wherein the first EL film, the second EL film, and the common layer are formed by an evaporation method using a shielding mask.

3. The method for manufacturing a display device, according to claim 1,
   wherein the first pixel electrode and the second pixel electrode are arranged in a first direction, wherein the first pixel electrode and a third pixel electrode are arranged in a second direction intersecting the first direction, and
   wherein the method further comprises an eleventh step of removing portions of the common electrode, the common layer, and the first EL layer between the first pixel electrode and the third pixel electrode by etching after the tenth step.

4. The method for manufacturing a display device, according to claim 3, further comprising:
   a twelfth step of forming an insulating layer between the first pixel electrode and the third pixel electrode between the first step and the second step,
   wherein in the eleventh step, the common electrode, the common layer, and the first EL layer positioned over the insulating layer are etched and a portion of the insulating layer is etched to form a recessed portion in the insulating layer.

5. The method for manufacturing a display device, according to claim 1,
   wherein the first sacrificial film and the second sacrificial film contain the same metal film, alloy film, metal oxide film, semiconductor film, or inorganic insulating film,
   wherein in the fourth step, the first EL film is etched by dry etching using an etching gas not containing oxygen as its main component, and
   wherein in the eighth step, the first sacrificial layer and the second sacrificial layer are removed by wet etching using a tetramethyl ammonium hydroxide aqueous solution, diluted hydrofluoric acid, oxalic acid, phosphoric acid, acetic acid, nitric acid, or a mixed solution thereof.

6. The method for manufacturing a display device, according to claim 5,
   wherein the first sacrificial film and the second sacrificial film contain aluminum oxide.

7. The method for manufacturing a display device, according to claim 1, further comprising:
   a thirteenth step of forming a hard mask between the third step and the fourth step,
   wherein in the fourth step, after the first sacrificial film is etched using the hard mask, the hard mask and the first EL film are etched by the same treatment.

8. The method for manufacturing a display device, according to claim 1,
   wherein each of the first EL layer and the second EL layer is processed into a band-shaped top surface shape.

9. The method for manufacturing a display device, according to claim 1, further comprising:
   a fourteenth step of forming a protective layer over the common electrode after the tenth step.

10. A display device comprising:
   a first light-emitting element, a second light-emitting element, a third light-emitting element, and a fourth light-emitting element,
   wherein the first light-emitting element comprises a first pixel electrode, a first EL layer, a common layer, and a common electrode,
   wherein the second light-emitting element comprises a second pixel electrode, a second EL layer, the common layer, and the common electrode,
   wherein the third light-emitting element comprises a third pixel electrode, the first EL layer, the common layer, and the common electrode, wherein the fourth light-emitting element comprises a fourth pixel electrode, the second EL layer, the common layer, and the common electrode, wherein an insulating layer is between the first pixel electrode and the third pixel electrode, between the second pixel electrode and the fourth pixel electrode, and between the first pixel electrode and the second pixel electrode, wherein the first light-emitting element and the second light-emitting element are arranged in a first direction, wherein the first light-emitting element and the third light-emitting element are arranged in a second direction intersecting the first direction, wherein the second light-emitting element and the fourth light-emitting element are arranged in the second direction intersecting the first direction, and wherein the common layer and the common electrode have a band shape extending in the first direction.

11. The display device according to claim 10, wherein the first EL layer, the common layer, and the common electrode comprise an end portion overlapping with the insulating layer between the first pixel electrode and the third pixel electrode.

12. The display device according to claim 10, wherein the second light-emitting element emits light of different color from the first light-emitting element.

\* \* \* \* \*